(12) United States Patent
Yamazaki

(10) Patent No.: US 8,314,012 B2
(45) Date of Patent: Nov. 20, 2012

(54) METHOD FOR MANUFACTURING SEMICONDUCTOR SUBSTRATE AND METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/882,301

(22) Filed: Sep. 15, 2010

(65) Prior Publication Data
US 2011/0003461 A1   Jan. 6, 2011

Related U.S. Application Data

(62) Division of application No. 12/246,571, filed on Oct. 7, 2008, now Pat. No. 7,799,658.

(30) Foreign Application Priority Data

Oct. 10, 2007  (JP) ................................ 2007-264900
Oct. 12, 2007  (JP) ................................ 2007-267273
Oct. 23, 2007  (JP) ................................ 2007-275831

(51) Int. Cl.
*H01L 21/30* (2006.01)
*H01L 21/46* (2006.01)

(52) U.S. Cl. ........ 438/458; 438/164; 438/798; 257/623; 257/632

(58) Field of Classification Search .................. 438/164, 438/458, 798; 257/623, 632, E21.331, E21.568
See application file for complete search history.

(56) References Cited

U.S. PATENT DOCUMENTS

| | | | |
|---|---|---|---|
| 5,374,564 A | 12/1994 | Bruel | |
| 6,117,700 A | 9/2000 | Orita et al. | |
| 6,335,231 B1 | 1/2002 | Yamazaki et al. | |
| 6,380,046 B1 | 4/2002 | Yamazaki | |
| 6,534,380 B1 | 3/2003 | Yamauchi et al. | |
| 6,611,005 B2 | 8/2003 | Tsujimura et al. | |
| 6,803,264 B2 | 10/2004 | Yamazaki et al. | |
| 7,052,943 B2 | 5/2006 | Yamazaki et al. | |
| RE39,484 E | 2/2007 | Bruel | |
| 7,199,024 B2 | 4/2007 | Yamazaki | |
| 7,473,592 B2 | 1/2009 | Yamazaki et al. | |
| 7,473,971 B2 | 1/2009 | Yamazaki et al. | |
| 7,476,576 B2 | 1/2009 | Yamazaki et al. | |
| 7,638,408 B2 * | 12/2009 | Yamazaki et al. ............ 438/406 |

(Continued)

FOREIGN PATENT DOCUMENTS

JP       05-211128       8/1993

(Continued)

*Primary Examiner* — Phuc Dang
(74) *Attorney, Agent, or Firm* — Eric J. Robinson; Robinson Intellectual Property Law Office, P.C.

(57) ABSTRACT

An SOI substrate having a single crystal semiconductor layer with high surface planarity is manufactured. A semiconductor substrate is doped with hydrogen, whereby a damaged region which contains large quantity of hydrogen is formed. After a single crystal semiconductor substrate and a supporting substrate are bonded together, the semiconductor substrate is heated, whereby the single crystal semiconductor substrate is separated in the damaged region. While a heated high-purity nitrogen gas is sprayed on a separation plane of the single crystal semiconductor layer separated from the single crystal semiconductor substrate, laser beam irradiation is performed. By irradiation with a laser beam, the single crystal semiconductor layer is melted, whereby planarity of the surface of the single crystal semiconductor layer is improved and re-single-crystallization is performed.

20 Claims, 30 Drawing Sheets

U.S. PATENT DOCUMENTS

| | | |
|---|---|---|
| 7,638,805 B2 | 12/2009 | Yamazaki et al. |
| 7,642,598 B2 | 1/2010 | Yamazaki et al. |
| 7,883,990 B2 * | 2/2011 | Levy et al. .................... 438/459 |
| 2002/0109144 A1 | 8/2002 | Yamazaki |
| 2004/0157409 A1 * | 8/2004 | Ghyselen et al. ............. 438/458 |
| 2007/0173000 A1 | 7/2007 | Yamazaki |
| 2008/0054269 A1 | 3/2008 | Yamazaki et al. |
| 2008/0061301 A1 | 3/2008 | Yamazaki |
| 2008/0067529 A1 | 3/2008 | Yamazaki |
| 2008/0067597 A1 | 3/2008 | Yamazaki |
| 2008/0070335 A1 | 3/2008 | Yamazaki et al. |
| 2008/0083953 A1 | 4/2008 | Yamazaki |
| 2008/0099065 A1 * | 5/2008 | Ito et al. ........................ 136/261 |
| 2009/0039349 A1 * | 2/2009 | Honda ............................ 257/59 |

FOREIGN PATENT DOCUMENTS

| | | |
|---|---|---|
| JP | 11-097379 | 4/1999 |
| JP | 11-163363 | 6/1999 |
| JP | 2000-012864 | 1/2000 |
| JP | 2000-150905 | 5/2000 |
| JP | 2005-252244 | 9/2005 |
| JP | 2006-264804 | 10/2006 |

* cited by examiner

15 μ

15 μ

Gray Scale Map Type: <none>

Color Coded Map Type: Inverse Pole Figure [001]
Silicon

Boundaries: <none>

15 μ

METHOD FOR MANUFACTURING SEMICONDUCTOR SUBSTRATE AND METHOD FOR MANUFACTURING SEMICONDUCTOR DEVICE

REFERENCE TO RELATED APPLICATION

This application is a DIV of Ser. No. 12/246,571 filed Oct. 7, 2008 U.S. Pat. No. 7,799,658

BACKGROUND OF THE INVENTION

1. Field of the Invention

The present invention relates to a method for manufacturing a semiconductor substrate having a semiconductor layer formed over an insulating layer and a method for manufacturing a semiconductor device.

2. Description of the Related Art

In recent years, integrated circuits using a silicon-on-insulator (SOI) substrate instead of a bulk silicon wafer have been developed. A feature of a thin single crystal silicon layer formed over an insulating layer can be taken advantage of to form a completely electrically separated semiconductor layer of a transistor in an integrated circuit and to form a completely depleted transistor. Accordingly, a semiconductor integrated circuit having high added values such as high integration, high-speed driving, and low power consumption can be realized.

Known examples of SOI substrates are SIMOX substrates and bonded substrates. For example, an SOI structure of a SIMOX substrate is obtained by implantation of oxygen ions into a single crystal silicon substrate and by heat treatment performed at 1300° C. or higher to form a buried oxide (BOX) layer, whereby a single crystal silicon thin film is formed on the surface.

An SOI structure of bonded substrates is obtained by bonding of two single crystal silicon substrates (a base substrate and a bond substrate) to each other with an oxide film interposed therebetween and by thinning of one of the two single crystal silicon substrates (the bond substrate) on a back side (a side which is opposite to a bonding surface), whereby a single crystal silicon thin film is formed. Because it is difficult to form a uniform and thin single crystal silicon thin film through grinding or polishing, a technique employing hydrogen ion implantation, which is called Smart-Cut (registered trademark) has been proposed (see, e.g., Reference 1: Japanese Published Patent Application No. H 5-211128).

DISCLOSURE OF INVENTION

A summary of a method for manufacturing this SOI substrate is described. By implantation of hydrogen ions into a silicon wafer, an ion implanted layer is formed at a predetermined depth from the surface. Next, a silicon oxide film is formed by oxidation of another silicon wafer which serves as a base substrate. After that, the silicon wafer into which hydrogen ions are implanted and the silicon oxide film on the other silicon wafer are bonded together to bond the two silicon wafers. Then, through heat treatment, cleavage is caused in the silicon wafer using the ion implanted layer as a cleavage plane, thereby forming a substrate in which a thin single crystal silicon layer is attached to the base substrate.

In addition, a method for forming an SOI substrate in which a single crystal silicon layer is bonded to a glass substrate is known (see, e.g., Reference 2: Japanese Published Patent Application No. H11-097379). In Reference 2, a separation plane is mechanically polished to remove a defective layer which is formed through hydrogen ion implantation or a step of several to several tens of nanometers on the separation plane.

Furthermore, a method for manufacturing a semiconductor device using Smart-Cut (registered trademark), in which a substrate having high heat resistance is used as a supporting substrate is disclosed in References 3 and 4, and a method for manufacturing a semiconductor device using Smart-Cut (registered trademark), in which a light transmitting substrate is used as a supporting substrate is disclosed in Reference 5 (Reference 3: Japanese Published Patent Application No. H 11-163363, Reference 4: Japanese Published Patent Application No. 2000-012864, and Reference 5: Japanese Published Patent Application No. 2000-150905).

SUMMARY OF THE INVENTION

Because a glass substrate has a larger area and is less expensive than a silicon wafer, a glass substrate is used as a supporting substrate, whereby an inexpensive large-area SOI substrate can be manufactured. However, a glass substrate has a strain point of 700° C. or lower and thus has low heat resistance. Therefore, a glass substrate cannot be heated at a temperature which exceeds its upper temperature limit, and the process temperature is limited to be 700° C. or lower. That is, there are also limitations on process temperature for a step of removing a crystal defect at a separation plane and a step of planarizing a surface.

Removal of a crystal defect in a semiconductor layer that has been attached to a silicon wafer has been conventionally achieved by heating at a temperature of 1000° C. or higher; however, such a high temperature process cannot be utilized for removal of a crystal defect in a semiconductor layer that is attached to a glass substrate having a strain point of 700° C. or lower. That is, a re-single-crystallization method has not been established, by which a single crystal semiconductor layer that is attached to a glass substrate having a strain point of 700° C. or lower is recovered to a single crystal semiconductor layer having the same or substantially the same crystallinity as a single crystal semiconductor substrate before processing.

A glass substrate is more easily bent than a silicon wafer and has an undulated surface. In particular, it is difficult to perform treatment by mechanical polishing on a large-area glass substrate having a side that is longer than 30 cm. Accordingly, from the viewpoint of processing accuracy, yield, and the like, treatment by mechanical polishing on a separation plane is not recommended to be used for planarization treatment of a semiconductor layer that is attached to a supporting substrate. Meanwhile, it is required to suppress unevenness on the surface of the separation plane to manufacture high-performance semiconductor elements. This is because when a transistor is manufactured using an SOI substrate, a gate electrode is formed over a semiconductor layer with a gate insulating layer interposed therebetween. Thus, if there is a large unevenness of the semiconductor layer, it is difficult to manufacture a gate insulating layer with high withstand voltage. Therefore, a thick gate insulating layer is needed for higher withstand voltage. Accordingly, large unevenness on the surface of the semiconductor layer leads to an increase of interface state density with the gate insulating layer or the like, which causes a decrease in performance of the semiconductor elements such as a decrease in field effect mobility, an increase in threshold voltage, and the like.

In this manner, when a substrate, such as a glass substrate, which has low heat resistance and is easily bent is used as a supporting substrate, a problem arises in that it is difficult to reduce surface unevenness of a semiconductor layer that is separated from a silicon wafer and fixed to the supporting substrate.

In view of such problems, an object of the present invention is to provide a method for manufacturing a semiconductor substrate, by which a high-performance semiconductor element can be formed even when a substrate having low heat resistance is used as a supporting substrate.

One feature of a method for manufacturing a semiconductor device according to the present invention includes the following steps: preparing a single crystal semiconductor substrate and a supporting substrate; adding an accelerated ion to the single crystal semiconductor substrate by an ion doping method to form a damaged region added with the ion in a deep portion from a surface of the single crystal semiconductor substrate with respect to a shallow portion from the surface of the single crystal semiconductor substrate through which the ion has been passed; arranging the supporting substrate and the single crystal semiconductor substrate in close contact with each other with a buffer layer interposed therebetween to bond the supporting substrate and the single crystal semiconductor substrate together; causing a crack in the damaged region by heating of the single crystal semiconductor substrate, separating a part of the single crystal semiconductor substrate from the single crystal semiconductor substrate, and forming a supporting substrate to which a single crystal semiconductor layer separated from the single crystal semiconductor substrate is fixed; and spraying (blowing) a heated nitrogen gas, and irradiating, with a laser beam, a part of the single crystal semiconductor layer fixed to the supporting substrate with the buffer layer interposed therebetween to melt the single crystal semiconductor layer and perform re-single-crystallization. A defect in a melted single crystal portion is repaired as well as the re-single-crystallization. A semiconductor layer is irradiated with a laser beam by spraying the heated nitrogen gas on the region irradiated with a laser beam on the upper surface of the single crystal semiconductor layer.

By laser beam irradiation, a region of a single crystal semiconductor layer irradiated with a laser beam is partially melted in a depth direction from a surface, or the region of the single crystal semiconductor layer irradiated with a laser beam is entirely melted in a depth direction.

Here, the single crystal means a crystal in which, when a certain crystal axis is focused, the direction of the crystal axis is oriented in the same direction in any portion of a sample and which has no crystal grain boundary between crystals. Note that, in this specification, the single crystal includes a crystal in which crystal axis directions are uniform as described above and which has no grain boundary even when including a crystal defect or a dangling bond. In addition, re-single-crystallization of a single crystal semiconductor layer means that a semiconductor layer having a single crystal structure returns to a single crystal structure after being in a different state from the single crystal structure (e.g., a liquid-phase state). In addition, it can be said that re-single-crystallization of a single crystal semiconductor layer means that a single crystal semiconductor layer is recrystallized to form a single crystal semiconductor layer.

It is preferable to use a substrate having a strain point of 650° C. or higher and 690° C. or lower as the supporting substrate. A glass substrate can be used as the supporting substrate. For example, a non-alkali glass substrate can be used.

It is preferable that the thickness of the single crystal semiconductor layer separated from the single crystal semiconductor substrate be 20 nm or more and 200 nm or less.

The buffer layer can be formed of a film including one layer or two or more layers. It is preferable that the buffer layer include a barrier layer which can prevent sodium from diffusing from the supporting substrate side. The supporting substrate as well as the single crystal semiconductor layer is heated when irradiated with a laser beam, and the supporting substrate is also heated by heat conduction from the single crystal semiconductor layer which is melted. In the case where impurities (typically, sodium) such as an alkali metal or an alkaline-earth metal are contained in the supporting substrate, such impurities might be diffused from the supporting substrate into the single crystal semiconductor layer because of an increase in temperature of the supporting substrate. The barrier layer is provided, whereby impurities can be prevented from being diffused into the single crystal semiconductor layer.

It is preferable that the buffer layer be arranged in close contact with the single crystal semiconductor layer and include an insulating film that contains a halogen such as chlorine or fluorine.

In a method for manufacturing a semiconductor device of the present invention, it is preferable that a semiconductor layer be irradiated with a laser beam in a nitrogen gas atmosphere. It is also preferable that the semiconductor layer be irradiated with a laser beam while a nitrogen gas is sprayed on a region irradiated with the laser beam. It is preferable that oxygen concentration contained in the nitrogen gas atmosphere be 30 ppm or less, more preferably, 30 ppb or less. Further, it is preferable that moisture ($H_2O$) concentration contained in the nitrogen gas atmosphere be 30 ppm or less. It is desirable that oxygen concentration contained in the nitrogen gas atmosphere be 30 ppb or less and moisture concentration be 30 ppb or less.

It is preferable that high-purity nitrogen gas also be used as a nitrogen gas to be sprayed and oxygen concentration contained in the nitrogen gas be 30 ppm or less, more preferably, 30 ppb or less. In addition, it is preferable that moisture ($H_2O$) concentration of the nitrogen gas also be 30 ppm or less. It is desirable to use an ultrapure gas in which oxygen concentration contained in the nitrogen gas is 30 ppb or less and moisture concentration is 30 ppb or less. At the time of laser irradiation, an oxygen element which is contained in a nitrogen atmosphere and a nitrogen gas to be sprayed is reduced to a minimum, whereby an oxide film is prevented from being formed on a surface of the single crystal semiconductor layer by laser irradiation.

In order to raise temperature of the single crystal semiconductor layer in a short period of time, it is preferable that a stage be provided with a heating means and a heated nitrogen gas be sprayed at the same time as heating a stage. In addition, in order to raise temperature of the single crystal semiconductor layer in a short period of time, it is preferable that the semiconductor layer be irradiated with a laser beam while a heated nitrogen gas is sprayed from both of the front side and the back side of the substrate.

A part of the single crystal semiconductor layer is irradiated with a laser beam while a heated nitrogen gas is sprayed, whereby the length of time the single crystal semiconductor layer is being melted can be increased. When the single crystal semiconductor layer is irradiated with a laser beam at room temperature, the length of time the single crystal semiconductor layer is being melted is approximately 100 nanoseconds or less, as shown in FIG. 21B; however, the length of time the single crystal semiconductor layer is being melted can be increased by spraying a heated nitrogen gas. It is preferable that the length of time the single crystal semiconductor layer is being melted be 200 nanoseconds or more and 1000 nanoseconds or less. When the length of melting time exceeds 1000 nanoseconds, damage such that a glass substrate which is the supporting substrate melts by heat conduction might be caused to the substrate.

Laser beam irradiation is performed while a heated nitrogen gas is sprayed on at least one portion of a single crystal semiconductor layer, whereby at least one of many effects described hereinafter can be obtained.

The melting time is increased, whereby planarity of a surface to be irradiated is significantly improved by the action of surface tension. In addition, dangling bonds in the single crystal semiconductor layer or microdefects such as defects at the interface between the single crystal semiconductor layer and a base film can be removed, whereby a better single crystal semiconductor layer can be obtained. In this specification, a region of the single crystal semiconductor layer which is irradiated with a laser beam while a heated nitrogen gas is sprayed thereon is melted and re-single-crystallization is performed. As a result, a single crystal semiconductor layer having excellent properties can be obtained.

By increase in melting time, a single crystal semiconductor layer can be irradiated with a laser beam before the single crystal semiconductor layer is solidified after it is melted by being irradiated with the previous laser beam. Therefore, the number of shots can be reduced. Even when the number of shots is reduced, sufficient planarization can be achieved. In addition, a reduction in the number of shots contributes to an improvement in productivity. In scanning with a laser beam, the percentage of overlap of one shot with the subsequent shot is also referred to as overlap percentage. By increase in melting time, the overlap percentage can be reduced to approximately one-tenth, and can also be reduced to 0%.

A heated nitrogen gas is sprayed, whereby a single crystal semiconductor layer in the region where the heated nitrogen gas is sprayed is heated at 400° C. or higher and a strain point or lower of the supporting substrate, preferably, at a temperature of 450° C. or higher and 650° C. or lower.

Depending on an opening where a nitrogen gas is ejected, for example, a direction of a nozzle opening, when a heated nitrogen gas is sprayed, not only a region irradiated with a laser beam but also the single crystal semiconductor layer on the periphery of the region can be heated. As a nozzle which is one of blow units, a nozzle, called an air knife, which blows a nitrogen gas against a substrate from a slit of a nozzle tip can be used.

Before scanning with a laser beam, a heated nitrogen gas is sprayed on a region to be irradiated with the laser beam, whereby the region to be irradiated with the laser beam can be heated in advance. Accordingly, the energy of a laser beam required to melt the single crystal semiconductor layer can be reduced.

If the required energy of a laser beam can be reduced, the life of a laser can be extended as well as decreasing power consumption. By extension of the life of the laser, the interval of time between component replacements can be lengthened; therefore, productivity can be improved.

After scanning with a laser beam, a heated nitrogen gas is sprayed on the region that has been irradiated, whereby the melting time can be extended and the cooling rate of the melted single crystal semiconductor layer can be reduced compared with natural cooling.

If the cooling rate of the melted single crystal semiconductor layer can be reduced compared with natural cooling, re-single-crystallization is smoothly performed by extension of melting time, and a single crystal semiconductor layer without a grain boundary can be obtained.

In a method for manufacturing a semiconductor device of the present invention, a cross-sectional shape of a laser beam with which the single crystal semiconductor layer is irradiated can be linear, square, or rectangular. By scanning with a laser beam having a linearly irradiated area, a position where melting and re-single-crystallization are caused can be moved, and the melting time is increased. Accordingly, the refinement of a single crystal is partly performed and a single crystal semiconductor layer which contains a smaller amount of impurities can be obtained.

The area irradiated with a laser beam having a linearly irradiated area can be adjusted by an optical system, as appropriate. For example, if one side of a rectangular shape is lengthened, a plurality of single crystal semiconductor layers is fixed so as to lie next to each other over a glass substrate having a large area by using a plurality of semiconductor substrates, and the plurality of single crystal semiconductor layers can be irradiated with a laser beam. In addition, by spraying a heated nitrogen gas, energy of the laser beam which is needed for melting of the single crystal semiconductor layer can be reduced; therefore, an area irradiated with one shot can be expanded by adjusting the optical system or the like. If the area irradiated with one shot can be expanded, the length of time needed for a laser process per one piece can be shortened.

In the above References 1 to 5, the main process for planarization is mechanical polishing; therefore, an object of the present invention to use a glass substrate having a strain point of 700° C. or lower, a structure for extension of melting time, and an effect are not assumed at all. Thus, the above References 1 to 5 differ widely from the present invention. The present invention relates to a novel innovative technique for a method for obtaining a better single crystal by irradiating a single crystal semiconductor layer with a laser beam and melting a part or whole of the single crystal semiconductor layer to perform re-single-crystallization. Although a technique to irradiate an amorphous silicon film with a laser beam and a technique to irradiate a polysilicon film with a laser beam are known, these techniques are completely different from re-single-crystallization of the present invention. In addition, such a re-single-crystallization method with a laser beam is not anticipated by conventional techniques and is a completely novel concept.

When an insulating film that is in contact with the single crystal semiconductor layer contains a halogen, the halogen can be diffused from the insulating film and segregated at the interface between the single crystal semiconductor layer and the insulating film because the insulating film is also heated by irradiation with a laser beam. By segregation of the halogen at the interface between the single crystal semiconductor layer and the insulating film, the halogen can capture ions such as sodium or the like which are present at the interface. Therefore, in the case where a glass substrate is used as the supporting substrate, formation of an insulating film that contains a halogen and irradiation process with a laser beam while heating are very effective for preventing contamination by an impurity such as sodium or the like.

In the case where a large-sized substrate is used, a substrate is transferred by being floated by use of a means which is provided below the substrate to spray a nitrogen gas in some cases. A current of air by a heated nitrogen gas spraying on a region irradiated with a laser beam can assist transfer of the substrate. In addition, since cooling might occur by a current of air for transfer, it is preferable that a nitrogen gas sprayed from the lower part be heated in scanning with a laser beam.

Note that, here, experimental data is described. As described before, in the case where irradiation with a laser beam is performed at room temperature in FIG. 21B, it is shown that the melting time is approximately 100 nanoseconds or less.

A sample which is used for the experiment is described. FIG. 24 is a cross-sectional view of a semiconductor substrate 11 used for the experiment. The semiconductor substrate 11 is a sample which is manufactured through the steps of FIGS. 4A to 4E to be described later. A single crystal silicon layer 2201 is fixed to a glass substrate 2200 with a buffer layer that includes films 2202 to 2204 interposed therebetween.

To manufacture the semiconductor substrate 11, a single crystal silicon wafer is used as a single crystal semiconductor substrate. The single crystal silicon wafer is a p-type wafer and its main surface is oriented along the (100) plane. As the glass substrate 2200 which is a supporting substrate 100, a non-alkali glass substrate (product name: AN100) having a thickness of 0.7 mm is used.

As a first insulating layer, an insulating film having a two-layer structure including the silicon oxynitride film 2202 with a thickness of 50 nm or 100 nm and the silicon nitride oxide film 2203 with a thickness of 50 nm is formed by a PECVD method. A process gas for formation of the silicon oxynitride film 2202 is $SiH_4$ and $N_2O$, and the flow ratio is $SiH_4\backslash N_2O=4\backslash 800$. The substrate temperature in the film formation step is 400° C. A process gas for formation of the silicon nitride oxide film is $SiH_4$, $NH_3$, $N_2O$, and $H_2$, and the flow ratio is $SiH_4\backslash NH_3\backslash N_2O\backslash H_2=10\backslash 100\backslash 20\backslash 400$. The substrate temperature in the film formation step is 350° C.

The silicon oxide film 2204 is formed as a second insulating layer by a PECVD method. A process gas for formation of the silicon oxide film 2204 is TEOS and $O_2$, and the flow ratio is $TEOS\backslash O_2=15\backslash 750$. The substrate temperature in the film formation step is 300° C.

In order to form a damaged region in the single crystal silicon wafer, the single crystal silicon wafer is doped with hydrogen ions by using an ion doping apparatus. A 100% hydrogen gas is used as a source gas, and a single crystal silicon wafer substrate is irradiated with ions in plasma that is generated by excitation of the hydrogen gas and accelerated by an electric field without mass separation. Accordingly, the damaged region is formed. This doping is performed under the following conditions: the power supply output is 100 W; the acceleration voltage, 40 kV; and the dose, $2.2\times 10^{16}$ ions/$cm^2$.

In the ion doping apparatus, when the hydrogen gas is excited, three kinds of ion species, $H^+$, $H_2^+$, and $H_3^+$, are generated, and all of the ion species are accelerated, with which the single crystal silicon wafer is irradiated. Approximately 80% of the ion species that are generated from the hydrogen gas is $H_3^+$.

After the glass substrate 2200 and the single crystal silicon wafer provided with a stacked layer of the films 2202 to 2204 are subjected to ultrasonic cleaning in pure water and is then cleaned with ozone-containing pure water, a bonding step is performed, thereby causing separation in the damaged region. Accordingly, heating is performed to 600° C. in a diffusion furnace, and the single crystal silicon layer 2201 is separated from the single crystal silicon wafer.

The thickness of the buffer layer of the semiconductor substrate 11 is as follows: the thickness of the silicon oxynitride film 2202 is 50 nm; the thickness of the silicon nitride oxide film 2203 is 50 nm; and the thickness of the silicon oxide film 2204 is 50 nm. The thickness of the glass substrate 2200 is 0.7 mm.

First, a structure of a laser irradiation apparatus used for measurement is described with reference to FIG. 22. FIG. 22 is a drawing for description of the structure of the laser irradiation apparatus used for the measurement. The laser irradiation apparatus includes a laser oscillator (hereinafter, simply referred to as a laser) 1321 that emits a laser beam 1320 so as to perform laser irradiation process on an object 1302, a laser 1351 that oscillates a probe beam 1350, and a chamber 1324 provided with a stage 1323 that arranges the object 1302.

The stage 1323 is provided so that the stage 1323 can move inside the chamber 324. An arrow 1325 is an arrow that shows a direction of movement of the stage 1323. Windows 1326 to 1328 formed of quartz are provided on the wall of the chamber 1324. The window 1326 is a window through which the laser beam 1320 enters the chamber 1324. The window 1327 is a window through which the probe beam 1350 enters the chamber 1324, and the window 1328 is a window through which the probe beam 1350 reflected by the object 1302 goes to the outside of the chamber 1324. In FIG. 22, the probe beam 1350 that is reflected by the object 1302 is denoted by a reference numeral 1350'.

In order to control an atmosphere inside the chamber 1324, the chamber 1324 is provided with a gas supply port 1329 connected to a gas supply device and an exhaust port 1330 coupled with an exhaust system.

The laser beam 1320 which is emitted from the laser 1321 is reflected by a half mirror 1332, is converged by a lens 1333, passes through the window 1326, and is delivered to the object 1302 over the stage 1323. A photodetector 1334 is arranged on a transmission side of the half mirror 1332. Intensity variation of the laser beam 1320 emitted from the laser 1321 is detected by the photodetector 1334.

The probe beam 1350 emitted from the laser 1351 is reflected by a mirror 1352, passes through the window 1327, and is delivered to the object 1302. A region irradiated with the laser beam 1320 is irradiated with the probe beam 1350. The probe beam 1350' reflected by the object 1302 passes through the window 1328 and an optical fiber 1353, is made to be a parallel beam by a collimator 1354 having a collimator lens, and enters a photodetector 1355. Intensity variation of the probe beam 1350' is detected by the photodetector 1355.

The outputs of photodetectors 1334 and 1355 are connected to an oscilloscope 1356. The voltage value (intensity of signal) of an output signal of the photodetector 1334 input to the oscilloscope 1356 corresponds to the intensity of the laser beam 1320, and the voltage value (intensity of signal) of an output signal of the photodetector 1355 input to the oscilloscope 1356 corresponds to the intensity of the probe beam 1350'. FIGS. 21A and 21B are photographs of signal waveforms of the oscilloscope 1356, which show measurement results. In the photographs of FIGS. 21A and 21B, the lower signal waveform is an output signal waveform of the photodetector 1334 and shows the intensity variation $I_{1320}$ of the laser beam 1320. The upper signal waveform is an output signal waveform of the photodetector 1355 and shows the intensity variation $I_{1350}$ of the probe beam 1350' reflected by the single crystal silicon layer. A horizontal axis of each of FIGS. 21A and 21B denotes time, and the scale is marked in 100 nanoseconds. Note that FIG. 21A shows a signal waveform in the case where the stage is heated at 500° C. and the glass substrate is heated at approximately 420° C. FIG. 21B shows a signal waveform at room temperature when the glass substrate is not heated.

For the laser 1321 used for the measurement, a XeCl excimer laser that emits a beam having a wavelength of 308 nm is used. The pulse width is 25 nanoseconds, and the repetition rate is 30 Hz. Meanwhile, for the laser 1351 for the probe beam, an Nd:$YVO_4$ laser is used, and a 532-nm beam that is a second harmonic of the laser is used as the probe beam 1350.

In addition, a nitrogen gas is supplied from the gas supply port 1329, and an atmosphere of the chamber 1324 is a nitrogen atmosphere. In addition, heating of the glass substrate to which the single crystal silicon layer is fixed is performed by a heating device which is provided for the stage 1323. The energy density of the laser beam 1320 when measurement in FIGS. 21A and 21B is performed is 539 mJ/cm$^2$, and the single crystal silicon layer is irradiated with one shot of the laser beam 1320. Note that, in FIGS. 21A and 21B, although there are two peaks in the output signal of the photodetector 1334 corresponding to the laser beam 1320, this is caused by the specification of the laser used for the measurement, and one shot of the laser beam 1320 is irradiated.

As shown in FIGS. 21A and 21B, when irradiation with the laser beam 1320 is performed, the intensity of the probe beam 1350' rises and rapidly increases. In other words, it is observed that the single crystal silicon layer is melted by irradiation with the laser beam 1320, that is, at least a part of the single crystal silicon layer exceeds the silicon melting point of 1410° C. The intensity of the probe beam 1350' rises to the maximum depth of the melted region of the single crystal silicon layer, and a high intensity state is kept for a while. When the intensity of the laser beam 1320 decreases, the intensity of the probe beam 1350' starts decreasing before long.

That is, FIGS. 21A and 21B show that, when irradiation with the laser beam 1320 is performed, the single crystal silicon wafer is melted, a melting state is kept for a while after irradiation with the laser beam 1320, and the single crystal silicon wafer starts solidifying before long, thereby returning to a solid phase state completely.

The intensity variation of the probe beam 1350' and a phase change of the single crystal silicon layer are described with reference to FIG. 21C. FIG. 21C is a graph which schematically shows an output signal waveform of the photodetector 1355 that is shown by photographs of FIGS. 21A and 21B. The signal intensity rapidly increases at time t1, and the time t1 is a time when the single crystal silicon layer starts melting. After the time t1, the period from time t2 to time t3 is substantially constant and is a period when a melting state is kept. In addition, the period from the time t1 to the time t2 is a period when the depth of a melting portion of the single crystal silicon layer is increased and is a melting period. The time t3 when the signal strength starts decreasing is solidification start time when the melting portion starts solidifying.

After the time t3, the signal strength decreases gradually and is substantially constant after time t4. At the time t4, although the surface at which the probe beam 1350' is reflected is completely solidified, the melting portion remains inside the surface. In addition, since the signal strength Ib after the time t4 is higher than the signal strength Ia before the time t1, it can be thought that recovery of a crystal defect due to dislocation or the like proceeds while the region irradiated with the laser beam 1320 after the time t4 is cooled gradually.

When the signal waveforms of FIGS. 21A and 21B are compared, it is found that melting time the melting state is kept can be lengthened by heating. In the case where the heating temperature of the stage is 500° C., the melting time is approximately 250 nanoseconds, and melting time in the case where heating is not performed (room temperature) is approximately 100 nanoseconds.

FIG. 23A is a top view of shapes of the laser beam 1320 and the probe beam 1350 with which a surface of the single crystal silicon layer is irradiated. FIG. 23B is a cross-sectional view taken along a line x-x' of FIG. 23A, and is a cross-sectional view showing the relationship between a region irradiated with the laser beam 1320 and a region irradiated with the probe beam 1350.

In FIG. 23B, reference numeral 1210 denotes an area irradiated with the laser beam 1320, which is an irradiated area in a width direction (a short axis direction) of the laser beam 1320. Hereinafter, this area is referred to as the laser beam irradiated area 1210. Reference numeral 1211 denotes an area irradiated with the probe beam 1350. Hereinafter, this area is referred to as the probe beam irradiated area 1211. Reference numeral 1212 denotes a beam profile of the laser beam 1320 along the width direction (the short axis direction). Hereinafter, this profile is referred to as the laser beam profile 1212.

Note that, although the signal strength is high in the period from the time t2 to the time t3, it appears that the signal waveforms of FIGS. 21A and 21B each attenuate in two stages in this period. The cause is not clear; however, it can be considered that one possible cause is that the probe beam 1350' reflected is detected in a plurality of regions which undergoes different phase changes by irradiation with the laser beam 1320 because a wider area than the area irradiated with the laser beam 1320 is irradiated with the probe beam 1350, as shown in FIG. 23A.

This is described with reference to FIG. 23B. The probe beam irradiated area 1211 includes three regions which are irradiated with the laser beam 1320 and have different amounts of energy. First is a region which is outside the laser beam irradiated area 1210 and is not irradiated with the laser beam. This region is hereinafter referred to as a region 1211a. Second is a region which is inside the laser beam irradiated area 1210 and irradiated with a part of the laser beam 1320 in a tail portion of the beam profile 1212. This region is hereinafter referred to as a region 1211b. Third is a region which is irradiated with a part of the laser beam 1320 in a top flat portion of the beam profile 1212. This region is hereinafter referred to as a region 1211c.

Accordingly, the photodetector 1355 receives the probe beam 1350' where rays are reflected by the region 1211a, the region 1211b, and the region 1211c.

It can be thought that the region 1211a does not undergo a phase change and change its reflectance for the probe beam 1350 because it is not irradiated with the laser beam 1320. Therefore, the region 1211a serves as a background of a detection signal of the photodetector 1355; thus, the region 1211a has little effect on the change in strength of the detection signal.

In contrast, the region 1211b is irradiated with the laser beam 1320 having a lower energy density than the region 1211c and having uneven distribution of energy density. Accordingly, it can be thought that an increase in temperature of the region 1211b is smaller than that of the region 1211c and the melting time of the region 1211b is shorter than that of the region 1211c. Therefore, the timing at which the region 1211b that is melted starts solidifying is prior to the timing at which the region 1211c starts solidifying. In this manner, it can be supposed that reflectance for the probe beam 1350 decreases in the period when the region 1211c is in a liquid state (the period T from the time t2 to the time t3 in FIG. 21C) because the region 1211b starts solidifying in this period and this decrease in reflectance is detected as the change in intensity of the detection signal of the photodetector 1355.

Next, the case is described in which irradiation with a laser beam 122 is performed and a single crystal semiconductor layer 115 is melted to perform re-single-crystallization.

FIGS. 25A to 25D are inverse pole figure (IPF) maps obtained from measurement data of electron back scatter diffraction pattern (EBSP) of the surface of the single crystal silicon layer 2201. The IPF map of FIG. 25A is data of the single crystal silicon layer 2201 that is not irradiated with a laser beam. The IPF map of FIG. 25B is data of the single crystal silicon layer 2201 after irradiation with a laser beam while the stage is heated at 500° C. in a nitrogen atmosphere. The IPF map of FIG. 25C is data of the single crystal silicon layer 2201 after irradiation with a laser beam while the stage is heated at 250° C. in a nitrogen atmosphere. The IPF map of FIG. 25D is data of the single crystal silicon layer 2201 after irradiation with a laser beam without heating.

FIG. 25E is a color coded map showing the relationship between colors of the IPF maps and crystal orientation, in which the orientation of each crystal is color-coded.

According to the IPF maps of FIGS. 25A to 25D, the crystal orientation of the single crystal silicon layer 2201 is not disordered before and after laser beam irradiation, and the plane orientation of the surface of the single crystal silicon layer 2201 is (100) which is the same as the plane orientation of the single crystal silicon wafer. In addition, it is found that there is no crystal grain boundary in the single crystal silicon layer 2201 before and after laser beam irradiation.

This is because a (100) orientation is shown in a color (red in the color drawing) of the color code map of FIG. 25E, and the IPF maps of FIGS. 25A to 25D are quadrangular images made of one color that shows this (100) orientation. Therefore, it is found that the crystal orientations are uniformly in (100), and there is no crystal grain boundary.

Note that dots present in the IPF maps of FIGS. 25A to 25D show portions having a low CI value. The CI value is an index value showing reliability and accuracy of data with which crystal orientation is determined. The CI value is decreased by the presence of crystal boundary, crystal defects, and the like. In other words, it can be concluded that when there are smaller number of portions with a low CI value, the crystallinity is higher. The number of portions having a low CI value is smaller in the IPF maps after laser beam irradiation of FIGS. 25B to 25D than in the IPF map before laser irradiation of FIG. 25A. Therefore, it can be thought that as a crystal defect of the single crystal silicon layer 2201, a microdefect such a dangling bond, or the like is restored by laser beam irradiation.

Note that for laser irradiation process of the single crystal silicon layer 2201 of FIGS. 25B to 25D, a XeCl excimer laser that emits a beam having a wavelength of 308 nm is used. The pulse width is 25 nanoseconds, and the repetition rate is 30 Hz. A laser beam is processed into a linear shape by an optical system; the width is 350 µm; and the length is 126 mm; and a scanning speed (movement speed of a substrate) is 1.0 mm/second. The number of shots of a laser beam with which the same region of the single crystal silicon layer 2201 is irradiated is 10.5 shots by calculation from the beam width and the scan speed. In addition, the energy density of the laser beam is 513 mJ/cm$^2$ when the stage is heated at 500° C., it is 567 mJ/cm$^2$ when the stage is heated at 250° C., and it is 648 mJ/cm$^2$ when heating is not performed.

Next, improvement in crystallinity of the single crystal silicon layer 2201 and improvement in planarity by laser irradiation process are described. The crystallinity of the single crystal silicon layer 2201 is evaluated using a Raman spectrometer, and the planarity of the surface is evaluated with images (hereinafter referred to as DFM images) observed in a dynamic force mode (DFM) by an atomic force microscope (AFM), or the measurement values showing surface roughnesses obtained from the DFM images.

In FIGS. 26A to 26C, cross-sectional photographs of the semiconductor substrate 11 are shown. The section photographs are STEM images photographed with a scanning transmission electron microscope (STEM). The STEM image of FIG. 26A is an image of, the single crystal silicon layer 2201 that is not irradiated with a laser beam. The STEM image of FIG. 26B is an image of the single crystal silicon layer 2201 after irradiation with a laser beam while the stage is heated at 500° C. in a nitrogen atmosphere. The STEM image of FIG. 26C is an image of the single crystal silicon layer 2201 after irradiation with a laser beam without heating. In FIGS. 26A to 26C, the thickness of the single crystal silicon layer 2201 is 120 nm.

As shown in FIG. 26A, a grain boundary in the single crystal silicon layer 2201 is not observed before laser beam irradiation. In addition, as shown in FIGS. 26B and 26C, it is found that there is no grain boundary in the single crystal silicon layer 2201 after laser beam irradiation.

Note that laser irradiation process of the single crystal silicon layer 2201 in FIGS. 26B and 26C is performed as follows: a laser irradiation atmosphere is a nitrogen atmosphere. In FIG. 26B, a nitrogen atmosphere is realized in such a way that a nitrogen gas is supplied into a chamber of a laser irradiation apparatus. In FIG. 26C, a nitrogen atmosphere is realized in such a way that laser beam irradiation is performed in the atmosphere and nitrogen is sprayed on a region irradiated with a laser beam.

As a laser, a XeCl excimer laser that emits a beam having a wavelength of 308 nm is used. The cross section of a laser beam is 350 µm×126 mm, and the scanning speed is 1.0 mm/second. In addition, the energy density of the laser beam is 513 mJ/cm$^2$ when the stage is heated at 500° C. in FIG. 26B, and it is 602 mJ/cm$^2$ when heating is not performed in FIG. 26C.

Next, measurement results of the Raman spectroscopy of the single crystal silicon layer 2201 which is irradiated with a laser beam are described. FIG. 27 is a graph showing a change in Raman shift of a laser beam with respect to an energy density. FIG. 28 is a graph showing changes of full width at half maximum (FWHM) of the Raman spectrum with respect to the energy density of the laser beam. FIGS. 27 and 28 show data in the case where the single crystal silicon layer 2201 is heated at 500° C. in the laser irradiation process, the case where the single crystal silicon layer 2201 is heated at 250° C. in the laser process, and the case where the substrate is not heated.

The peak wavenumber of Raman shift shown in FIG. 27 is a value determined by a distance between crystal lattices and a spring constant between the crystal lattices, and a unique value that depends on the kind of crystal. The Raman shift of single crystal silicon without any internal stress is 520.6 cm$^{-1}$. As the wavenumber of the Raman shift of the silicon layer is closer to this wavenumber, it can be determined that a crystal structure is closer to that of a single crystal, and the silicon layer has higher crystallinity. However, when compressive stress is applied to the single crystal, the distance between lattices is shortened; therefore, the peak wavenumber shifts to a higher wavenumber side in proportion to the amount of compressive stress. Meanwhile, when tensile stress is applied, the peak wavenumber shifts to a lower wavenumber side in proportion to the amount of tensile stress.

Therefore, it is not adequate to check whether the silicon layer is a single crystal just by the fact that the peak position of Raman shift is 520.6 cm$^{-1}$. The single crystal means a crystal in which crystal axis directions are the same directions in any portion of a sample and which does not have a crystal grain boundary between crystals when attention is paid to a certain crystal axis. Therefore, measurement of a crystal axis direction and presence of a crystal grain boundary is needed to check whether it has a single crystal structure. For example, such measurement includes measurement of electron back scatter diffraction pattern (EBSP), and such measurement can check that crystal axes are uniformly oriented (crystal orientation is uniform) and there is no crystal grain boundary by obtaining an IPF map from an EBSP image.

A smaller FWHM shown in FIG. 28 indicates that a crystal state is more uniform with less variation. The FWHM of a commercial single crystal silicon wafer is approximately 2.5 $cm^{-1}$ to 3.0 $cm^{-1}$, which can be used as an indicator of crystallinity. The closer an FWHM is to this value, the more excellent the crystallinity is like that of a single crystal silicon wafer.

Therefore, it is found that re-single-crystallization is performed by laser process and crystallinity is improved from the EBSP data of FIGS. 25A to 25E, and crystallinity can be recovered by laser irradiation process to the same or substantially the same level as a single crystal silicon wafer before processing from FIGS. 27 and 28. Note that, in the case where the substrate is not heated, it is confirmed that the wavenumber of Raman shift is improved to the same or substantially the same level as 520.6 $cm^{-1}$ and FWHM is decreased to approximately 2.5 $cm^{-1}$ to 3.0 $cm^{-1}$ by laser irradiation process. To achieve this, it is needed that the energy density of the laser beam be 600 $mJ/cm^2$ or more.

From the data of FIGS. 27 and 28, by irradiation with the laser beam 122 while the single crystal semiconductor layer 117 is heated, it is found that the energy density of a laser beam needed for recovery of crystallinity of the single crystal semiconductor layer 117 can be reduced.

It can be thought that one reason why the energy density of the laser beam 122 which is needed for recovery of crystallinity of the single crystal semiconductor layer 117 is reduced by heating of the single crystal semiconductor layer 117 is because the melting time of the single crystal semiconductor layer 117 is increased by heating, as shown in FIGS. 21A and 21B. Another reason is thought to be that it takes longer for the single crystal semiconductor layer 117 having a melted portion (a liquid-phase portion) to be cooled and return to a solid phase state completely.

Accordingly, it is preferable that heating be performed so that the melting time is 200 nanoseconds or more and 1000 nanoseconds or less. When a melting state is held for 1000 nanoseconds or more, the temperature of the supporting substrate 100 might rise to its strain point or higher and melting might occur.

In addition to heating of a substrate stage, laser beam irradiation is performed while a heated nitrogen gas is sprayed on at least a part of the single crystal semiconductor layer, the melting time can be increased and at least one of the above-described various effects can be obtained, compared with the case where laser beam irradiation is performed at room temperature.

For example, the surface of the single crystal silicon layer, which is melted and of which re-single-crystallization is performed by laser beam irradiation, is planarized. Although chemical mechanical polishing (abbreviation: CMP) is known as planarization treatment, in the case where a glass substrate is used as the supporting substrate 100, it is difficult to perform planarization treatment on the single crystal semiconductor layer 117 by CMP because a glass substrate is easily bent and has undulation. In the present invention, this planarization treatment is performed by irradiation process with the laser beam 122; therefore, without applying force that damages the supporting substrate 100 and without heating the supporting substrate 100 at temperature exceeding a strain point, planarization of the single crystal semiconductor layer 117 is enabled. Accordingly, a glass substrate can be used as the supporting substrate 100. That is, the present invention discloses an innovative method of irradiation process with a laser beam in a method for manufacturing a semiconductor substrate.

By a method for manufacturing a semiconductor substrate of the present invention, re-single-crystallization of a single crystal semiconductor layer which is separated from a single crystal semiconductor substrate can be performed at a process temperature of 700° C. or lower. In addition, the single crystal semiconductor layer which is separated from the single crystal semiconductor substrate can be planarized at a process temperature of 700° C. or lower. Therefore, even if a substrate having low heat resistance is used as a supporting substrate, a high-performance semiconductor element can be formed by using a semiconductor substrate. In addition, by using a light-transmitting glass substrate having a large area as a supporting substrate, a high-performance display device can be formed.

DETAILED DESCRIPTION OF THE INVENTION

Embodiment Mode

The present invention will be hereinafter described. Although the present invention will be fully described by way of embodiment modes with reference to the accompanying drawings, it is to be understood by those skilled in the art that various changes and modifications can be made without departing from the spirit and scope of the invention. Therefore, the present invention should not be interpreted as being limited to the description of the embodiment modes. Further, the same portions are denoted by the same reference symbols through the drawings, and repetition explanation of materials, shapes, manufacturing methods, and the like is omitted.

Embodiment Mode 1

In this embodiment mode, a semiconductor substrate in which a single crystal semiconductor layer is fixed to a supporting substrate with a buffer layer interposed therebetween and a manufacturing method thereof will be described.

Figure 1:
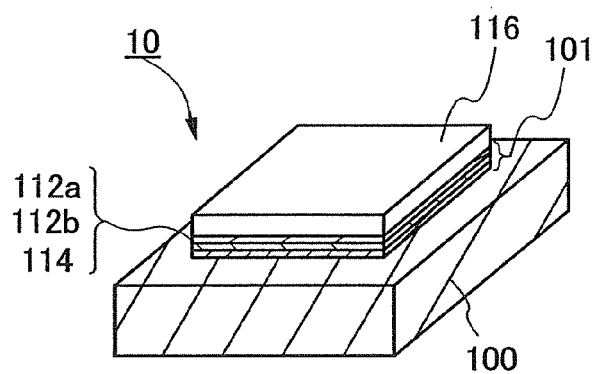
FIG. 1 is an external view which shows an example of a structure of a semiconductor substrate.

FIG. 1 is a perspective diagram which shows a structural example of a semiconductor substrate. In a semiconductor substrate 10, a single crystal semiconductor layer 116 is attached to the supporting substrate 100. The single crystal semiconductor layer 116 is provided over the supporting substrate 100 with a buffer layer 101 interposed therebetween. The semiconductor substrate 10 is a substrate having a so-called SOI structure, in which a single crystal semiconductor layer is formed over an insulating layer.

The buffer layer 101 may have a single-layer structure or a multilayer structure in which two or more layers are stacked. In this embodiment mode, the buffer layer 101 has a three-layer structure in which a bonding layer 114, an insulating film 112a, and an insulating film 112b are stacked from the supporting substrate 100 side. The bonding layer 114 is formed of an insulating film. The insulating film 112a is an insulating film that functions as a barrier layer. The barrier layer is a film that prevents the entry of impurities that decrease reliability of a semiconductor device, such as an alkali metal or an alkaline-earth metal (typically, sodium), into the single crystal semiconductor layer 116 from the supporting substrate 100 side at the time of manufacture of the semiconductor substrate and at the time of manufacture of the semiconductor device by use of this semiconductor substrate. By formation of the barrier layer, a semiconductor device can be prevented from being contaminated by impurities; therefore, reliability thereof can be improved.

The single crystal semiconductor layer 116 is a layer that is formed by thinning of a single crystal semiconductor substrate. As the single crystal semiconductor substrate, a commercial semiconductor substrate can be used; for example, a single crystal semiconductor substrate that is formed of a group 14 element, such as a single crystal silicon substrate, a single crystal germanium substrate, a single crystal silicon germanium substrate, or the like can be used. In addition, a compound semiconductor substrate of gallium arsenide, indium phosphide, or the like can be used. Needless to say, the single crystal semiconductor substrate is not limited to a circular wafer, and various shapes of single crystal semiconductor substrates can be used. For example, a polygonal substrate such as a circular substrate, a rectangular substrate, a pentagonal substrate, a hexagonal substrate, or the like can be used. Needless to say, a commercial circular single crystal semiconductor wafer can be used as the single crystal semiconductor substrate. As a circular single crystal semiconductor wafer, a semiconductor wafer of silicon, germanium, or the like; a compound semiconductor wafer of gallium arsenide, indium phosphide, or the like can be used. A typical example of the single crystal semiconductor wafer is a single crystal silicon wafer, and a circular wafer having a diameter of 5 inches (125 mm), a circular wafer having a diameter of 6 inches (150 mm), a circular wafer having a diameter of 8 inches (200 mm), a circular wafer having a diameter of 12 inches (300 mm), a circular wafer having a diameter of 400 mm, or a circular wafer having a diameter of 450 mm can be used. In addition, a rectangular single crystal semiconductor substrate can be formed by cutting a commercial circular single crystal semiconductor wafer. The substrate can be cut with a cutting apparatus such as a dicer or a wiresaw, a laser, plasma, an electronic beam, or any other cutting means. In addition, a rectangular single crystal semiconductor substrate can be formed in such a way that an ingot for manufacturing a semiconductor substrate before being sliced into a substrate is processed into a rectangular solid so as to have a rectangular section and this rectangular solid ingot is sliced. In addition, although there is no particular limitation on the thickness of the single crystal semiconductor substrate, a thick single crystal semiconductor substrate is preferable because many single crystal semiconductor layers can be formed from one piece of thick material wafer, in consideration of reuse of the single crystal semiconductor substrate. The thickness of single crystal silicon wafers circulating in the market conforms to SEMI standards, which specify that, for example, a wafer with a diameter of 6 inches has a thickness of 625 μm, a wafer with a diameter of 8 inches has a thickness of 725 μm, and a wafer with a diameter of 12 inches has a thickness of 775 μm. Note that the thickness of a wafer conforming to SEMI standards has a tolerance of ±25 μm. Needless to say, the thickness of the single crystal semiconductor substrate to be a material is not limited to SEMI standards, the thickness can be adjusted as appropriate when an ingot is sliced. Needless to say, when a reprocessed single crystal semiconductor substrate 110 is used, the thickness thereof is thinner than that of SEMI standards.

As the supporting substrate 100, a substrate having an insulating surface is used. Specific examples include a variety of glass substrates used in the electronic industries, such as substrates using aluminosilicate glass, aluminoborosilicate glass, and barium borosilicate glass, a quartz substrate, a ceramic substrate, and a sapphire substrate. It is preferable that a glass substrate be used as the supporting substrate 100. It is preferable that a glass substrate have a coefficient of thermal expansion which is higher than or equal to $25 \times 10^{-7}/°$ C. or higher and $50 \times 10^{-7}/°$ C. or lower (more preferably, $30 \times 10^{-7}/°$ C. or higher and $40 \times 10^{-7}/°$ C. or lower) and a strain point which is 580° C. or higher and 700° C. or lower (more preferably, 650° C. or higher and 690° C. or lower). It is also preferable that the glass substrate be a non-alkali glass substrate in order to suppress contamination of the semiconductor device. Examples of materials of non-alkali glass substrates include glass materials such as aluminosilicate glass, aluminoborosilicate glass, and barium borosilicate glass, and the like. For example, it is preferable that a non-alkali glass substrate (product name: AN100), a non-alkali glass substrate (product name: EAGLE2000 (registered trademark)), or a non-alkali glass substrate (product name: EAGLE XG (registered trademark)) be used as the supporting substrate 100.

Examples of substrates that can be used as the supporting substrate 100 other than glass substrates are as follows: insulating substrates such as a ceramic substrate, a quartz substrate, and a sapphire substrate; conductive substrates such as a metal substrate and a stainless steel substrate; and semiconductor substrates formed of silicon, gallium arsenide, and the like. In addition, it is preferable that the supporting substrate be a light transmitting substrate such as a glass substrate or a quartz substrate. By use of the light transmitting substrate, the semiconductor substrate 10 which is suitable for manufacture of a transmissive display device or a transflective (semi-transparent) display device can be formed.

A method for manufacturing the semiconductor substrate 10 shown in FIG. 1 will be described hereinafter with reference to FIG. 3, FIGS. 4A to 4E, and FIGS. 5A and 5B.

Figure 3:
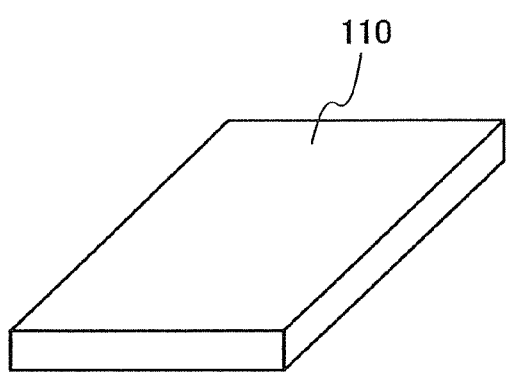
FIG. 3 is an external view which shows an example of a structure of a single crystal semiconductor substrate.

First, the single crystal semiconductor substrate 110 is prepared. The single crystal semiconductor substrate 110 is processed into a desired size and shape. FIG. 3 is an external view which shows an example of a structure of the single crystal semiconductor substrate 110. In consideration of the facts that the single crystal semiconductor substrate 110 is attached to the supporting substrate 100 and that a light exposure region of a light exposure apparatus such as a stepper is rectangular, and the like, it is preferable that the shape of the single crystal semiconductor substrate 110 be rectangular as shown in FIG. 3. Needless to say, the shape of the single crystal semiconductor substrate 110 is not limited to a substrate having the shape of FIG. 3, and various shapes of single crystal semiconductor substrates can be used. For example, a polygonal substrate such as a triangular substrate, a pentagonal substrate, a hexagonal substrate, or the like can be used as well as a rectangular substrate. A commercial circular semiconductor wafer can be used as the single crystal semiconductor substrate 110.

The rectangular single crystal semiconductor substrate 110 can be formed by cutting a commercial circular bulk single crystal semiconductor substrate. The single crystal semiconductor substrate 110 can be cut with a cutting apparatus such as a dicer or a wiresaw, a laser, plasma, an electronic beam, or any other cutting means. In addition, the rectangular single crystal semiconductor substrate 110 can be formed in such a way that an ingot for manufacturing a semiconductor substrate before being sliced into a substrate is processed into a rectangular solid so as to have a rectangular cross section and this rectangular solid ingot is sliced.

Note that, in the case where a substrate formed of a group 14 element having a diamond structure as a crystal structure, such as a single crystal silicon substrate, is used as the single crystal semiconductor substrate 110, the plane orientation of the main surface may be (100), (110), or (111). By use of the single crystal semiconductor substrate 110 with (100) orientation, the interface state density between the single crystal semiconductor layer 116 and the insulating layer formed on the surface thereof can be reduced, which is preferable for manufacture of a field effect transistor.

By use of the single crystal semiconductor substrate 110 having a (110) main surface, an element that forms the bonding layer 114 is closely coupled with a group 14 element (e.g., silicon) that forms the single crystal semiconductor layer 116 at a bonding surface between the bonding layer 114 and the single crystal semiconductor layer 116, whereby bonding force between the bonding layer 114 and the single crystal semiconductor layer 116 is improved.

By use of the single crystal semiconductor substrate 110 having a (110) main surface, atoms are more closely arranged on the main surface than on a surface with different plane orientation; therefore, planarity of the single crystal semiconductor layer 116 is improved. Accordingly, a transistor which is formed using the single crystal semiconductor layer 116 having a (110) main surface has excellent electrical characteristics such as a small subthreshold swing and a high field-effect mobility. Note that a single crystal semiconductor substrate having a (110) main surface has advantages over a single crystal semiconductor substrate having a (100) main surface in that it has a high Young's modulus and is likely to be cleaved.

Figure 4A:
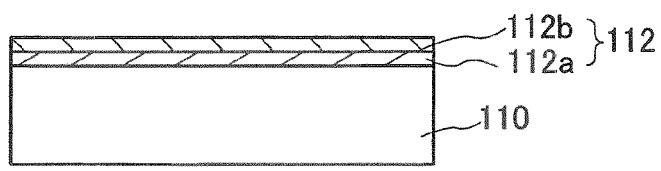
FIGS. 4A to 4E are cross-sectional views which illustrate a method for manufacturing a semiconductor substrate.

Next, as shown in FIG. 4A, an insulating layer 112 is formed over the single crystal semiconductor substrate 110. The insulating layer 112 can have a single-layer structure or a multilayer structure including two or more layers. The thickness of the insulating layer 112 can be 5 nm or more and 400 nm or less. As a film included in the insulating layer 112, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used.

Note that, in this specification, the oxynitride refers to a substance which contains more oxygen atoms than nitrogen atoms; whereas the nitride oxide refers to a substance which contains more nitrogen atoms than oxygen atoms. For example, a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The insulating film for forming the insulating layer 112 can be formed by a CVD method, a sputtering method, or a method of, for example, oxidizing or nitriding the single crystal semiconductor substrate 110.

When the supporting substrate 100 is a substrate including an impurity which decreases the reliability of the semiconductor device, such as an alkali metal or an alkaline-earth metal, the insulating layer 112 preferably includes at least one film capable of preventing diffusion of such an impurity from the supporting substrate 100 into the semiconductor layer of the SOI substrate. As such a film, a silicon nitride film, a silicon nitride oxide film, an aluminum nitride film, an aluminum nitride oxide film, and the like can be given. By including such a film, the insulating layer 112 can serve as a barrier layer.

For example, in the case where the insulating layer 112 is formed as a barrier layer with a single-layer structure, the insulating layer 112 can be formed of a silicon nitride film, a silicon nitride oxide film, an aluminum nitride film, or an aluminum nitride oxide film having a thickness of 5 nm or more and 200 nm or less.

The insulating layer 112 preferably includes a barrier layer for preventing sodium from entering the single crystal semiconductor layer 116. The barrier layer may include one layer or two or more layers. For example, in the case where a substrate containing impurities that reduce reliability of the semiconductor device, such as an alkali metal, an alkaline-earth metal, or the like, is used as the supporting substrate 100, such impurities might diffuse into the single crystal semiconductor layer 116 from the supporting substrate 100 when the supporting substrate 100 is heated. Therefore, by formation of the barrier layer, such impurities which reduce reliability of the semiconductor device such as an alkali metal, an alkaline-earth metal, or the like can be prevented from being moved to the single crystal semiconductor layer 116. As the film that serves as a barrier layer, a silicon nitride film, a silicon nitride oxide film, an aluminum nitride film, an aluminum nitride oxide film, and the like are given. By including such a film, the insulating layer 112 can serve as a barrier layer.

For example, in the case where the insulating layer 112 has a single-layer structure, the insulating layer 112 is preferably formed of a film that serves as a barrier layer. In this case, the insulating layer 112 having a single-layer structure can be formed of a silicon nitride film, a silicon nitride oxide film, an aluminum nitride film, or an aluminum nitride oxide film having a thickness of 5 nm or more and 200 nm or less.

When the insulating layer 112 is a film having a two-layer structure including one barrier layer, the upper layer is formed of a barrier layer for blocking impurities such as sodium or the like. The upper layer can be formed of a silicon nitride film, a silicon nitride oxide film, an aluminum nitride film, or an aluminum nitride oxide film having a thickness from 5 nm to 200 nm. These films that serve as barrier layers have a high blocking effect for preventing impurity diffusion, but their internal stress is also high. Therefore, as the lower insulating film which is in contact with the single crystal semiconductor substrate 110, a film with an effect of relieving the stress of the upper insulating film is preferable. As the insulating film having such an effect, a silicon oxide film, a silicon oxynitride film, a thermal oxide film formed by thermal oxidation of the single crystal semiconductor substrate 110, and the like are given. The lower insulating film can be formed at a thickness of 5 nm or more and 300 nm or less.

In this embodiment mode, the insulating layer 112 has a two-layer structure including the insulating film 112a and the insulating film 112b. As for a combination of the insulating film 112a and the insulating film 112b in order to function as a blocking film for the insulating layer 112, a silicon oxide film and a silicon nitride film, a silicon oxynitride film and a silicon nitride film, a silicon oxide film and a silicon nitride oxide film, a silicon oxynitride film and a silicon nitride oxide film, and the like can be given.

For example, as the insulating film 112a in the lower layer a silicon oxynitride film can be formed using $SiH_4$ and $N_2O$ as a process gas by a plasma-enhanced CVD method (hereinafter referred to as a "PECVD method"). Alternatively, as the insulating film 112a, a silicon oxide film can be formed using an organosilane gas and oxygen as a process gas by a PECVD method. Further alternatively, as the insulating film 112a, an oxide film can be formed by oxidation of the single crystal semiconductor substrate 110.

As examples of the organosilane, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

As the insulating film 112b in the upper layer, a silicon nitride oxide film can be formed using $SiH_4$, $N_2O$, $NH_3$, and $H_2$ as a process gas by a PECVD method, or a silicon nitride film can be formed using $SiH_4$, $N_2$, $NH_3$, and $H_2$ as a process gas by a PECVD method.

For example, in the case where the insulating film 112a using silicon oxynitride and the insulating film 112b using silicon nitride oxide are formed by a PECVD method, the single crystal semiconductor substrate 110 is carried into a treatment chamber of a PECVD apparatus. Then, $SiH_4$ and $N_2O$ are supplied to the treatment chamber as a process gas for formation of the insulating film 112a, and plasma of this process gas is generated, whereby a silicon nitride oxide film is formed over the single crystal semiconductor substrate 110. Next, the gas introduced into the treatment chamber is changed to a process gas for formation of the insulating film 112b. Here, $SiH_4$, $NH_3$, $H_2$, and $N_2O$ are used. Plasma of a mixed gas of these is generated, and a silicon nitride oxide film is formed over a silicon oxynitride film in succession. In the case where a PECVD apparatus having a plurality of treatment chambers is used, a silicon oxynitride film and a silicon nitride oxide film can be formed in different treatment chambers. Needless to say, by change of a gas introduced into the treatment chamber, a silicon oxide film can be formed in the lower layer and a silicon nitride film can be formed in the upper layer.

When the insulating film 112a and the insulating film 112b are formed as described above, the insulating layer 112 can be formed over the single crystal semiconductor substrate 110 with high throughput. In addition, because the insulating film 112a and the insulating film 112b can be formed without exposure to the atmosphere, the interface between the insulating film 112a and the insulating film 112b can be prevented from being contaminated by the atmosphere.

Alternatively, as the insulating film 112a, an oxide film can be formed by oxidation treatment of the single crystal semiconductor substrate 110. The thermal oxidation treatment to form this oxide film may be dry oxidation, but it is preferable to add a gas that contains a halogen to an oxidizing atmosphere. An oxide film that contains a halogen can be formed as the insulating film 112a. As a gas that contains a halogen, one kind or plural kinds of gases selected from HCl, HF, $NF_3$, HBr, Cl, ClF, $BCl_3$, F, $Br_2$, and the like can be used.

For example, heat treatment is performed at a temperature of 700° C. or higher in an atmosphere containing HCl at 0.5 volume % to 10 volume % (preferably 3 volume %) with respect to oxygen. Thermal oxidation is preferably performed at a heating temperature of 950° C. or higher and 1100° C. or lower. Processing time may be 0.1 to 6 hours, preferably 0.5 to 1 hour. The thickness of the oxide film thus formed can be made to be 10 nm to 1000 nm (preferably, 50 nm to 200 nm), and for example, 100 nm.

Through oxidation treatment within such a temperature range, a gettering effect with a halogen element can be obtained. Gettering particularly has the effect of removing a metal impurity. That is, by the action of halogen, an impurity such as a metal becomes volatile metal chloride and is evaporated into the air, thereby being removed from the single crystal semiconductor substrate 110. In addition, because a dangling bond on the surface of the single crystal semiconductor substrate 110 is terminated with a halogen element used in the oxidation treatment, the localized level density at the interface between the oxide film and the single crystal semiconductor substrate 110 can be reduced.

By this thermal oxidation treatment in the atmosphere containing a halogen, the oxide film can be made to contain a halogen. When a halogen element is contained at concentration of $1 \times 10^{17}$ atoms/cm$^3$ to $5 \times 10^{20}$ atoms/cm$^3$, the oxide film can function as a protective film which prevents contamination of the single crystal semiconductor layer 116 by capturing impurities such as a metal or the like in the semiconductor substrate 10.

The insulating film 112a can also be made to contain a halogen by being formed in a chamber of a PECVD apparatus containing a fluoride gas or a fluorine gas. A process gas for formation of the insulating film 112a is introduced into such a chamber; this process gas is excited to generate plasma; and the insulating film 112a is formed over the single crystal semiconductor substrate 110 by chemical reaction of active species contained in the plasma.

A chamber of a PECVD apparatus can be made to contain a fluorine compound gas by cleaning of the chamber through plasma gas etching using a fluoride gas. When a film is formed with a PECVD apparatus, a reaction product of a source material is deposited not only on a surface of a substrate but also on a chamber inner wall, an electrode, a substrate holder, and the like. This deposit causes a particle or dust. Accordingly, cleaning steps are regularly performed to remove such a deposit. One of typical chamber cleaning methods is a plasma gas etching method. In this method, a fluoride gas such as $NF_3$ is introduced into a chamber, the fluoride gas is excited to generate plasma so that fluorine radicals are generated, and deposit is removed by etching. A fluoride which is produced by reacting with the fluorine radicals is removed from a reaction vessel by an exhaust system because of its high vapor pressure.

Through cleaning by plasma gas etching, a fluoride gas used as a cleaning gas is adsorbed to an inner wall of the chamber and an electrode and various jigs provided in the chamber. That is, the chamber can be made to contain a fluoride gas. Note that, a method for making the chamber contain a fluoride gas includes a method in which a fluoride gas is introduced into the chamber after the single crystal semiconductor substrate is placed in the chamber, as well as a method in which the chamber is cleaned with a fluoride gas so that the fluoride gas remains in the chamber.

In the case where a silicon oxynitride film is formed as the insulating film 112a from, for example, $SiH_4$ and $N_2O$ by a PECVD method, $SiH_4$ and $N_2O$ are supplied to the chamber and excited to generate plasma, whereby the fluoride gas which remains in the chamber is also excited so that fluorine radicals are generated. Accordingly, the silicon oxynitride film can be made to contain fluorine. In addition, because the amount of the fluoride which remains in the chamber is very small and the fluoride gas is not supplied during formation of the silicon oxynitride film, fluorine is taken into the silicon oxynitride film at an early stage of formation thereof. Thus, the insulating film 112a can be made to have high fluorine concentration at the interface between the single crystal semiconductor substrate 110 and the insulating film 112a (the insulating layer 112) or at the periphery thereof. That is, the insulating layer 112 of the semiconductor substrate 10 of FIG. 1 can be made to have high fluorine concentration at the interface between the insulating layer 112 and the single crystal semiconductor layer 116 or at the periphery thereof.

When fluorine is contained in such a region, a dangling bond of a semiconductor at the interface with the single crystal semiconductor layer 116 can be terminated with fluorine. Therefore, the interface state density between the single crystal semiconductor layer 116 and the insulating layer 112 can be reduced. In addition, even when impurities such as sodium or the like are diffused into the insulating layer 112 from the supporting substrate 100, by the presence of fluorine, a metal can be captured by fluorine. Thus, metal contamination of the single crystal semiconductor layer 116 can be prevented.

Instead of the fluoride gas, a fluorine ($F_2$) gas can be contained in the chamber. Fluoride is a compound that contains fluorine (F) in its composition. As the fluoride gas, a gas selected from $OF_2$, $ClF_3$, $NF_3$, FNO, $F_3NO$, $SF_6$, $SF_5NO$, $SOF_2$, or the like can be used.

Figure 4B:
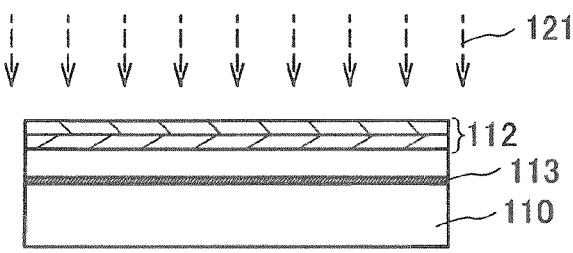

Next, as shown in FIG. 4B, the single crystal semiconductor substrate 110 is irradiated with an ion beam 121 including ions accelerated by an electric field through the insulating layer 112, thereby forming a damaged region 113 in the single crystal semiconductor substrate 110 at a predetermined depth from the surface thereof. The ion beam 121 is generated in such a way that a source gas is excited, plasma of the source gas is generated, and ions contained in the plasma are extracted from the plasma by the action of an electric field.

The depth at which the damaged region 113 is formed can be adjusted by the acceleration energy of the ion beam 121 and the incident angle of the ion beam 121. The acceleration energy can be adjusted by acceleration voltage, dosage, or the like. The damaged region 113 is formed at the same or substantially the same depth as the average penetration depth of the ions. The thickness of the single crystal semiconductor layer separated from the single crystal semiconductor substrate 110 is determined by the depth to which ions are added. The depth at which the damaged region 113 is formed is adjusted so that the thickness of this single crystal semiconductor layer is 20 nm or more and 500 nm or less, preferably, 20 nm or more and 200 nm or less.

For a method for adding ions to the single crystal semiconductor substrate 110, an ion doping method without mass separation is employed for the sake of irradiation with $H_3^+$ ions. An ion doping method without mass separation is preferable in that the cycle time when the damaged region 113 is formed in the single crystal semiconductor substrate 110 can be shortened, compared with an ion implantation method with mass separation. Different from a method using an ion implantation apparatus in which dot sequential scanning is carried out, an irradiation method with an ion doping apparatus can irradiate a large irradiation surface.

The single crystal semiconductor substrate 110 is carried in a treatment chamber of an ion doping apparatus. Main components of the ion doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated from the ion source are accelerated. Note that the components of the ion doping apparatus are not limited to the above-mentioned components, and a mechanism as needed is provided. A source gas is excited in the treatment chamber of the ion doping apparatus to generate plasma. Ion species are extracted from this plasma and accelerated to generate the ion beam 121. A plurality of single crystal semiconductor substrates 110 is irradiated with the ion beam 121, whereby ions are added at high concentration to the predetermined depth to form the damaged region 113.

When hydrogen ($H_2$) is used for a source gas, plasma containing $H^+$, $H_2^+$, and $H_3^+$ can be produced by exciting a hydrogen gas. Proportions of ion species produced from a source gas can be changed by controlling an excitation method of plasma, a pressure of an atmosphere for producing plasma, a supply of the source gas, or the like. It is preferable that $H_3^+$ ions be included in plasma so that $H_3^+$ ions account for 50% or more of the total amount of $H^+$ ions, $H_2^+$ ions, and $H_3^+$ ions which are ion species. It is more preferable that $H_3^+$ ions be included in plasma so that $H_3^+$ ions account for 80% or more of the total amount of $H^+$ ions, $H_2^+$ ions, and $H_3^+$ ions which are ion species. Therefore, an ion doping apparatus that is an apparatus of non-mass separation type, in which an object arranged in a chamber is irradiated with all of the ion species that are generated such that a process gas is plasma excited, is used. For example, an $H_2$ gas is supplied. In the ion doping apparatus to which an $H_2$ gas is supplied as a plasma source gas, $H_2$ is excited, whereby $H^+$ ions and $H_2^+$ ions which are hydrogen ions are generated. In addition, in the ion doping apparatus, there is a large amount of molecular hydrogen ($H_2$) in a region where plasma is generated, whereby $H_3^+$ can be easily generated in plasma. It is important that generation reaction (reaction shown by $H_2 + H^+ \rightarrow H_3^+$) is generated in the generation of $H_3^+$. Accordingly, a probability in which generation reaction is generated in plasma is increased, whereby the proportion of $H_3^+$ which exists in plasma can be increased. Since it is easy to include a large amount of molecular hydrogen ($H_2$) in plasma in the ion doping apparatus, the probability in which generation reaction occurs in plasma is increased, and plasma with a high proportion of $H_3^+$ can be generated. Meanwhile, in an ion implantation method with mass separation, it is difficult that $H_3^+$ accounts for 50% or more, preferably, 80% or more. An ion implantation apparatus using an ion implantation method is an apparatus for mass separating ion species in plasma and irradiating an object with an ion species having specific mass, and varies greatly from an ion doping apparatus that is an apparatus of non-mass separation type. In the ion implantation apparatus, when pressure in a region in which plasma is generated is small and a hydrogen gas is excited to generate $H^+$ ions and $H_2^+$ ions, these ion species are extracted promptly from the region in which plasma is generated. Accordingly, generation reaction is difficult to occur in plasma and the proportion of $H_3^+$ ions generated from the hydrogen gas is extremely low.

Since $H_3^+$ has larger number of hydrogen atoms than that of another hydrogen ion species ($H^+$ or $H_2^+$), $H_3^+$ has large mass; therefore, in the case of acceleration with the same energy, $H_3^+$ is added to a shallower region in the single crystal semiconductor substrate 110, compared to the case of $H^+$ and $H_2^+$. In practice, $H_3^+$ ions accelerated at high voltage are separated at the irradiation surface into three kinds of $H^+$ ions, and each of $H^+$ ions with which the single crystal semiconductor substrate is irradiated cannot enter a deep portion of the single crystal semiconductor substrate. Therefore, the increase in proportion of the $H_3^+$ ions included in the ion beam 121 leads to lower variation in the average depth at which the hydrogen ions enter; accordingly, in the single crystal semiconductor substrate 110, the hydrogen concentration profile in the depth direction becomes steeper and the peak position of the profile can shift to a shallow region. In addition, when one hydrogen atom is added to the same depth, it can be thought that acceleration voltage of $H_3^+$ ions can be three times as large as acceleration voltage of $H^+$ ions. When the acceleration voltage of ions can be increased, the cycle time of an ion irradiation step can be shortened, and productivity and throughput can be improved.

In the case where the ions are added by an ion doping method using a hydrogen gas, the acceleration voltage can be set to be 10 kV or more and 200 kV or less and the dosage can be set to be $1 \times 10^{16}$ ions/cm$^2$ or more and $6 \times 10^{16}$ ions/cm$^2$ or less. By addition of hydrogen ions under the conditions, the damaged region 113 can be formed in a portion of the single crystal semiconductor substrate 110 at a depth of 50 nm or more and 500 nm or less, although depending on ion species included in the ion beam 121 and percentages thereof.

For example, in the case where the single crystal semiconductor substrate 110 is a single crystal silicon substrate, the insulating film 112a is a 50-nm-thick silicon oxynitride film, and the insulating film 112b is a 50-nm-thick silicon nitride oxide film, a single crystal semiconductor layer with a thickness of approximately 120 nm can be separated from the single crystal semiconductor substrate 110 under the following conditions; a source gas is hydrogen, the acceleration voltage is 40 kV, and the dosage is $2.2 \times 10^{16}$ ions/cm$^2$. When doping with hydrogen ions is performed under the aforementioned conditions except that the insulating film 112a is a 100-nm-thick silicon oxynitride film, a semiconductor layer with a thickness of approximately 70 nm can be separated from the single crystal semiconductor substrate 110.

Helium (He) can alternatively be used for a source gas of the ion beam 121. Most of ion species produced by excitation of helium is He$^+$; therefore, the single crystal semiconductor substrate 110 can be mainly added with He$^+$ as ions even by an ion doping method which does not involve mass separation. Accordingly, microvoids can be efficiently formed in the damaged region 113 by an ion doping method. In the case where the ions are added by an ion doping method using helium, the acceleration voltage can be set to be 10 kV or more and 200 kV or less and the dosage can be set to be $1\times10^{16}$ ions/cm$^2$ or more and $6\times10^{16}$ ions/cm$^2$ or less.

A halogen gas such as a chlorine gas ($Cl_2$ gas) or a fluorine gas ($F_2$ gas) can also be used as the source gas.

Figure 4C:
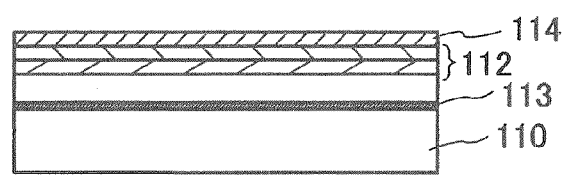

After the damaged region 113 is formed, the bonding layer 114 is formed over the upper surface of the insulating layer 112, as shown in FIG. 4C. In the step of forming the bonding layer 114, the single crystal semiconductor substrate 110 is heated at a temperature at which an element or a molecule that is added to the damaged region 113 does not precipitate, preferably at 350° C. or lower. In other words, the damaged region 113 does not release gas within this heat temperature range. Note that the bonding layer 114 can be formed before the ion addition step. In this case, the process temperature at the time of forming the bonding layer 114 can be set to 350° C. or higher.

The bonding layer 114 is a layer for forming a smooth hydrophilic bonding surface on the single crystal semiconductor substrate 110. Therefore, the bonding layer 114 preferably has an average surface roughness Ra of 0.7 nm or less, more preferably, 0.4 nm or less. The bonding layer 114 can have a thickness of 10 nm or more and 200 nm or less. The bonding layer 114 preferably has a thickness of 5 nm or more and 500 nm or less, and more preferably 10 nm or more and 200 nm or less.

The bonding layer 114 is preferably an insulating film which is formed by chemical vapor reaction. For example, a silicon oxide film, a silicon oxynitride film, a silicon nitride oxide film, a silicon nitride film, or the like can be formed as the bonding layer 114. In the case where a silicon oxide film is formed as the bonding layer 114 by a PECVD method, it is preferable to use an organosilane gas and an oxygen ($O_2$) gas as a source gas. By using organosilane as the source gas, it is possible to form a silicon oxide film having a smooth surface at process temperature of 350° C. or lower Alternatively, low temperature oxide (LTO) formed at temperature of 200° C. or higher and 500° C. or lower by a thermal CVD method can be used. LTO can be formed by using monosilane ($SiH_4$), disilane ($Si_2H_6$), or the like as a silicon source gas and using dinitrogen monoxide ($N_2O$) or the like as an oxygen source gas.

Examples of conditions for formation of the bonding layer 114 of a silicon oxide film by using TEOS and $O_2$ as a source gas are that TEOS is introduced into the treatment chamber at a flow rate of 15 sccm and $O_2$ is introduced into the treatment chamber at a flow rate of 750 sccm and that the film formation pressure is 100 Pa, the film formation temperature is 300° C., the RF output is 300 W, and the power frequency is 13.56 MHz.

The order of the step of FIG. 4B and the step of FIG. 4C can be reversed. That is, after the insulating layer 112 and the bonding layer 114 are formed over the single crystal semiconductor substrate 110, the damaged region 113 can be formed. In this case, it is preferable that the insulating layer 112 and the bonding layer 114 be formed in succession when the insulating layer 112 and the bonding layer 114 can be formed with the same film formation apparatus.

Alternatively, after the step of FIG. 4C is performed, the step of FIG. 4A and the step of FIG. 4B can be performed. That is, the single crystal semiconductor substrate 110 is doped with ions to form the damaged region 113; then, the damaged region 113 can be formed after the insulating layer 112 and the bonding layer 114 are formed. In this case, when the insulating layer 112 and the bonding layer 114 can be formed with the same film formation apparatus, it is preferable that the insulating layer 112 and the bonding layer 114 be formed in succession. In addition, in order to protect the surface of the single crystal semiconductor substrate 110 before the damaged region 113 is formed, the single crystal semiconductor substrate 110 can be subjected to oxidation treatment to form an oxide film on the surface, and then the single crystal semiconductor substrate 110 can be doped with ion species through the oxide film. This oxide film is removed after the damaged region 113 is formed. Alternatively, the insulating layer 112 can be formed in a state where the oxide film remains.

Next, the supporting substrate 100 and the single crystal semiconductor substrate 110 provided with the insulating layer 112, the damaged region 113, and the bonding layer 114 are cleaned. This cleaning process can be performed by ultrasonic cleaning with pure water. As the ultrasonic cleaning, megahertz ultrasonic cleaning (megasonic cleaning) is preferable. After the ultrasonic cleaning, it is preferable that one or both of the single crystal semiconductor substrate 110 and the supporting substrate 100 be cleaned with ozone water. By cleaning with ozone water, removal of an organic substance and surface activation treatment to improve hydrophilicity of the surface of the bonding layer 114 and the supporting substrate 100 can be performed.

The activation treatment of the surface of the bonding layer 114 and the supporting substrate 100 can be performed by irradiation process with an atomic beam or an ion beam, plasma treatment, or radical treatment as well as cleaning with ozone water. When an atomic beam or an ion beam is utilized, a noble gas neutral atom beam or noble gas ion beam of argon or the like can be used.

Figure 4D:
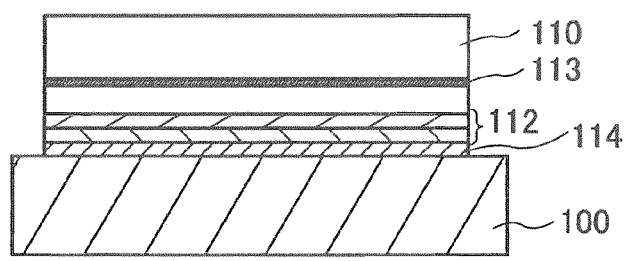

FIG. 4D is a cross-sectional view that illustrates a bonding step. The supporting substrate 100 and the single crystal semiconductor substrate 110 are arranged in close contact with each other with the bonding layer 114 interposed therebetween. By making the supporting substrate 100 and the single crystal semiconductor substrate 110 face each other and pressing one part thereof from the outside, the distance between the bonding surfaces is locally reduced. Accordingly, van der Waals forces are increased and together with contribution of hydrogen bonding, the supporting substrate 100 and the single crystal semiconductor substrate 110 attract each other so that they are partially bonded. Furthermore, since the distance between the opposed substrates is also reduced in an adjacent region, a region in which van der Waals forces strongly act or a region which is contributed by hydrogen bonding is widened; thus, bonding proceeds and spreads to the entire bonding surfaces. This bonding step can be performed at room temperature without heat treatment; therefore, a substrate having low heat resistance and having an allowable temperature limit of 700° C. or lower like a glass substrate can be used as the supporting substrate 100.

After the single crystal semiconductor substrate 110 is bonded to the supporting substrate 100, heat treatment to increase bonding force at the bonding interface between the supporting substrate 100 and the bonding layer 114 may be performed. This treatment is performed at temperature where a crack is not generated in the damaged region 113 and can be performed at temperature in the range of 200° C. or higher and 450° C. or lower. In addition, by bonding of the single crystal semiconductor substrate 110 to the supporting substrate 100 while heating is performed within this temperature range, bonding force at the bonding interface between the supporting substrate 100 and the bonding layer 114 can be increased. Note that, because bonding force at the bonding interface can be increased even by heat treatment that causes separation in a later step, heat treatment at 200° C. or higher and 450° C. or lower may be omitted.

Figure 4E:
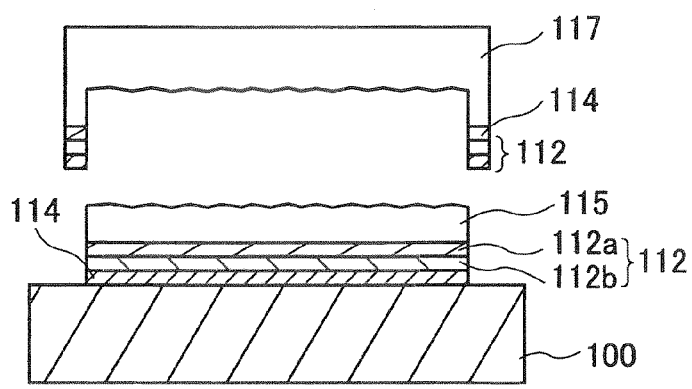

Next, heat treatment is performed to cause separation in the damaged region 113, whereby a single crystal semiconductor layer 115 is separated from the single crystal semiconductor substrate 110. FIG. 4E is a diagram illustrating a separation step where the single crystal semiconductor layer 115 is separated from the single crystal semiconductor substrate 110. Reference numeral 117 denotes the single crystal semiconductor substrate 110 from which the single crystal semiconductor layer 115 has been separated.

When heat treatment is performed, the element added by ion doping is precipitated in the microvoids formed in the damaged region 113 due to an increase in temperature, whereby internal pressure increases. Due to the increase in pressure, a change occurs in the volume of the microvoids in the damaged region 113 to generate a crack in the damaged region 113. As a result, the single crystal semiconductor substrate 110 is separated inside or along the interface of the damaged region 113. Because the bonding layer 114 is bonded to the supporting substrate 100, the single crystal semiconductor layer 115 which is separated from the single crystal semiconductor substrate 110 is fixed over the supporting substrate 100. The heat treatment for separating the single crystal semiconductor layer 115 from the single crystal semiconductor substrate 110 is performed at temperature which does not exceed a strain point of the supporting substrate 100.

For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. It is preferable that the temperature of the supporting substrate 100 to which the single crystal semiconductor layer 115 is attached be increased to 550° C. or higher and 650° C. or lower by this heat treatment.

When a GRTA apparatus is used, heating temperature can be set at 550° C. or higher and 650° C. or lower, and processing time can be set at 0.5 minute or more and 60 minutes or less. When a resistance heating furnace is used, heating temperature can be set at 200° C. or higher and 650° C. or lower, and processing time can be set to two hours or more and four hours or less. In the case where a microwave heating apparatus is used, irradiation can be performed with, for example, microwaves having a frequency of 2.45 GHz for processing time of 10 minutes or more and 20 minutes or less.

A specific treatment method of heat treatment by using a vertical furnace having resistance heating is described. The supporting substrate 100 to which the single crystal semiconductor substrate 110 is attached is loaded into a boat for the vertical furnace. The boat is carried into a chamber of the vertical furnace. In order to suppress oxidation of the single crystal semiconductor substrate 110, the chamber is first exhausted to a vacuum state. The degree of vacuum is approximately $5 \times 10^{-3}$ Pa. After a vacuum state is obtained, nitrogen is supplied to the chamber so that the chamber has a nitrogen atmosphere under atmospheric pressure. In this period, the temperature is increased to 200° C.

After the chamber is made to have a nitrogen atmosphere under atmospheric pressure, heating is performed at 200° C. for two hours. Then, the temperature is increased to 400° C. for one hour. After a state in which the heating temperature is 400° C. becomes stable, the temperature is increased to 600° C. for one hour. After a state in which the heating temperature is 600° C. becomes stable, heat treatment is performed at 600° C. for two hours. Then, heating temperature is decreased to 400° C. for one hour, and after 10 minutes to 30 minutes, the boat is carried out from the chamber. Under the atmosphere, the single crystal semiconductor substrate 117 and the supporting substrate 100 to which the single crystal semiconductor layer 115 is attached are cooled on the boat.

In the above-mentioned heat treatment using a resistance heating furnace, heat treatment to increase bonding force between the bonding layer 114 and the supporting substrate 100, and heat treatment to cause separation in the damaged region 113 are performed in succession. In the case of performing these two heat treatments in different apparatuses, for example, heat treatment is performed at 200° C. for two hours in a resistance heating furnace and then the supporting substrate 100 and the single crystal semiconductor substrate 110 which are bonded together are carried out from the furnace. Next, heat treatment is performed at temperature in the range of 600° C. or higher and 700° C. or lower for 1 minute to 30 minutes with an RTA apparatus, so that the single crystal semiconductor substrate 110 is divided in the damaged region 113.

In order to strongly bond the bonding layer 114 and the supporting substrate 100 to each other by low temperature treatment at 700° C. or lower, it is preferable that OH groups or water molecules ($H_2O$) exist on the surface of the bonding layer 114 and the surface of the supporting substrate. This is because the bonding between the bonding layer 114 and the supporting substrate 100 starts from the formation of covalent bonds (covalent bonds of oxygen molecules and hydrogen molecules) or hydrogen bonds of the OH groups or the water molecules.

Therefore, it is preferable that the surface of the bonding layer 114 and the surface of the supporting substrate 100 be activated to be hydrophilic. It is also preferable that the bonding layer 114 be formed by a method such that oxygen or hydrogen is contained. For example, a silicon oxide film, a silicon oxynitride film, a silicon nitride oxide film, a silicon nitride film, or the like is formed by a PECVD method at process temperature of 400° C. or lower, whereby hydrogen can be contained in the film. In order to form a silicon oxide film or a silicon oxynitride film, for example, $SiH_4$ and $N_2O$ are used for a process gas. In order to form a silicon nitride oxide film, for example, $SiH_4$, $NH_3$, and $N_2O$ are used. In order to form a silicon nitride film, for example, $SiH_4$ and $NH_3$ are used. In addition, it is preferable that a compound having an OH group such as TEOS (chemical formula: $Si(OC_2H_5)_4$) be used for a material in formation by a PECVD method.

Note that low temperature treatment refers to treatment at process temperature of 700° C. or lower. This is because the process temperature is a strain point or lower of a glass substrate. In contrast, for an SOI substrate that is formed by Smart-Cut (registered trademark), heat treatment at 800° C. or higher is performed to attach a single crystal silicon layer and a single crystal silicon wafer to each other, and heat treatment at a temperature exceeding a strain point of a glass substrate is needed.

Note that, as shown in FIG. 4E, it is often that case that the peripheral portion of the single crystal semiconductor substrate 110 is not bonded to the supporting substrate 100. It can be thought that this is because the damaged region 113 is not easily separated in the peripheral portion of the single crystal semiconductor substrate 110 where the supporting substrate 100 and the bonding layer 114 are not arranged in close contact with each other because the peripheral portion of the single crystal semiconductor substrate 110 is chamfered or the peripheral portion of the bonding layer 114 is damaged or contaminated when the single crystal semiconductor substrate 110 is moved. Therefore, the single crystal semiconductor layer 115 that has smaller size than the single crystal semiconductor substrate 110 is attached to the supporting substrate 100, a projecting portion is formed around the single crystal semiconductor substrate/layer 117, and portions of the insulating film 112b, the insulating film 112a, and the bonding layer 114 which are not attached to the supporting substrate 100 remain on the projecting portion.

The single crystal semiconductor substrate/layer 117 from which the single crystal semiconductor layer 115 has been separated can be reprocessed and reused as the single crystal semiconductor substrate 110. Hereinafter, a reprocessing method is described.

As shown in FIG. 4E, a portion which is not attached to the supporting substrate 100 is left remaining at the periphery of the single crystal semiconductor substrate/layer 117. Portions of the insulating film 112b, the insulating film 112a, and the bonding layer 114 which are not attached to the supporting substrate 100 remain in this portion.

First, etching treatment is performed to remove the insulating film 112b, the insulating film 112a, and the bonding layer 114. For example, when these films are formed from silicon oxide, silicon oxynitride, silicon nitride oxide, or the like, the insulating film 112b, the insulating film 112a, and the bonding layer 114 can be removed by wet etching treatment using hydrofluoric acid.

Next, the single crystal semiconductor substrate/layer 117 is etched, thereby removing this peripheral projecting portion and the surface from which the single crystal semiconductor layer 115 has been separated. The etching treatment for the single crystal semiconductor substrate/layer 117 is preferably wet etching treatment, and a tetramethylammonium hydroxide (abbreviation: TMAH) solution can be used as an etchant.

After the single crystal semiconductor substrate/layer 117 is subjected to etching treatment, the surface thereof is polished and planarized. For the polishing treatment, chemical mechanical polishing (abbreviation: CMP) or mechanical polishing can be used. In order to smooth the surface of the single crystal semiconductor substrate, the surface is polished approximately 1 μm to 10 μm. After the polishing, hydrofluoric acid cleaning or RCA cleaning is performed because abrasive particles and the like are left on the surface of the single crystal semiconductor substrate.

Through the above-mentioned process, the single crystal semiconductor substrate/layer 117 can be reused as the single crystal semiconductor substrate 110 which is shown in FIG. 3. By reuse of the single crystal semiconductor substrate/layer 117, material cost of the semiconductor substrate 10 can be reduced.

Figure 5A:
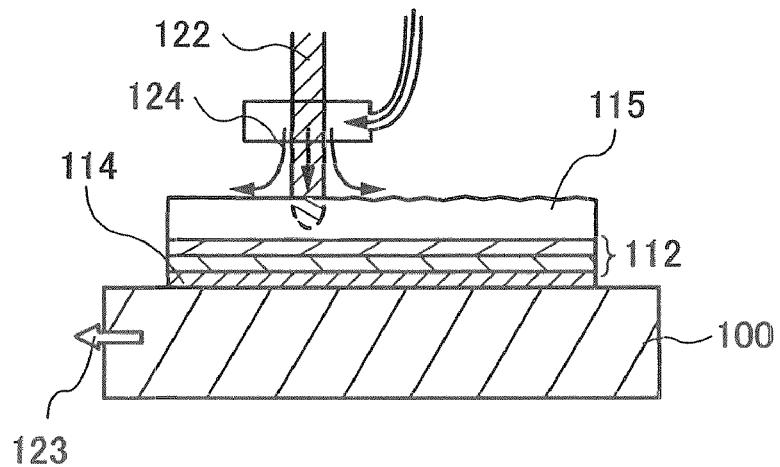
FIGS. 5A and 5B are cross-sectional views which show a method for manufacturing a semiconductor substrate and cross-sectional views of a supporting substrate.

The single crystal semiconductor layer 115 arranged in close contact with the supporting substrate 100 is provided with a crystal defect by separation of the damaged region 113 and formation of the damaged region 113. In addition, planarity of the surface is lost. In order to perform re-single-crystallization of the single crystal semiconductor layer 115 and to improve the planarity of the surface, the single crystal semiconductor layer 115 is irradiated with the laser beam 122 and the irradiation region is heated by spraying a heated nitrogen gas, as shown in FIG. 5A.

As shown by an arrow 123, a stage is moved to move the supporting substrate 100, and the separation plane of the single crystal semiconductor layer 115 is irradiated with the laser beam 122 by scanning the single crystal semiconductor layer 115. A part of the single crystal semiconductor layer 115 or an entire layer in a depth direction thereof is melted by the heated nitrogen gas and irradiation with the laser beam 122. By melting, planarity is improved by the action of surface tension. In FIG. 5A, a state is schematically shown in which a part of the single crystal semiconductor layer 115 is melted, and at least a part of a portion surrounded by a dashed line shows that the part exceeds a melting point of 1410° C. to be in a liquid phase.

Further, the heated nitrogen gas is sprayed, whereby melting time and the length of time to be completely solidified are expanded. In this embodiment mode, a current of air is formed so that the heated nitrogen gas is spread from the region irradiated with the laser beam as a center. Therefore, the single crystal semiconductor layer 115 can be heated at 400° C. or higher and a strain point or lower of the supporting substrate, preferably, at 450° C. or higher and 650° C. or lower before and after laser irradiation.

Figure 5B:
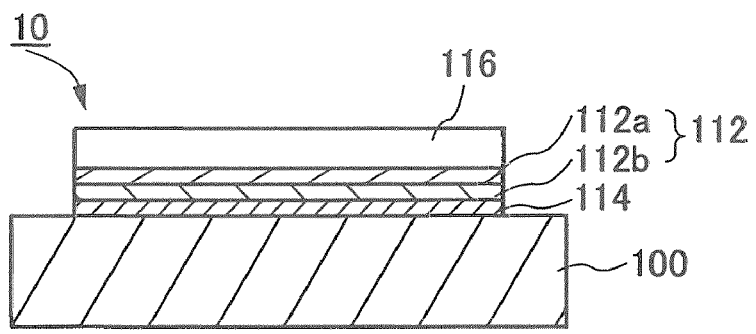

After melting, the single crystal semiconductor layer 115 is cooled and solidified more slowly than natural cooling; as shown in FIG. 5B, the single crystal semiconductor layer 116 in which planarity is further improved on the upper surface of the single crystal semiconductor layer 115 and re-single-crystallization is performed is formed. In addition, a distortion of the single crystal semiconductor layer 116 can be decreased by irradiation with the laser beam. An external view of FIG. 5B corresponds to FIG. 1. Note that improvement in crystallinity of the single crystal semiconductor layer 116 due to the laser beam 122 can be checked by a Raman shift obtained from a Raman spectroscopy spectrum, a full width at half maximum, or the like. In addition, improvement in planarity of the single crystal semiconductor layer 116 can be checked by observation using an atomic force microscope, for example.

By irradiation with the laser beam 122, a region of the single crystal semiconductor layer 115 which is irradiated with the laser beam 122 is partially or completely melted. Note that a completely melted state of the single crystal semiconductor layer 115 means that the entire layer from the upper surface to the lower surface is melted. In a stacked structure of FIG. 5A, a completely melted state means that the single crystal semiconductor layer 115 is melted into a liquid state from the upper surface to the interface with the insulating layer 112. Meanwhile, to partially melt the single crystal semiconductor layer 115 means that the depth of a melted portion of the single crystal semiconductor layer 115 is shallower than that of the interface with the bonding layer 114 (the thickness of the single crystal semiconductor layer 115). That is, a partially melted state of the single crystal semiconductor layer 115 means a state in which the upper layer of the supporting substrate 100 is melted into a liquid phase and the lower layer thereof is not melted and remains as a solid-phase single crystal semiconductor.

Partial melting is performed by irradiation with the laser beam 122, whereby crystal grows from the single crystal semiconductor that is the solid phase portion which is not melted in the lower layer, and a so-called longitudinal growth occurs in the single crystal semiconductor layer 115 when a portion which is melted is solidified. The lower solid phase portion is a single crystal and has uniform crystal orientation; thus, no crystal grain boundary is formed therein and the single crystal semiconductor layer 116 after laser irradiation process can be a single crystal semiconductor layer without any crystal grain boundary. Re-single-crystallization of the upper melted portion is performed by solidification, and a single crystal semiconductor which has the same crystal orientation as the single crystal semiconductor in the lower solid phase portion is formed. Therefore, in the case where a single crystal silicon wafer whose main surface is oriented along the (100) plane is used as the single crystal semiconductor substrate 110, a main surface of the single crystal semiconductor layer 115 is oriented along the (100) plane, and a main surface of the single crystal semiconductor layer 116 which is partially melted by laser irradiation process and of which re-single-crystallization is performed is oriented along the (100) plane.

On the other hand, in the region that is melted by scanning with the laser beam 122 while being completely melted by irradiation with the laser beam 122, crystals in the melted region can grow from the single crystal semiconductor which is adjacent to the melted region, and lateral growth occurs. A portion which is not melted is a single crystal and has uniform crystal orientation; thus, no crystal grain boundary is formed therein and the single crystal semiconductor layer 116 after laser irradiation process can be a single crystal semiconductor layer without any crystal grain boundary. Re-single-crystallization of the completely melted region is performed by solidification, and a single crystal semiconductor which has the same crystal orientation as the single crystal semiconductor in the portion which is adjacent and not melted is formed. Therefore, in the case where a single crystal silicon wafer whose main surface is oriented along the (100) plane is used as the single crystal semiconductor substrate 110, a main surface of the single crystal semiconductor layer 115 is oriented along the (100) plane, and a main surface of the single crystal semiconductor layer 116 which is completely melted by laser irradiation process and of which re-single-crystallization is performed is oriented along the (100) plane.

By partial melting or complete melting of the single crystal semiconductor layer 115 through irradiation with the laser beam 122, the single crystal semiconductor layer 116 having a flat surface can be formed. The reason is as follows. A melted portion of the single crystal semiconductor layer 115 is liquid and is thus transformed by the action of surface tension so as to minimize the surface area. That is, a liquid portion is transformed so as to have no depressed and projecting portions, and this liquid portion is then solidified to perform re-single-crystallization. Accordingly, the single crystal semiconductor layer 116 having a planarized surface can be formed.

By planarization of the surface of the single crystal semiconductor layer 116, the thickness of a gate insulating film which is formed over the single crystal semiconductor layer 116 can be small, approximately 5 nm to 50 nm. Accordingly, a transistor having high on current can be formed while gate voltage is kept low.

In this manner, this embodiment mode discloses a novel innovative technique for a method for obtaining a better single crystal by irradiating a single crystal semiconductor layer with a laser beam, and melting a part or whole of the single crystal semiconductor layer to perform re-single-crystallization. Such a method of using a laser beam is not anticipated by conventional techniques and is a completely novel concept.

Re-single-crystallization of the single crystal semiconductor layer 116 is performed, whereby a transistor which has high on current and high electron field-effect mobility can be formed from the semiconductor substrate 10. A process of re-single-crystallization of the single crystal semiconductor layer is performed by irradiation process with the laser beam 122; therefore, re-single-crystallization of the single crystal semiconductor layer 115 can be performed and formation of a single crystal is enabled without applying force that damages the supporting substrate 100 and without heating the supporting substrate 100 at temperature exceeding an allowable temperature limit.

The surface of the single crystal semiconductor layer 116 irradiated with the laser beam 122 is planarized, and the arithmetical mean roughness of unevenness on the surface can be 1 nm or more and 7 nm or less. The root-mean-square roughness of the unevenness can be 1 nm or more and 10 nm or less. The maximum difference in height of the unevenness can be 5 nm or more and 250 nm or less. That is, irradiation process with the laser beam 122 can be regarded as planarization treatment of the single crystal semiconductor layer 115.

The surface of the single crystal semiconductor layer 116 is planarized in this manner, whereby the thickness of a gate insulating film which is formed over the single crystal semiconductor layer 116 can be thinned to approximately 5 nm to 50 nm. Accordingly, a transistor having high reliability and high gate withstand voltage can be formed.

Chemical mechanical polishing (abbreviation: CMP) is known as planarization treatment; however, a mother glass substrate has a large area and undulation. Therefore, in the case where a mother glass substrate is used as the supporting substrate 100, it is difficult to perform planarization treatment of the single crystal semiconductor layer 115 by CMP. In this embodiment mode, this planarization treatment is performed by irradiation process with the laser beam 122; therefore, the single crystal semiconductor layer 115 can be planarized without applying force that damages the supporting substrate 100 and without heating the supporting substrate 100 at temperature exceeding an allowable temperature limit.

When irradiation with the laser beam 122 is performed, a heated gas is sprayed and the single crystal semiconductor layer 115 which is fixed to the supporting substrate 100 is heated, whereby the temperature of the single crystal semiconductor layer 115 is increased. The heating temperature of the supporting substrate 100 can be 250° C. or higher and a strain point or lower of the supporting substrate. The heating temperature is preferably 400° C. or higher, more preferably, 450° C. or higher. Specifically, the heating temperature is preferably 400° C. or higher and 670° C. or lower, more preferably, 450° C. or higher and 650° C. or lower.

By heating of the single crystal semiconductor layer, dangling bonds in the single crystal semiconductor layer or microdefects such as defects at the interface between the single crystal semiconductor layer and a base film can be removed, and a better single crystal semiconductor layer can be obtained. With the use of the semiconductor substrate 10 to which the single crystal semiconductor layer 116 having a small number of crystal defects, such as dislocation, or crystal microdefects, such as dangling bonds, is fixed, a transistor with high on current and high field-effect mobility can be formed.

In the case where a glass substrate is used as the supporting substrate 100, the supporting substrate to which the single crystal semiconductor layer is fixed is heated at 400° C. or higher, preferably, 450° C. or higher, whereby the supporting substrate can be shrunk. Accordingly, in the case where a transistor is formed using a glass substrate to which the single crystal semiconductor layer is fixed, if shrinkage is made in advance in the process of manufacturing the single crystal semiconductor substrate, the amount of shrinkage in the process of manufacturing a transistor can be suppressed. Therefore, mask misalignment in a light-exposure step can be suppressed.

When the insulating film 112a which is in contact with the single crystal semiconductor layer 115 is made to contain a halogen, the insulating film is heated by irradiation with a laser beam. Therefore, a halogen is diffused from the insulating film and can be segregated at the interface between the single crystal semiconductor layer 116 which is obtained by re-single-crystallization and the insulating film 112a. By segregation of a halogen at the interface between the single crystal semiconductor layer 116 and the insulating film 112a, the halogen can capture ions of sodium or the like which are present at the interface. Thus, in the case where a glass substrate is used as the supporting substrate 100, irradiation process with a laser beam in which the insulating film 112a that contains a halogen is formed while a heated gas is being sprayed and heating is being performed is very effective to prevent contamination of the single crystal semiconductor layer 116 by an impurity such as sodium or the like.

To form the insulating film 112a that is in contact with the single crystal semiconductor layer 115 and contains a halogen and to form the insulating film 112b that is in contact with the insulating film 112a and serves as a barrier layer with a high impurity blocking effect are effective in increasing the concentration of the halogen that is segregated at the interface between the single crystal semiconductor layer 116 and the insulating film 112a. The reason is that a large amount of halogen is diffused to the single crystal semiconductor layer 116 side because a halogen is not easily diffused into the insulating film 112b that serves as a barrier layer. As such an insulating film 112b, a silicon nitride film or a silicon nitride oxide film can be used.

The above-described insulating film 112a and insulating film 112b can be formed by a method where the insulating film 112a and the insulating film 112b are successively formed of either silicon oxynitride or silicon oxide and either silicon nitride oxide or silicon nitride, respectively, in a chamber of a PECVD apparatus after plasma cleaning with, for example, $NF_3$. The insulating film 112a and the insulating film 112b can be successively formed by changing a process gas for film formation to be supplied to the chamber.

The single crystal semiconductor layer 115 is melted by irradiation with the laser beam 122, so that re-single-crystallization of the single crystal semiconductor layer 116 is performed, whereby a better single crystal semiconductor layer can be formed and its surface is planarized. It is preferable that the single crystal semiconductor layer be partially melted by irradiation with the laser beam 122. When complete melting is performed, crystal growth nuclei are generated at random in the single crystal semiconductor layer 115 which is in a liquid phase, and re-single-crystallization of the single crystal semiconductor layer 115 is performed from these nuclei. Thus, crystallinity of the single crystal semiconductor layer 116 is decreased. When partial melting is performed, generation of nuclei at random is suppressed. Note that the state where the single crystal semiconductor layer 115 is completely melted indicates, in the case of the stacked structure of FIG. 5A, that the portion from the top surface of the single crystal semiconductor layer 115 to the interface with the bonding layer 114 is melted and is in a liquid phase. On the other hand, the state where the single crystal semiconductor layer 115 is partially melted indicates that a part of the single crystal semiconductor layer 115 on a side where the laser beam 122 is incident on is melted to be in a liquid phase but another part is not melted and keeps a solid-phase state.

Although chemical mechanical polishing (abbreviation: CMP) is known as planarization treatment, a glass substrate is easily bent and has undulation. Accordingly, in the case where a glass substrate is used as the supporting substrate 100, it is difficult to perform planarization treatment on the single crystal semiconductor layer 115 by CMP. In this embodiment mode, this planarization treatment is performed by irradiation process with the laser beam 122; therefore, without applying force that damages the supporting substrate 100 and without heating the supporting substrate 100 at temperature exceeding a strain point, planarization of the single crystal semiconductor layer 115 is enabled. Accordingly, a glass substrate can be used as the supporting substrate 100. That is, this embodiment mode discloses an innovative usage method of irradiation process with a laser beam in a method for manufacturing a semiconductor substrate.

As a laser that emits the laser beam 122, a laser whose emission wavelength is in the range from the ultraviolet region to the visible light region is selected. The wavelength of the laser beam 122 is a wavelength that is absorbed by the single crystal semiconductor layer 115. The wavelength can be determined in consideration of the skin depth of the laser beam, and the like. For example, the wavelength can be in the range of 250 nm or more and 700 nm or less.

As this laser, a continuous wave laser, a quasi continuous wave laser, or a pulsed laser can be used. A pulsed laser is preferable for partial melting. In the case of pulsed laser, a repetition rate of 1 MHz or less, and a pulse width of 10 nanoseconds or more and 500 nanoseconds or less can be used. A typical pulsed laser is an excimer laser that emits a beam having a wavelength of 400 nm or less. As a laser, for example, a XeCl excimer laser having a repetition rate of 10 Hz to 300 Hz, a pulse width of 25 nanoseconds, and a wavelength of 308 nm can be used.

The energy of the laser beam 122 can be determined in consideration of the wavelength of the laser beam 122, the skin depth of the laser beam 122, the thickness of the single crystal semiconductor substrate 110, and the like. The energy of the laser beam 122 can be set, for example, in the range of 300 mJ/cm$^2$ to 800 mJ/cm$^2$ inclusive. For example, the energy density of the laser beam 122 can be 600 mJ/cm$^2$ to 700 mJ/cm$^2$ in the case where the thickness of the single crystal semiconductor layer 115 is approximately 120 nm, a pulsed laser is used as a laser, and a wavelength of the laser beam 122 is 308 nm.

It is found that the atmosphere of irradiation with the laser beam 122 is effective for planarization of the single crystal semiconductor layer 115 either in the atmosphere without any control or in a nitrogen gas atmosphere that contains a small amount of oxygen. It is also found that a nitrogen gas atmosphere is more preferable than the atmosphere. A nitrogen atmosphere and a vacuum state are more effective than the atmosphere in improving planarity of the single crystal semiconductor layer 116. In addition, these atmospheres are more effective than the atmosphere in suppressing generation of a crack; therefore, the energy of the laser beam 122 can be selected from a wider range.

It is preferable that a high-purity nitrogen gas be used and oxygen concentration contained in a nitrogen gas be 30 ppm or less, more preferably, 30 ppb or less. In addition, it is preferable that water ($H_2O$) concentration of the nitrogen gas be 30 ppm or less. Desirably, an ultrapure gas in which oxygen concentration contained in the nitrogen gas is 30 ppb or less and water concentration is 30 ppb or less is used. For example, in the case where a nitrogen gas whose oxygen concentration is more than 30 ppm is used, since the atmosphere near a laser irradiation region is heated, reactivity with oxygen might be increased and a thin oxide film might be formed on a surface in laser irradiation undesirably. Since this thin oxide film is preferably removed, removal steps are added. An ultrapure gas in which oxygen concentration contained in a nitrogen gas is 30 ppb or less and the water concentration is 30 ppb or less is used, whereby formation of an oxide film in laser irradiation is prevented.

To irradiate the separation plane of the single crystal semiconductor layer 115 with the laser beam 122 in a nitrogen gas atmosphere, as shown in FIG. 5A, the single crystal semiconductor layer 115 may be irradiated with the laser beam 122 while a nitrogen gas 124 is sprayed on a surface to be irradiated with the laser beam 122. That is, since a region where the nitrogen gas 124 is sprayed in the single crystal semiconductor layer 115 is irradiated with the laser beam 122, irradiation with the laser beam 122 in a nitrogen gas atmosphere can be realized.

It is preferable that the nitrogen gas 124 be heated. The nitrogen gas 124 is heated and the heated nitrogen gas is sprayed, whereby a decrease in a surface temperature of the single crystal semiconductor layer 115 can be suppressed. The nitrogen gas 124 is heated at 50° C. or higher, whereby a decrease in a surface temperature of the single crystal semiconductor layer 115 can be suppressed. It is preferable that a heating temperature of the nitrogen gas 124 be 250° C. or higher and 670° C. or lower. The heating temperature of the nitrogen gas 124 is 250° C. or higher, whereby the single crystal semiconductor layer 115 can be heated. As a result, energy shortage in the laser beam 122 can be compensated, and the available energy range of the laser beam 122 can be extended. The heating temperature is preferably 450° C. or higher and 625° C. or lower.

It is preferable that the laser beam 122 pass through an optical system and energy distribution of the laser beam 122 be uniform. Further, it is preferable that a cross section of the laser beam 122 be linear. Accordingly, irradiation with the laser beam 122 can be performed uniformly with high throughput.

Before the single crystal semiconductor layer 115 is irradiated with the laser beam 122, it is preferable that an oxide film, such as a film that is naturally oxidized, which is formed on the surface of the single crystal semiconductor layer 115 be removed. This is because a sufficient planarization effect is not obtained when the single crystal semiconductor layer 115 is irradiated with the laser beam 122 in a state that an oxide film remains on the surface of the single crystal semiconductor layer 115. The oxide film can be removed by treatment of the single crystal semiconductor layer 115 with hydrofluoric acid. Treatment with hydrofluoric acid is performed until the surface of the single crystal semiconductor layer 115 becomes water repellent. When the single crystal semiconductor layer 115 has water repellency, it can be found that the oxide film is removed from the single crystal semiconductor layer 115.

The irradiation step with the laser beam 122 of FIG. 5A can be performed as follows. First, the single crystal semiconductor layer 115 is treated with 100-fold diluted hydrofluoric acid for 110 seconds to remove the oxide film on the surface. As a laser which emits the laser beam 122, a XeCl excimer laser (with a wavelength of 308 nm, a pulse width of 25 nanoseconds, and a repetition rate of 60 Hz) is used. Through an optical system, a section of the laser beam 122 is formed into a linear shape of 300 mm×0.34 mm. The single crystal semiconductor layer 115 is irradiated with the laser beam 122 where the scanning speed of the laser beam 122 is 2.0 ml/second, the scanning pitch is 33 μm, and the number of beam shots is approximately 10 shots. In addition, scanning with the laser beam 122 is conducted while a nitrogen gas which is heated at 300° C. is sprayed on an irradiation surface of the single crystal semiconductor layer 115.

Before the single crystal semiconductor layer 115 is irradiated with the laser beam 122, the single crystal semiconductor layer 115 can be etched. It is preferable that the damaged region 113 which remains on the separation plane of the single crystal semiconductor layer 115 be removed by this etching. By removal of the damaged region 113, a surface planarization effect and a re-single-crystallization effect produced by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbreviation: TMAH) solution.

After the single crystal semiconductor layer 115 is irradiated with the laser beam 122, the single crystal semiconductor layer 116 may be thinned by etching. The thickness of the single crystal semiconductor layer 116 can be determined in accordance with characteristics of an element to be formed with the single crystal semiconductor layer 116. In order to form a thin gate insulating layer with excellent step coverage over the surface of the single crystal semiconductor layer 116 which is attached to the supporting substrate 100, the thickness of the single crystal semiconductor layer 116 is preferably 50 nm or less and may be 5 nm or more and 50 nm or less.

The etching for thinning the single crystal semiconductor layer 116 can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbreviation: TMAH) solution.

Because the steps from FIGS. 4A to 4E and FIGS. 5B and 5B can be performed at temperature of 700° C. or lower, a glass substrate having an allowable temperature limit of 700° C. or lower can be used as the supporting substrate 100. Thus, an inexpensive glass substrate can be used, whereby a material cost of the semiconductor substrate 10 can be reduced.

Figure 6:
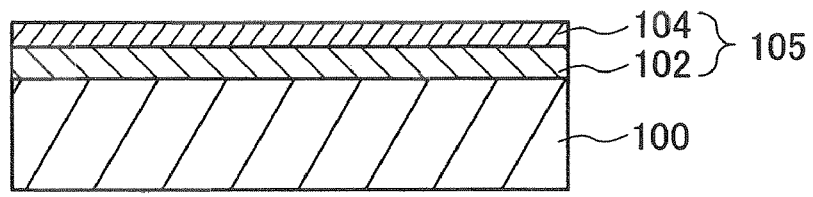
FIG. 6 is a cross-sectional view which shows a method for manufacturing a semiconductor substrate.

Note that the supporting substrate 100 can be provided with a bonding layer. In addition, an insulating layer can be formed to be arranged in close contact with the surface of the supporting substrate 100. FIG. 6 is a cross-sectional view of the supporting substrate 100, and an insulating layer 102 is formed in contact with the surface of the supporting substrate 100, and a bonding layer 104 is formed over insulating layer 102. Needless to say, one of the insulating layer 102 and the bonding layer 114 can be formed over the supporting substrate 100. For example, the insulating layer 102 is formed of an insulating film of a single layer or two or more layers which is/are formed by a PECVD method, in a similar manner to the insulating layer 112. The bonding layer 104 can be formed in a similar manner to the bonding layer 114. In FIG. 6, a buffer layer 105 has a stacked structure of the insulating layer 102 and the bonding layer 104.

Figure 2:
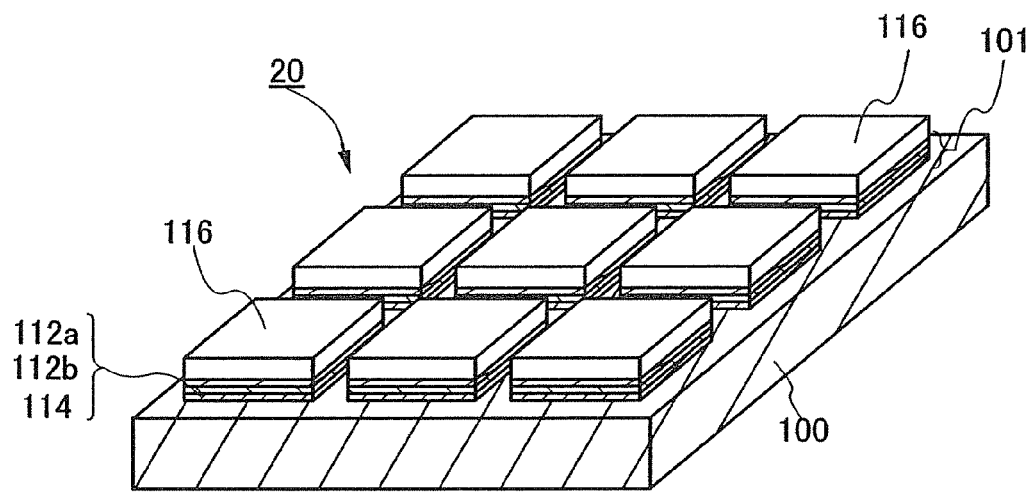
FIG. 2 is an external view which shows an example of a structure of a single crystal semiconductor substrate.

Note that, by using the method of this embodiment mode, a plurality of single crystal semiconductor layers 116 can also be attached to one piece of the supporting substrate 100. A plurality of single crystal semiconductor substrates 110 each having the structure of FIG. 4C is attached to the supporting substrate 100. Then, through the steps of FIG. 4E to FIGS. 5A and 5B, it is possible to manufacture a semiconductor substrate 20 including the supporting substrate 100 to which a plurality of single crystal semiconductor layers 116 is attached as shown in FIG. 2.

In order to manufacture the semiconductor substrate 20, it is preferable that a glass substrate of 300 mm×300 mm or larger be used as the supporting substrate 100. As a large-area glass substrate, a mother glass substrate which is developed for production of liquid crystal panels is preferred. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like.

By the use of a large-area substrate like a mother glass substrate as the supporting substrate 100, an SOI substrate having a larger area can be obtained. If an SOI substrate having a larger area can be obtained, a plurality of chips such as ICS or LSIs can be manufactured with one piece of SOI substrate and a larger number of chips can be manufactured with one piece of substrate. Accordingly, productivity can be drastically improved.

Embodiment Mode 2

In this embodiment mode, a laser irradiation apparatus which can be used in an irradiation step of the laser beam 122 of FIG. 5A is described.

The laser irradiation apparatus of this embodiment mode has a laser, an optical system through which a laser beam generated by the laser passes, a stage for arranging an object, a gas ejection portion that is arranged between the optical system and the stage and ejects a nitrogen gas, a gas supply apparatus for supplying a gas to the gas ejection portion, and a gas heating apparatus for heating a nitrogen gas supplied from the gas supply apparatus.

The gas ejection portion includes an opening where a nitrogen gas is sprayed, a window through which a laser beam passes, and a frame provided with a cavity to which a nitrogen gas passed through a gas heating means is supplied. The gas heating means includes a heating element formed of ceramic.

A laser beam with which an object on the stage is irradiated passes through the optical system, enters a gas irradiation portion, and passes through the window of the gas ejection portion, a cavity, and an opening. The gas ejection portion is arranged in this manner, and as shown in FIG. 5A, a region to which the nitrogen gas 124 is sprayed can be irradiated with the laser beam 122.

Figure 7:
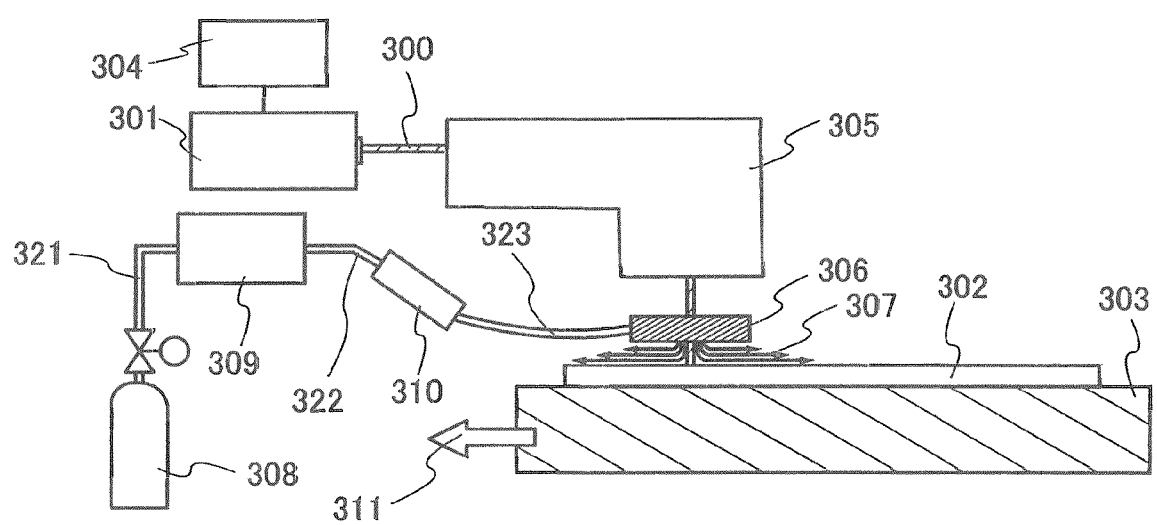
FIG. 7 is a diagram which shows an example of a structure of a laser irradiation apparatus.

The laser irradiation apparatus of this embodiment mode is described with reference to drawings. FIG. 7 is a drawing that illustrates an example of a structure of a laser irradiation apparatus hereinafter.

The laser irradiation apparatus includes a laser 301 that emits a laser beam 300 and a stage 303 for arranging an object 302. A controller 304 is connected to the laser 301. By the control of the controller 304, energy of the laser beam 300 emitted from the laser 301, repetition rate, or the like can be changed. The stage 303 is provided with a heating device such as a resistance heating apparatus or the like, and the object 302 can be heated.

An optical system 305 including a lens, a mirror, or the like is arranged between the laser 301 and the stage 303. By the optical system 305, the energy distribution of the laser beam 300 emitted from the laser 301 is homogenized and the cross section of the laser beam 300 is formed into a linear shape. The laser beam 300 passed through the optical system 305 passes through a gas ejection portion 306 and is delivered to the object 302 fixed to the stage 303.

The gas ejection portion 306 is a box-like member for spraying a nitrogen gas 307 to the object 302. In other words, the gas ejection portion 306 is a plate-like member having a cavity inside thereof.

The laser irradiation apparatus includes a gas storage device 308 for storing the nitrogen gas 307 such as a cylinder or the like, a gas supply apparatus 309 for supplying the nitrogen gas 307 to the gas ejection portion 306 from the gas storage device 308, and a gas heating apparatus 310 for heating the nitrogen gas 307. The gas storage device 308 is coupled with the gas supply apparatus 309 using a tube 321. The gas heating apparatus 310 is coupled with the gas supply apparatus 309 using a tube 322 on an upstream side and with the gas ejection portion 306 using a tube 323 on a downstream side.

The nitrogen gas 307 stored in the gas storage device 308 is supplied to the gas heating apparatus 310 by the gas supply apparatus 309. The nitrogen gas 307 is heated when passing through the gas heating apparatus 310, and the heated nitrogen gas 307 is supplied to the gas ejection portion 306 and sprayed on the object 302.

Figure 8:
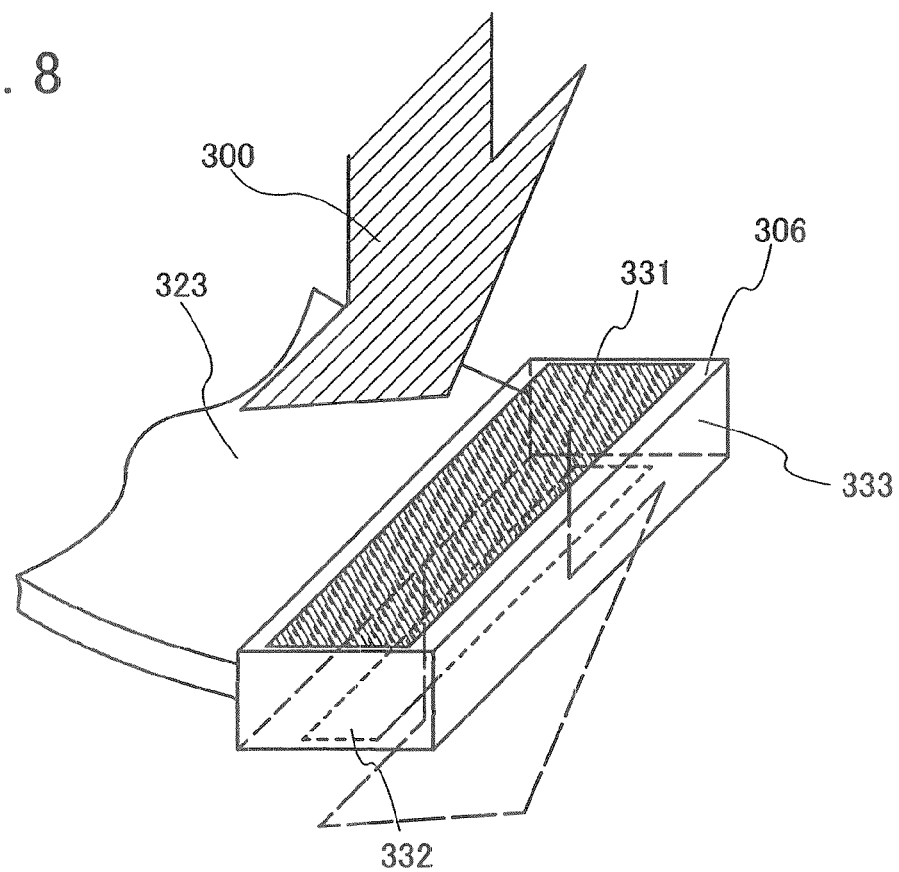
FIG. 8 is an external view which shows an example of a structure of a gas ejection portion.
Figure 9:
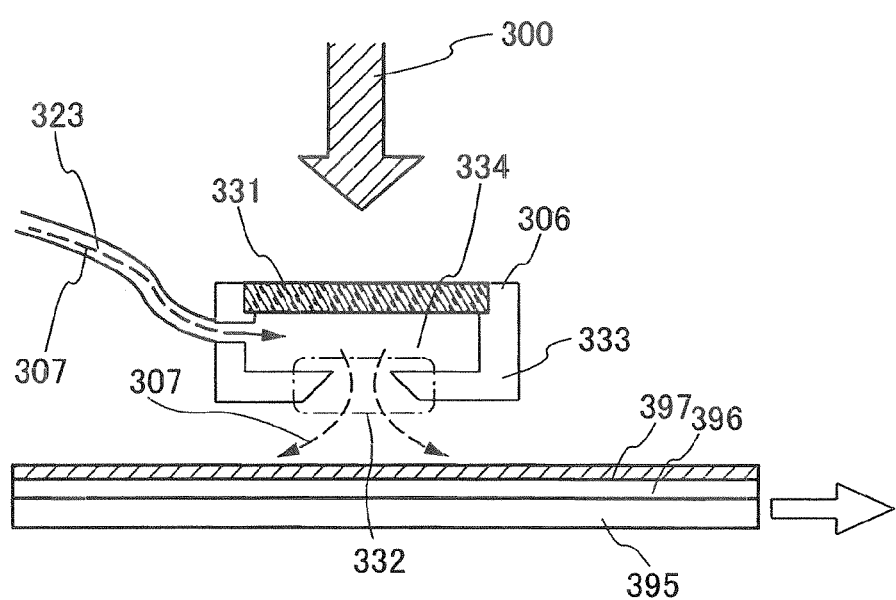
FIG. 9 is a cross-sectional view which shows an example of a structure of a gas ejection portion.

FIG. 8 is a drawing that illustrates an example of a structure of the gas ejection portion 306, and the appearance is illustrated. FIG. 9 is a cross-sectional view that illustrates an internal structure of the gas ejection portion 306 of FIG. 8.

The gas ejection portion 306 is a plate-like member and formed of a frame 333 in which a window 331 through which the laser beam 300 passes is provided on an upper surface and an opening 332 is formed on a surface facing the window 331. The tube 323 through which the nitrogen gas 307 passes is coupled with the frame 333. The nitrogen gas 307 which has passed through the gas heating apparatus 310 is supplied to a cavity 334 surrounded by the frame 333 and the window. This nitrogen gas 307 is ejected from the opening 332 and sprayed on the object. The nitrogen gas 307 is ejected, whereby the gas ejection portion 306 is floated from the upper surface of the object (see FIG. 7). In FIG. 9, as the object, a buffer layer 396 and a single crystal semiconductor layer 397 are illustrated over a non-alkali glass substrate 395.

The opening 332 of the gas ejection portion 306 has not only a function of an outlet of the nitrogen gas 307 but also a function of a slit through which the laser beam 300 passes. With such a structure, a region of the object 302, which is irradiated with the laser beam 300, is a region to which the nitrogen gas 307 is sprayed.

The window 331 may transmit the laser beam 300 and can be formed of a material having high heat resistance that can withstand the intensity of a laser beam to be used, for example, a quartz plate. The frame 333 can be formed of ceramic or the like, for example.

Next, a structure of the gas heating apparatus 310 is described. For example, the structure includes a heater that heats the tube 323 through which the nitrogen gas 307 passes and a controller that controls the heater, and the heater generates heat by the control of the controller to heat the tube 323. The nitrogen gas 307 passes through the heated tube 323, whereby the nitrogen gas 307 is heated. Alternatively, the nitrogen gas 307 and the heating element are in contact with each other, whereby the nitrogen gas 307 can be heated. A nitrogen gas is sprayed on the heating element and a heated gas at a sufficiently high temperature is used so that a single crystal semiconductor layer is heated at a temperature of 400° C. or higher and a strain point (760° C.) or lower of a non-alkali glass substrate, preferably, a temperature of 450° C. or higher and 650° C. or lower; therefore, a material which can withstand even in contact with the gas, for example, ceramic or the like can be used for the heating element.

Figure 10:
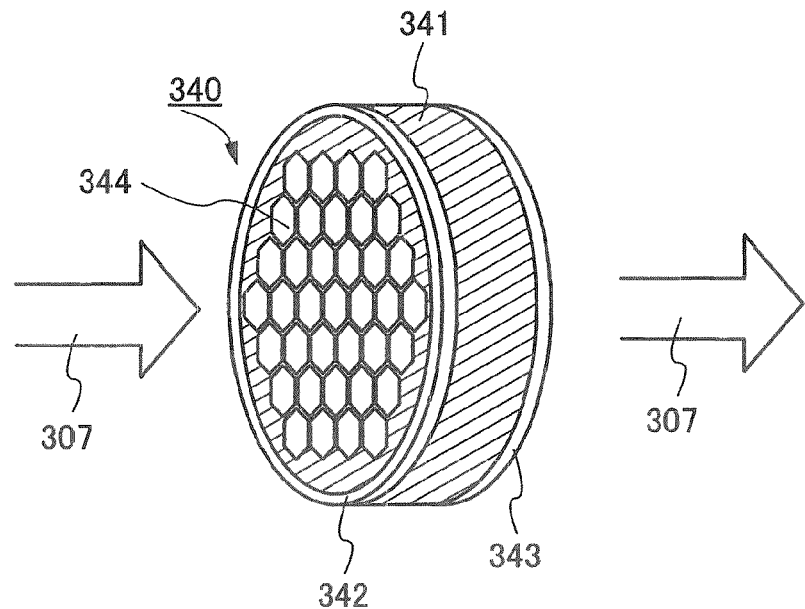
FIG. 10 is an external view which shows an example of a structure of a ceramic heater.

It is preferable that the gas heating apparatus 310 be provided with a thermistor that includes ceramic having a positive temperature coefficient (PTC) to prevent excessive heating of the nitrogen gas 307. This is because there is an advantage that excessive heating can be prevented since ceramic generates heat at a temperature of a Curie-point or higher by having a PCT so that resistance of ceramic is rapidly increased. In FIG. 10, an example of a structure of a ceramic thermistor is shown. A ceramic heater 340 of FIG. 10 includes a heating element 341 formed of ceramic having a PTC property and a pair of electrodes 342 and 343 provided at an end of the heating element 341. The heating element 341 has a honeycomb structure including a plurality of pores 344. Note that, in FIG. 10, although the shape of the pore 344 of the heating element 341 is hexagon, the shape of the pore 344 is not limited to hexagon, and can be a given shape such as circular, quadrangular, indeterminate.

The ceramic thermistor is arranged so that the heated nitrogen gas 307 flows through the pore 344 of the ceramic thermistor. The heater element 341 is heated by the heated nitrogen gas 307. Voltage between the electrodes 342 and 343 is monitored. Variation of a resistor value of the heater element is detected from a voltage value between the electrodes 342 and 343, and the temperature of the heater element 341 is found from the resistance value. Therefore, the temperature of the nitrogen gas 307 can be monitored by the ceramic thermistor. For example, when the temperature of the heater element 341 is detected to be a predetermined temperature or higher by the ceramic thermistor, the heater for heating the nitrogen gas 307 is controlled and the operation is stopped. In addition, the output is suppressed, whereby the nitrogen gas 307 is prevented from being overheated.

Figure 11:
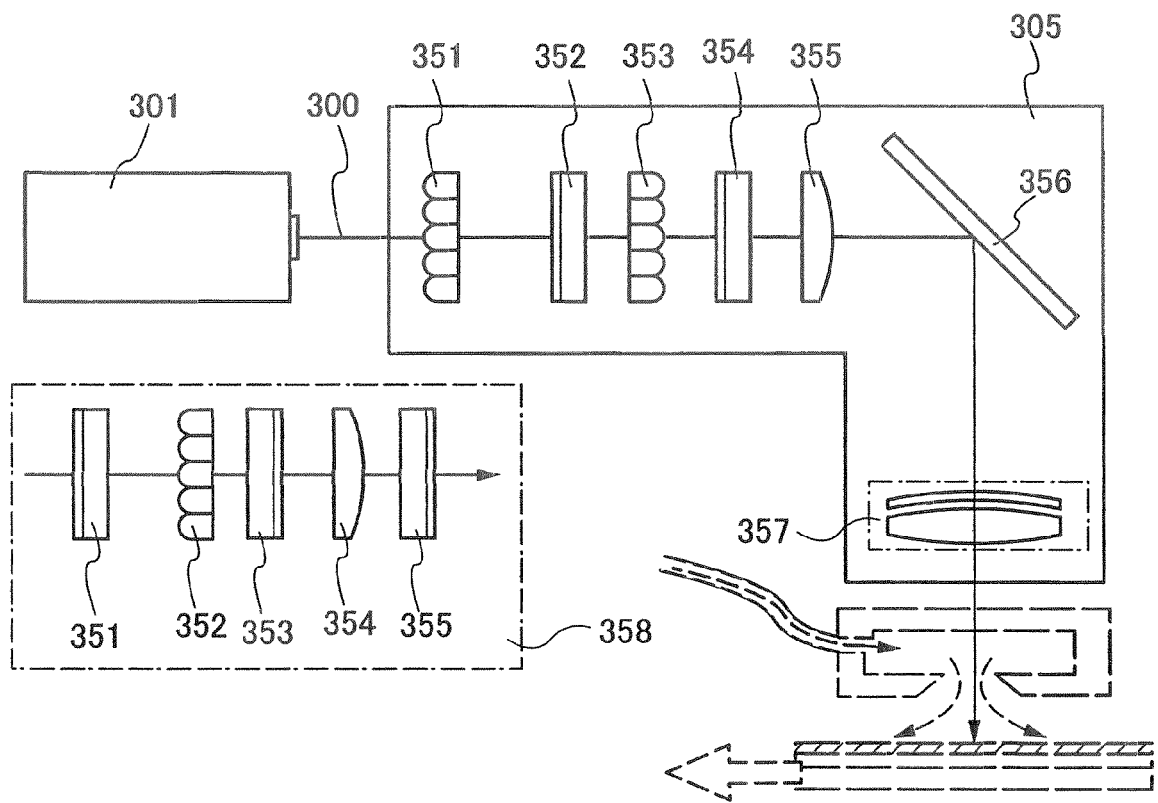
FIG. 11 is a diagram which shows an example of a structure of an optical system of a laser irradiation apparatus.

An example of a structure of the optical system 305 is shown in FIG. 11. The optical system 305 shown in FIG. 11 is an optical system for processing a cross section of the laser beam 300 into linear and for making the energy distribution uniform.

In the optical system 305, a cylindrical lens array 351, a cylindrical lens array 352, a cylindrical lens array 353, a cylindrical lens 354, a cylindrical lens 355, a mirror 356, and a doublet cylindrical lens 357 are arranged from the laser 301 side. Note that a drawing surrounded by a dashed line is a partial drawing of the optical system 305 and is a plan view in which each optical element of from the cylindrical lens array 351 to the cylindrical lens 355 is rotated by 90° around an optical path.

The laser beam 300 which enters the optical system 305 passes through the cylindrical lens array 351, the cylindrical lens array 352, and the cylindrical lens array 353, whereby an energy profile in a width direction of the laser beam 300 varies from a Gaussian distribution to a rectangle shape. By passing through the cylindrical lenses 354 and 355, a beam length in a length direction of a linear beam is lengthened and converged in a width direction. The laser beam 300 is reflected by the mirror 356. The laser beam 300 is converged in a width direction of the laser beam by the doublet cylindrical lens 357. As a result, a linear laser beam enters the gas ejection portion 306.

Note that the atmosphere around a part of the semiconductor film that is to be irradiated with a laser beam may be separated from the atmosphere of the optical system 305 by surrounding the optical system 305 with a partition and providing a quartz window for transmitting the laser beam. For example, in this embodiment mode, by purging nitrogen from the optical system 305, the deterioration of the optical system can be suppressed.

Next, by the laser irradiation apparatus of FIG. 7, a method for irradiating the single crystal semiconductor layer 115 with the laser beam 122 of FIG. 5A is described. Here, a high-purity nitrogen gas is sprayed as the nitrogen gas 124. FIG. 5A corresponds to an enlarged view of a part of FIG. 7, and for example, the supporting substrate 100 to which the single crystal semiconductor layer 115 is attached corresponds to the object 302.

First, the supporting substrate 100 to which the single crystal semiconductor layer 115 of FIG. 5A is attached is arranged over the stage 303. A nitrogen gas which is stored in the gas storage device 308 is supplied to the gas ejection portion 306 by the gas supply apparatus 309. In the gas supply apparatus 309, a flow rate of the nitrogen gas and pressure are adjusted, and the nitrogen gas is supplied so that the gas ejection portion 306 is floated. The nitrogen gas passes through the gas heating apparatus 310 and is heated to be supplied to the gas ejection portion 306.

The laser beam 300 emitted from the laser 301 is made into a linear beam whose cross section is linear by the optical system 305. In FIG. 7, a direction that is perpendicular to paper is a length direction of the linear laser beam 300.

The laser beam 300 processed into a linear shape passes through the gas ejection portion 306 and is delivered to the separation plane of the single crystal semiconductor layer 115. Along an arrow 311 of FIG. 7, while the stage 303 is being moved and the heated nitrogen gas is sprayed on the single crystal semiconductor layer 115, the laser beam 300 is emitted. A direction of the arrow 311 is a width direction of the linear laser beam 300.

By this embodiment mode, even when a substrate having low heat resistance is used as a supporting substrate, a laser irradiation apparatus which can be used for planarization of the surface of a semiconductor layer separated from a semiconductor substrate can be provided.

The laser irradiation apparatus of this embodiment mode can control a laser irradiation atmosphere without use of a chamber for isolating the stage 303 from the atmosphere. Accordingly, a laser irradiation apparatus can be downsized and inexpensive, and maintenance and operation cost of the apparatus can be suppressed.

Embodiment Mode 3

As an example of a manufacturing method of a semiconductor device using the semiconductor substrate 10, a manufacturing method of thin film transistors (TFTs) will be described in this embodiment mode, with reference to cross-sectional views of FIGS. 12A to 12D, FIGS. 13A to 13C, and FIG. 14. By combining a plurality of thin film transistors, a variety of types of semiconductor devices are manufactured. In this embodiment mode, an n-channel TFT and a p-channel TFT can be manufactured at the same time.

Figure 12A:
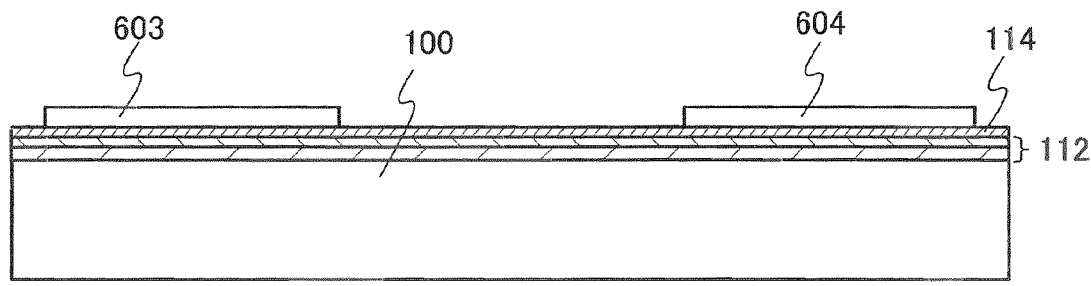
FIGS. 12A to 12D are cross-sectional views which illustrate a method for manufacturing a semiconductor device.

As illustrated in FIG. 12A, the single crystal semiconductor layer 116 over the supporting substrate 100 is processed (patterned) into a desired shape by etching, so that a semiconductor film 603 and a semiconductor film 604 are formed. A p-channel transistor is formed using the semiconductor film 603, and an n-channel transistor is formed using the semiconductor film 604.

To control threshold voltages, a p-type impurity element such as boron, aluminum, or gallium or an n-type impurity element such as phosphorus or arsenic may be added to the semiconductor film 603 and the semiconductor film 604. For example, in the case of adding boron as an impurity element imparting p-type conductivity, boron may be added at a concentration of $5 \times 10^{16}$ cm$^{-3}$ or more and $1 \times 10^{17}$ cm$^{-3}$ or less. The addition of the impurity element for controlling the threshold voltages may be performed on the single crystal semiconductor layer 116 or on the semiconductor film 603 and the semiconductor film 604. Alternatively, the addition of the impurity element for controlling the threshold voltages may be performed on the single crystal semiconductor substrate 110. Further alternatively, the addition of the impurity element may be performed on the single crystal semiconductor substrate 110 for roughly adjusting the threshold voltages, and then the addition of the impurity element may be further performed on the single crystal semiconductor layer 116 or on the semiconductor film 603 and the semiconductor film 604 for finely adjusting the threshold voltages.

For example, taking as an example the case of using weak p-type single crystal silicon substrate as the single crystal semiconductor substrate 110, an example of a method for adding such an impurity element is described. First, before etching the single crystal semiconductor layer 116, boron is added to the entire single crystal semiconductor layer 116. This addition of boron aims at adjusting the threshold voltage of a p-channel transistor. Using $B_2H_6$ as a dopant gas, boron is added at a concentration of $1\times10^{16}/cm^3$ to $1\times10^{17}/cm^3$. The concentration of boron is determined in consideration of the activation rate or the like. For example, the concentration of boron can be $6\times10^{16}/cm^3$. Next, the single crystal semiconductor layer 116 is etched to form the semiconductor film 603 and the semiconductor film 604. Then, boron is added to only the semiconductor film 604. The second addition of boron aims at adjusting the threshold voltage of an n-channel transistor. Using $B_2H_6$ as a dopant gas, boron is added at a concentration of $1\times10^{16}/cm^3$ to $1\times10^{17}/cm^3$. For example, the concentration of boron can be $6\times10^{16}/cm^3$.

Note that in the case where a substrate having a conductivity type or resistance suitable for the threshold voltage of either of the p-channel transistor or the n-channel transistor can be used as the single crystal semiconductor substrate 110, the required number of steps for adding an impurity element for controlling the threshold voltage can be one; at that time, an impurity element for controlling the threshold voltage may be added to one of the semiconductor film 603 and the semiconductor film 604.

Figure 12B:
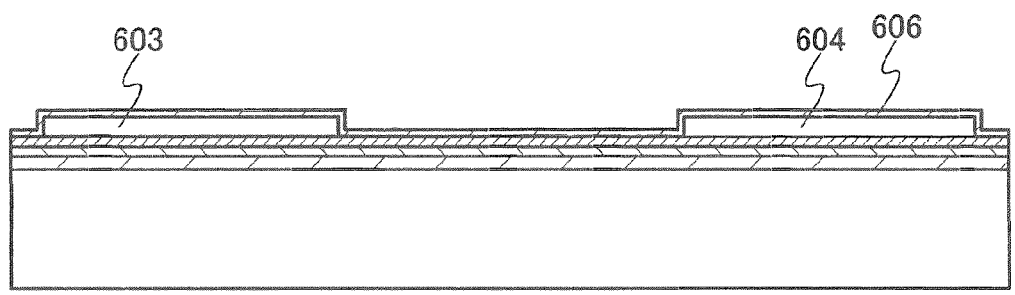

As illustrated in FIG. 12B, a gate insulating film 606 is formed to cover the semiconductor film 603 and the semiconductor film 604. The gate insulating film 606 may be formed with a single layer or a stack of a film including silicon oxide, silicon nitride oxide, silicon nitride, hafnium oxide, aluminum oxide, or tantalum oxide, by a PECVD method, a sputtering method, or the like. In this embodiment mode, the gate insulating film 606 can be formed in such a way that a thin film having a thickness of, for example, 20 nm covers the surfaces of the semiconductor film 603 and the semiconductor film 604 by a PECVD method. In addition, the gate insulating film 606 may be formed by oxidizing or nitriding surfaces of the semiconductor film 603 and the semiconductor film 604 by high-density plasma treatment. The high-density plasma treatment is performed using, for example, a mixed gas of a noble gas such as He, Ar, Kr, or Xe and oxygen, nitrogen oxide, ammonia, nitrogen, hydrogen, or the like. In this case, when excitation of the plasma is performed by introduction of a microwave, high density plasma with a low electron temperature can be generated. The surfaces of the semiconductor films are oxidized or nitrided by oxygen radicals (OH radicals may be included) or nitrogen radicals (NH radicals may be included) which are generated by such high-density plasma, whereby insulating films are formed to a thickness of 1 nm to 50 nm, preferably 5 nm to 30 nm so as to be in contact with the semiconductor films. Laser irradiation is performed while heating is being performed, whereby the surface of the single crystal semiconductor layer is sufficiently planarized. Therefore, even when an insulating film having a thickness of 20 nm is used as the gate insulating film 606, sufficient gate withstand voltage can be obtained.

Alternatively, the gate insulating film 606 may be formed by thermally oxidizing the semiconductor films 603 and 604.

Further alternatively, after the gate insulating film 606 containing hydrogen is formed, hydrogen contained in the gate insulating film 606 may be diffused into the semiconductor film 603 and the semiconductor film 604 by performing heat treatment at a temperature of 350° C. or higher and 450° C. or lower. In this case, the gate insulating film 606 can be formed by depositing silicon nitride or silicon nitride oxide at a process temperature of 350° C. or lower by a PECVD method. Hydrogen is supplied to the semiconductor film 603 and the semiconductor film 604, whereby a crystal defect to serve as a charge trapping center can be reduced effectively in the semiconductor film 603 and the semiconductor film 604 and at an interface between the gate insulating film 606 and the semiconductor film 603 and the semiconductor film 604.

Figure 12C:
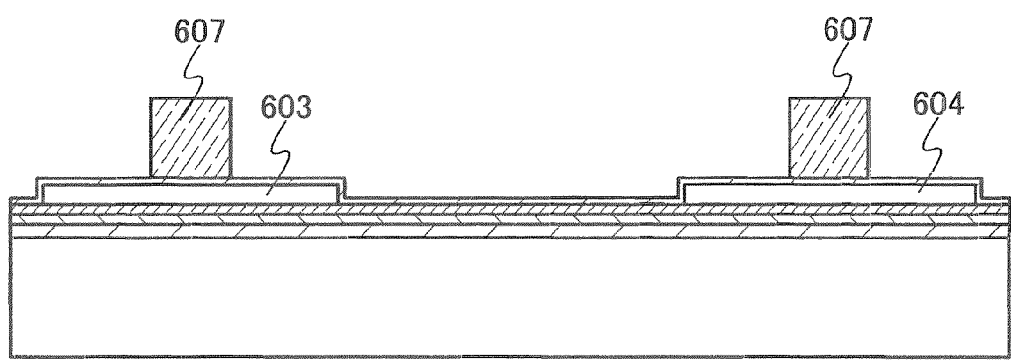

Then, after forming a conductive film over the gate insulating film 606 as illustrated in FIG. 12C, the conductive film is processed (patterned) into a predetermined shape, thereby forming an electrode 607 over each of the semiconductor film 603 and the semiconductor film 604. The conductive film can be formed by a CVD method, a sputtering method, or the like. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing the above-described metal as a main component or a compound containing the above-described metal can also be used. Further alternatively, the conductive film may be formed using a semiconductor such as polycrystalline silicon which is formed by addition of an impurity element imparting a conductivity type, such as phosphorus, to a semiconductor film.

As a combination of two conductive films, tantalum nitride or tantalum (Ta) can be used for a first layer, and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as a combination of the two conductive films, for example, silicon doped with an impurity imparting n-type conductivity and nickel silicide, Si doped with an impurity imparting n-type conductivity and $WSi_x$, or the like can be used.

In addition, although each of the electrodes 607 is formed of a single-layer conductive film in this embodiment mode, this embodiment mode is not limited to this structure. The electrodes 607 may be formed by stacking plural conductive films. In the case of a three-layer structure in which three or more conductive films are stacked, a stacked structure of a molybdenum film, an aluminum film, and a molybdenum film may be employed.

As masks used for forming the electrodes 607, instead of resist, silicon oxide, silicon nitride oxide, or the like may be used. Although, in this case, a step of etching silicon oxide, silicon nitride oxide, or the like is added, the reduction in film thickness of the masks at the time of etching is less than that in the case of using a resist mask; accordingly, the electrodes 607 each having a desired width can be formed. Alternatively, the electrodes 607 may be formed selectively by a droplet discharge method without using the masks.

Note that a droplet discharge method means a method in which droplets containing a predetermined composition are discharged or ejected from fine pores to form a predetermined pattern, and includes an ink-jet method and the like.

After forming the conductive film, the conductive film is etched by an inductively coupled plasma (ICP) etching method to form the electrodes 607. The conductive film can be etched into a desired tapered shape by appropriately controlling the etching condition (e.g., the amount of electric power applied to a coiled electrode layer, the amount of electric power applied to an electrode layer on the substrate side, or the electrode temperature on the substrate side). Further, angles and the like of the taper shapes can also be controlled by the shape of the masks. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 12D:
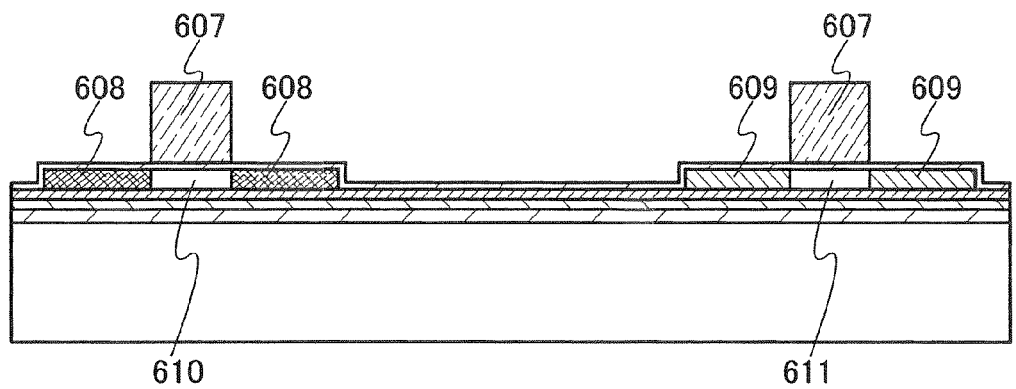

Next, as illustrated in FIG. 12D, an impurity element imparting one conductivity type is added to the semiconductor film 603 and the semiconductor film 604 with use of the electrodes 607 as masks. In this embodiment mode, an impurity element imparting p-type conductivity (e.g., boron) is added to the semiconductor film 603, and an impurity element imparting n-type conductivity (e.g., phosphorus or arsenic) is added to the semiconductor film 604. In this step, impurity regions to be a source region and a drain region are formed in the semiconductor film 603, and impurity regions serving as high-resistant regions are formed in the semiconductor film 604.

Note that when the impurity element imparting p-type conductivity is added to the semiconductor film 603, the semiconductor film 604 is covered with a mask or the like so that the impurity element imparting p-type conductivity is not added to the semiconductor film 604. On the other hand, when the impurity element imparting n-type conductivity is added to the semiconductor film 604, the semiconductor film 603 is covered with a mask or the like so that the impurity element imparting n-type conductivity is not added to the semiconductor film 603. Alternatively, after adding an impurity element imparting one of p-type and n-type conductivity to the semiconductor film 603 and the semiconductor film 604, an impurity element imparting the other conductivity may be added to one of the semiconductor film 603 and the semiconductor film 604 selectively at higher concentration than the previously added impurity element. By this adding step of impurity element, p-type high-concentration impurity regions 608 are formed in the semiconductor film 603, and n-type low-concentration impurity regions 609 are formed in the semiconductor film 604. The regions overlapped with the electrodes 607 in the semiconductor film 603 and the semiconductor film 604 are a channel formation region 610 and a channel formation region 611.

Figure 13A:
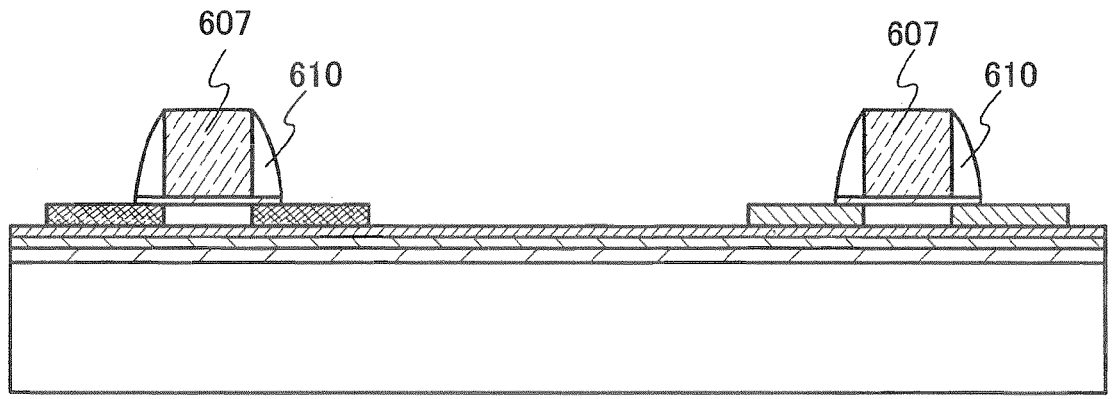
FIGS. 13A to 13C are cross-sectional views which illustrate a method for manufacturing a semiconductor device.

Next, as illustrated in FIG. 13A, sidewalls 612 are formed on side surfaces of the electrodes 607. For example, the sidewalls 612 can be formed in such a manner that an insulating film is newly formed so as to cover the gate insulating film 606 and the electrodes 607, and the newly-formed insulating film is partially etched by anisotropic etching in which etching is performed mainly in a perpendicular direction. The newly-formed insulating film is partially etched by the above-described anisotropic etching, whereby the sidewalls 612 are formed on the side surfaces of the electrodes 607. Note that the gate insulating film 606 is also partially etched by this anisotropic etching. The insulating film for forming the sidewalls 612 can be formed as a single layer or a stack of two or more layers of a film including an organic material such as an organic resin or a film of silicon, silicon oxide, or silicon nitride oxide by a PECVD method, a sputtering method, or the like. In this embodiment mode, the insulating film is formed of a silicon oxide film with a thickness of 100 nm by a PECVD method. In addition, as an etching gas of the silicon oxide film, a mixed gas of $CHF_3$ and helium can be used. Note that the steps for formation of the sidewalls 612 are not limited to the steps given here.

Figure 13B:
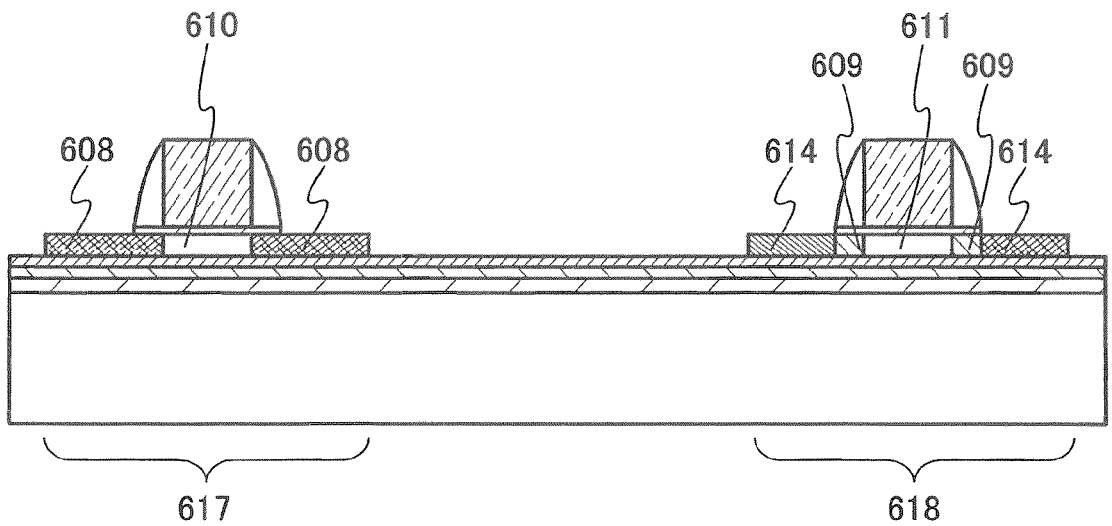

As illustrated in FIG. 13B, an impurity element imparting n-type conductivity is added to the semiconductor film 604 by using the electrode 607 and the sidewalls 612 as masks. This step is a step for forming impurity regions serving as a source region and a drain region in the semiconductor film 604. In this step, the impurity element imparting n-type conductivity is added to the semiconductor film 604 while the semiconductor film 603 is covered with a mask or the like.

In the above-described addition of the impurity element, the electrode 607 and the sidewalls 612 serve as masks; accordingly, a pair of n-type high-concentration impurity regions 614 are formed in the semiconductor film 604 in a self-alignment manner. Then, the mask covering the semiconductor film 603 is removed, and heat treatment is performed to activate the impurity element imparting p-type conductivity added to the semiconductor film 603 and the impurity element imparting n-type conductivity added to the semiconductor film 604. Through the sequence of the steps illustrated in FIGS. 12A to 12D, and FIGS. 13A and 13B, a p-channel transistor 617 and an n-channel transistor 618 are formed.

In order to reduce the resistance of the source and drain, a silicide layer may be formed by siliciding the high-concentration impurity regions 608 in the semiconductor film 603 and the high-concentration impurity regions 614 in the semiconductor film 604. The siliciding is performed by placing a metal in contact with the semiconductor film 603 and the semiconductor film 604 and causing reaction between the metal and silicon in the semiconductor films through heat treatment; in this manner, a silicide compound is generated. As the metal, cobalt or nickel is preferable, or the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the semiconductor film 603 and the semiconductor film 604 are thin, the silicide reaction may proceed to the bottom of the semiconductor film 603 and the semiconductor film 604 in this region. As the heat treatment for forming a silicide, a resistance heating furnace, an RTA apparatus, a microwave heating apparatus, or a laser irradiation apparatus can be used.

Figure 13C:
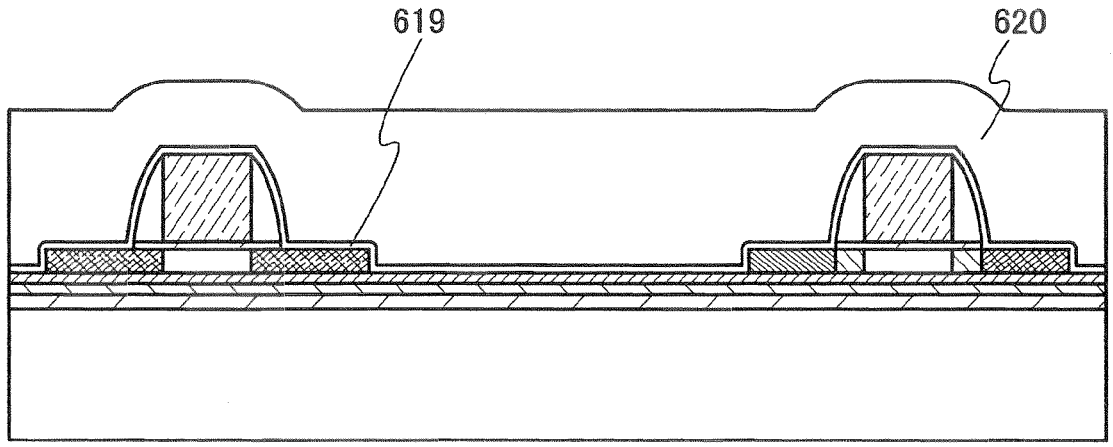

Next, as illustrated in FIG. 13C, an insulating film 619 is formed to cover the transistor 617 and the transistor 618. As the insulating film 619, an insulating film containing hydrogen is formed. In this embodiment mode, a silicon nitride oxide film with a thickness of approximately 600 nm is formed by a PECVD method using monosilane, ammonia, and $N_2O$ as a source gas. The insulating film 619 is made to contain hydrogen because hydrogen can be diffused from the insulating film 619 so that dangling bonds in the semiconductor film 603 and the semiconductor film 604 can be terminated. The formation of the insulating film 619 can prevent impurities such as an alkali metal and an alkaline earth metal from entering the transistor 617 and the transistor 618. Specifically, silicon nitride, silicon nitride oxide, aluminum nitride, aluminum oxide, silicon oxide, or the like is used for the insulating film 619.

Next, an insulating film 620 is formed over the insulating film 619 so as to cover the transistor 617 and the transistor 618. An organic material having heat resistance, such as polyimide, acrylic, benzocyclobutene, polyamide, or epoxy can be used for the insulating film 620. In addition to such organic materials, it is also possible to use a low-dielectric constant material (a low-k material), a siloxane resin, silicon oxide, silicon nitride, silicon nitride oxide, phosphosilicate glass (PSG), borophosphosilicate glass (BPSG), alumina, or the like. A siloxane-based resin may include as a substituent at least one of fluorine, an alkyl group, and an aryl group, as well as hydrogen. Alternatively, the insulating film 620 may be formed by stacking plural insulating films formed of these materials.

Note that the siloxane-based resin corresponds to a resin including a Si—O—Si bond formed using a siloxane-based material as a starting material. The siloxane-based resin may include as a substituent at least one of fluorine, an alkyl group, and aromatic hydrocarbon, as well as hydrogen.

For the formation of the insulating film 620, the following method can be used depending on the material of the insulating film 620: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like.

Next, heat treatment at approximately 400° C. to 450° C. (e.g., 410° C.) is performed in a nitrogen atmosphere for 1 hour, so that hydrogen is made to diffuse from the insulating film 619 and dangling bonds in the semiconductor film 603 and the semiconductor film 604 are terminated with hydrogen. Since the single crystal semiconductor layer 116 has a much lower defect density than a polycrystalline silicon film which is formed by crystallizing an amorphous silicon film, this termination treatment with hydrogen can be performed in short time.

Figure 14:
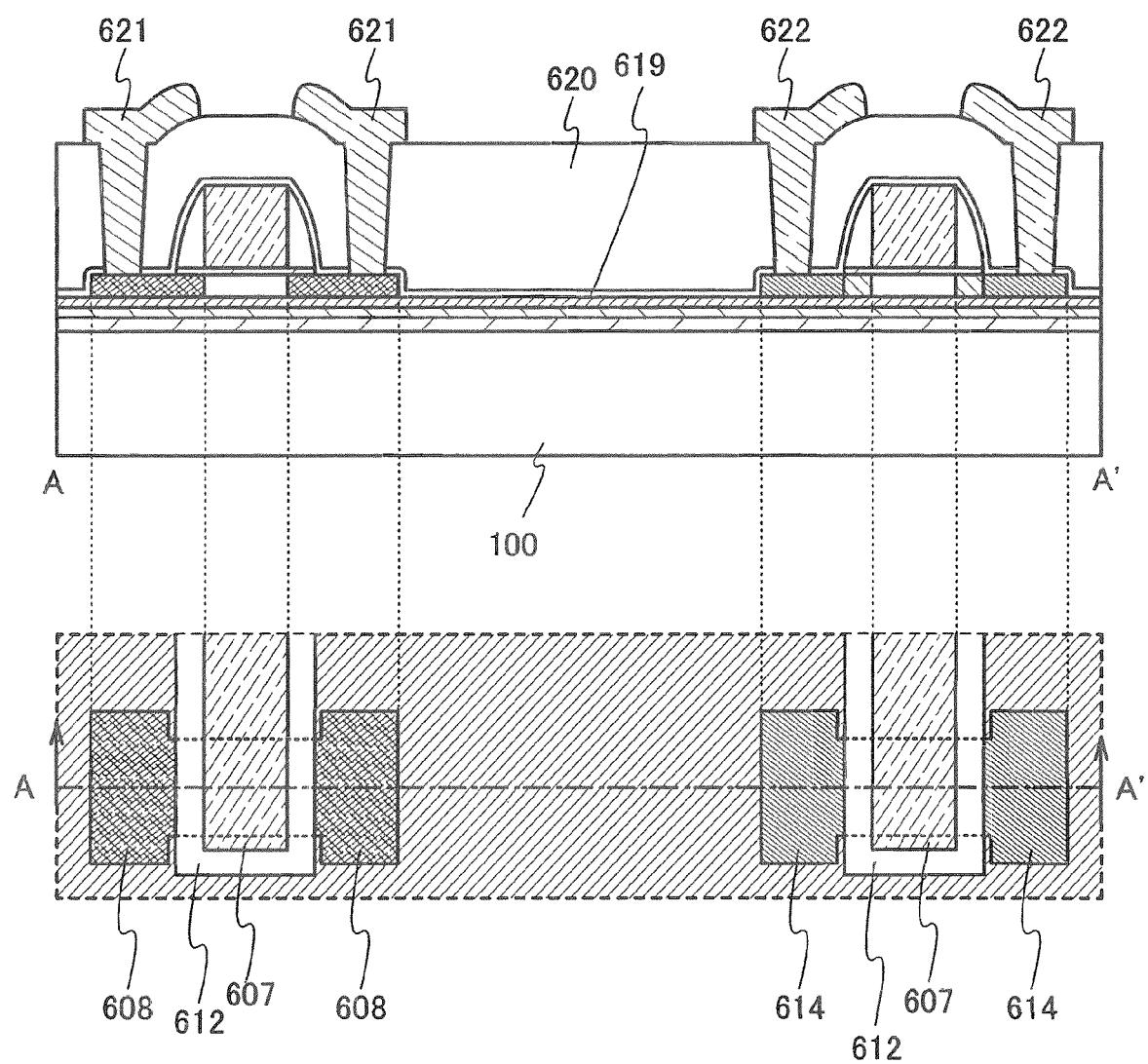
FIG. 14 is a cross-sectional view which illustrates a method for manufacturing a semiconductor device.

Next, as illustrated in FIG. 14, contact holes are formed in the insulating film 619 and the insulating film 620 so that the semiconductor film 603 and the semiconductor film 604 are partially exposed. The formation of the contact holes can be performed by a dry etching method using a mixed gas of $CHF_3$ and He; however, the present invention is not limited to this. Then, conductive films 621 and conductive films 622 are formed to be in contact with the semiconductor film 603 and the semiconductor film 604, respectively through the contact holes. The conductive films 621 are connected to the high-concentration impurity regions 608 of the p-channel transistor 617. The conductive films 622 are connected to the high-concentration impurity regions 614 of the p-channel transistor 618.

The conductive films 621 and the conductive films 622 can be formed by a CVD method, a sputtering method, or the like. Specifically, the following can be used for the conductive films 621 and the conductive films 622: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 621 and the conductive films 622 can be formed of a single layer or a plurality of layers using a film formed of the above-described metal.

As an example of an alloy containing aluminum as its main component, an alloy containing aluminum as its main component and also containing nickel is given. Further, an alloy which contains aluminum as its main component and contains nickel and one or both of carbon and silicon can also be given. Since aluminum and aluminum silicon have low resistance and are inexpensive, aluminum and aluminum silicon are suitable as materials for forming the conductive films 621 and the conductive films 622. In particular, when the shape of an aluminum silicon (Al—Si) film is processed by etching, generation of hillocks in resist baking for forming an etching mask can be prevented more than in the case where an aluminum film is used. Instead of silicon (Si), Cu may be mixed into an aluminum film at approximately 0.5%.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used as the conductive films 621 and the conductive films 622. Note that the barrier film refers to a film formed using titanium, nitride of titanium, molybdenum, or nitride of molybdenum. When barrier films are formed to sandwich an aluminum silicon (Al—Si) film therebetween, generation of hillocks of aluminum or aluminum silicon can be prevented more effectively. Moreover, when the barrier film is formed using titanium that is a highly-reducible element, even if a thin oxide film is formed over the semiconductor film 603 and the semiconductor film 604, the oxide film is reduced by the titanium contained in the barrier film, whereby preferable contact between the conductive films 621 and 622 and the semiconductor films 603 and 604 can be obtained. Further, it is also possible to stack a plurality of barrier films. In that case, for example, a five-layer structure in which titanium, titanium nitride, aluminum silicon, titanium, and titanium nitride are stacked from the lowest layer can be used as the conductive films 621 and the conductive films 622.

For the conductive films 621 and the conductive films 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and the conductive films 622.

In FIG. 14, a top view of the p-channel transistor 617 and the n-channel transistor 618 and a cross-sectional view taken along a line A-A' of the top view are illustrated. Note that the conductive films 621, the conductive films 622, the insulating film 619, and the insulating film 620 are omitted in the top view of FIG. 14.

Although the case where each of the p-channel transistor 617 and the n-channel transistor 618 has one electrode 607 functioning as a gate is described in this embodiment mode, the present invention is not limited to this structure. The transistor manufactured in the present invention may have a multi-gate structure in which a plurality of electrodes functioning as gates are included and electrically connected to one another. Moreover, the transistors may have a gate planar structure.

Note that since a semiconductor layer included in the semiconductor substrate of the present invention is a sliced layer of a single crystal semiconductor substrate, its orientation does not vary. Consequently, variation in electric characteristics such as threshold voltage and mobility of a plurality of transistors manufactured using a semiconductor substrate can be made to be small. Further, since there are almost no crystal grain boundaries, a leakage current due to a crystal grain boundary can be suppressed, as well as realize power saving of a semiconductor device. Accordingly, a highly reliable semiconductor device can be manufactured.

In the case of manufacturing a transistor from a polycrystalline semiconductor film obtained by laser crystallization, it has been necessary to decide a layout of the semiconductor film of the transistor taking into consideration a scanning direction of a laser beam, in order to obtain high mobility. However, there is no such need for the semiconductor substrate of the present invention, and there are little restrictions in designing a semiconductor device.

Embodiment Mode 4

Although Embodiment Mode 3 describes the method for manufacturing a TFT as an example of a method for manufacturing a semiconductor device, a semiconductor device can be manufactured so as to have high added value by forming a variety of semiconductor elements such as a capacitor and a resistor together with the TFT over a substrate provided with a semiconductor film. This embodiment mode will describe specific modes of semiconductor devices with reference to drawings.

Figure 15:
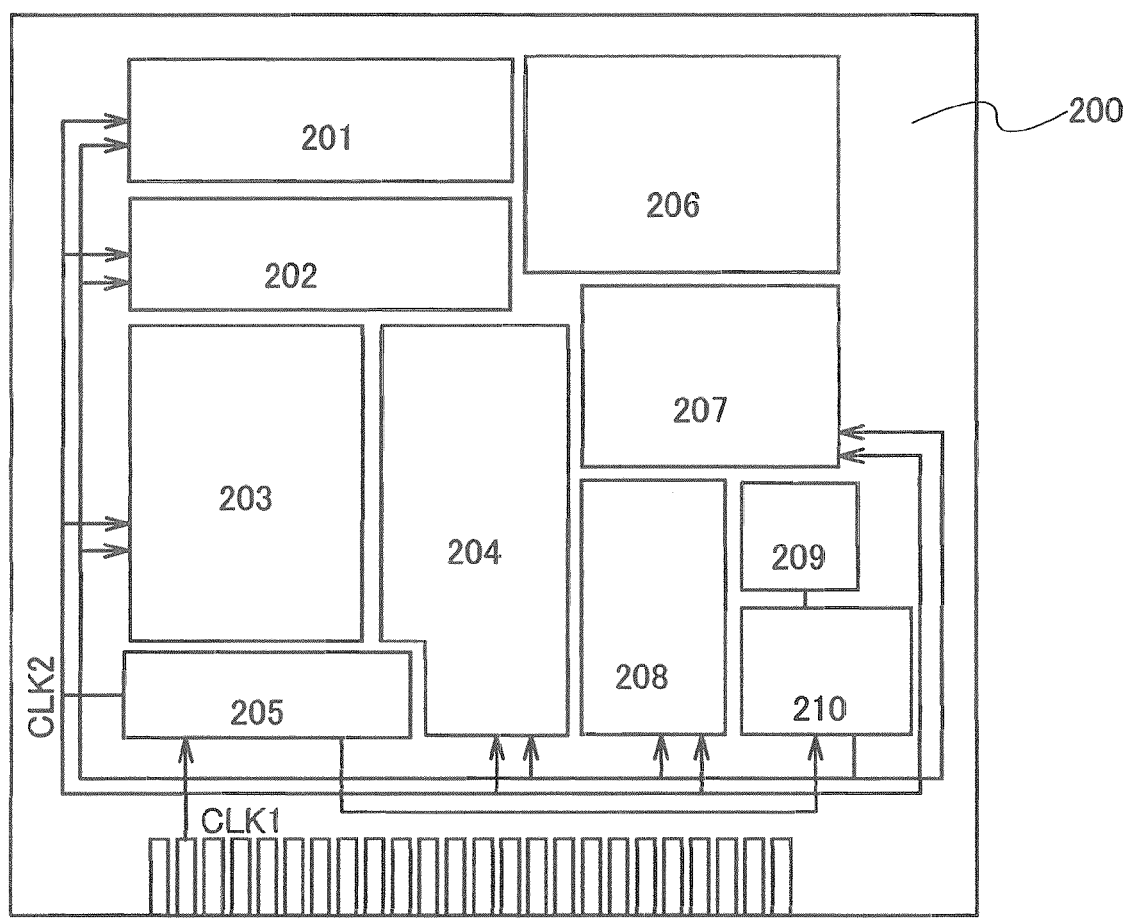
FIG. 15 is a block diagram which shows an example of a structure of a microprocessor.

First, as an example of a semiconductor device, a microprocessor will be described. FIG. 15 is a block diagram illustrating a structural example of a microprocessor 200.

The microprocessor 200 includes an arithmetic logic unit (ALU) 201, an ALU controller 202, an instruction decoder 203, an interrupt controller 204, a timing controller 205, a register 206, a register controller 207, a bus interface (bus I/F) 208, a read only memory (ROM) 209, and a memory interface (ROM interface) 210.

An instruction input to the microprocessor 200 via the bus interface 208 is input to the instruction decoder 203 and decoded, and then input to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates a signal for controlling an operation of the ALU 201. The interrupt controller 204 is a circuit that processes an interruption request from an external input/output device or a peripheral circuit during program execution of the microprocessor 200, and the interrupt controller 204 determines priority of the interruption request or a masked state and processes the interruption request. The register controller 207 generates an address of the register 206 and performs reading and writing from/to the register 206 depending on a state of the microprocessor 200. The timing controller 205 generates signals controlling timing of operation of the ALU 201, the ALU controller 202, the instruction decoder 203, the interrupt controller 204, and the register controller 207. For example, the timing controller 205 is provided with an internal clock generator that generates an internal clock signal CLK2 based on a reference clock signal CLK1. As illustrated in FIG. 15, the internal clock signal CLK2 is input to another circuit.

Figure 16:
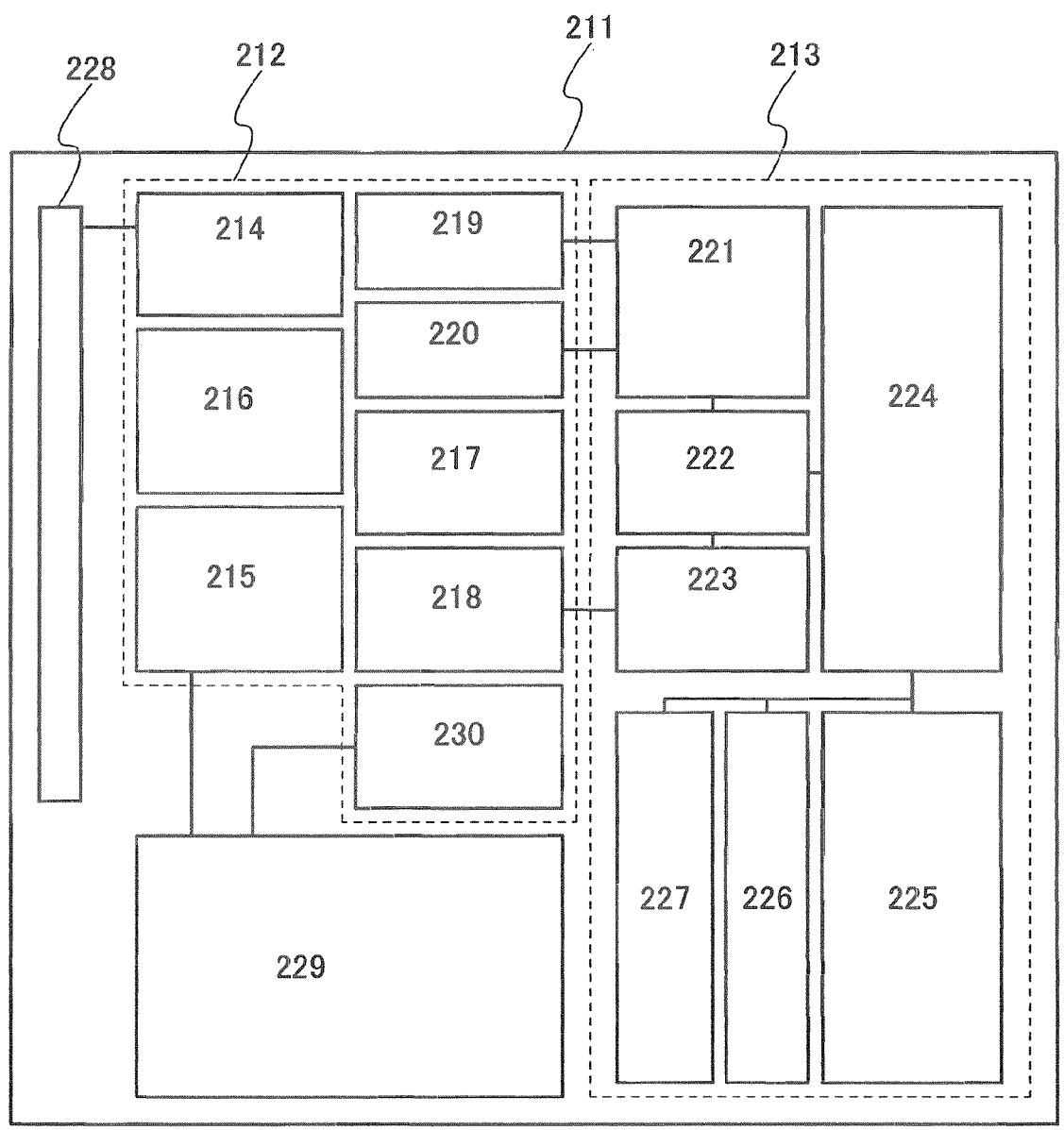
FIG. 16 is a block diagram which shows an example of a structure of an RFCPU.

Next, an example of a semiconductor device provided with a function for performing transmission/reception of data without contact and an arithmetic function are described. FIG. 16 is a block diagram illustrating a structural example of such a semiconductor device. A semiconductor device 211 illustrated in FIG. 16 functions as an arithmetic processing unit that operates by transmitting/receiving a signal to/from an external device through wireless communication.

As illustrated in FIG. 16, the semiconductor device 211 includes an analog circuit portion 212 and a digital circuit portion 213. The analog circuit portion 212 includes a resonance circuit 214 having a resonant capacitor, a rectification circuit 215, a constant-voltage circuit 216, a reset circuit 217, an oscillation circuit 218, a demodulation circuit 219, a modulation circuit 220, and a power supply management circuit 230. Further, the digital circuit portion 213 includes an RF interface 221, a control register 222, a clock controller 223, a CPU interface 224, a central processing unit (CPU) 225, a random access memory (RAM) 226, and a read only memory (ROM) 227.

A summary of the operation of the semiconductor device 211 is as follows. An induced electromotive force is generated in the resonance circuit 214 using a signal received by an antenna 228. The induced electromotive force passes through the rectification circuit 215 and is stored in a capacitor 229.

This capacitor 229 is preferably a capacitor such as a ceramic capacitor or an electric double layer capacitor. The capacitor 229 does not always have to be integrated with a substrate included in the semiconductor device 211, and it may be mounted to the semiconductor device 211 as a different component.

The reset circuit 217 generates a signal that resets and initializes the digital circuit portion 213. For example, a signal that rises up lagging behind a rise in power supply voltage is generated as a reset signal. The oscillation circuit 218 changes the frequency and duty ratio of a clock signal depending on a control signal generated in the constant-voltage circuit 216. The demodulation circuit 219 is a circuit that demodulates a reception signal, and the modulation circuit 220 is a circuit that modulates data to be transmitted.

For example, the demodulation circuit 219 is formed using a low-pass filter and binarizes an amplitude-modulated (ASK) received signal based on variation of amplitude. Since the modulation circuit 220 varies the amplitude of an amplitude-modulated (ASK) transmission signal and transmits the data, the modulation circuit 220 changes the amplitude of a communication signal by changing a resonance point of the resonance circuit 214.

The clock controller 223 generates a control signal for changing the frequency and duty ratio of a clock signal depending on power supply voltage or current consumption in the CPU 225. Monitoring of the power supply voltage is performed in the power supply management circuit 230.

A signal input to the semiconductor device 211 from the antenna 228 is demodulated in the demodulation circuit 219, and then separated into a control command, data, and the like in the RF interface 221. The control command is stored in the control register 222. In the control command, instructions for reading data that is stored in the ROM 227, writing data in the RAM 226, performing an arithmetic calculation in the CPU 225, and the like are included.

The CPU 225 accesses the ROM 227, the RAM 226, and the control register 222 via the interface 224. The interface 224 has a function of generating an access signal corresponding to any of the ROM 227, the RAM 226, and the control register 222, based on an address requested by the CPU 225.

As an arithmetic method of the CPU 225, a method may be employed in which an operating system (OS) is stored in the ROM 227 and a program is read and executed at the time of starting operation. Alternatively, a method may be employed in which a dedicated circuit is provided as an arithmetic circuit and an arithmetic process is performed using hardware. In a method of using both hardware and software, part of an arithmetic process is performed in a dedicated arithmetic circuit, and then the rest of the arithmetic process is performed using a program in the CPU 225.

Next, a display device is described as a structural example of a semiconductor device, with reference to FIGS. 17A and 17B, and FIGS. 18A and 18B.

Figure 17A:
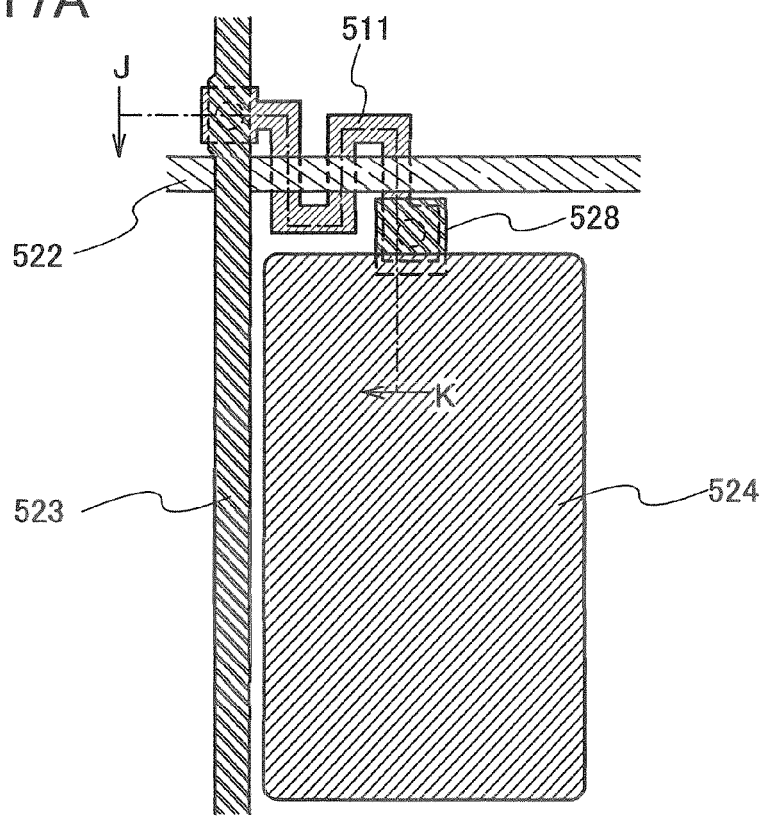
FIG. 17A is a plan view of a pixel of a liquid crystal display device.
Figure 17B:
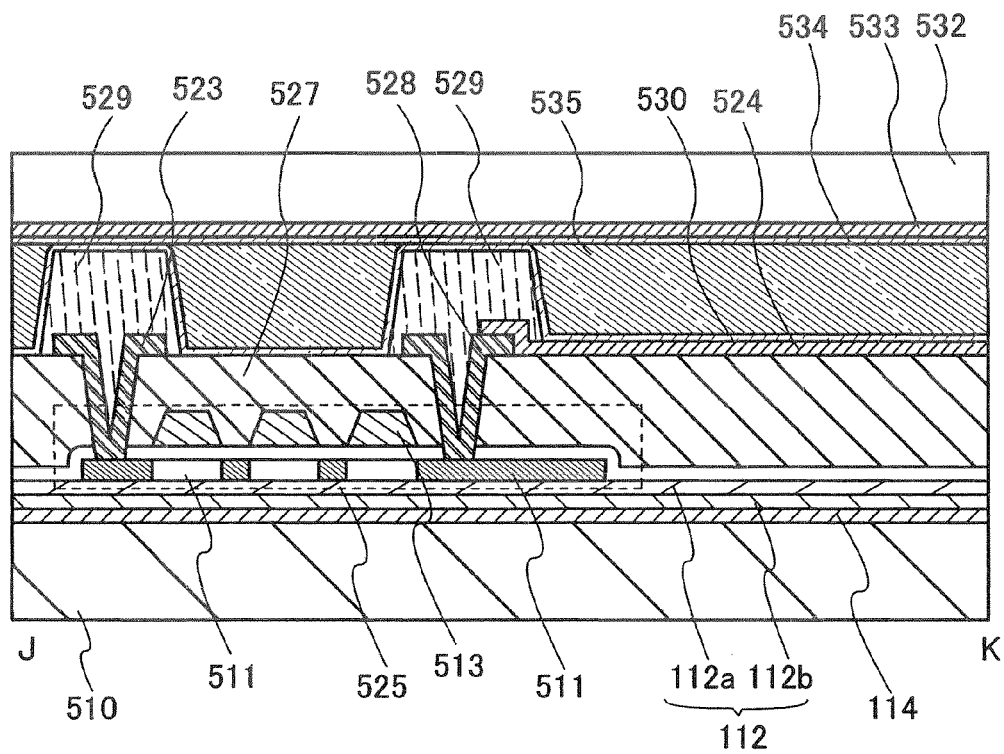
FIG. 17B is a cross-sectional view taken a line J-K of FIG. 17A.

FIGS. 17A and 17B are diagrams illustrating a structural example of a liquid crystal display device. FIG. 17A is a plan view of a pixel of the liquid crystal display device, and FIG. 17B is a cross-sectional view of the diagram of FIG. 17A along a section line J-K. In FIG. 17A, a semiconductor layer 511 is a layer formed from the single crystal semiconductor layer 116, and forms a TFT 525 of the pixel. The pixel includes the semiconductor layer 511; a scan line 522 that crosses the semiconductor layer 511; a signal line 523 that crosses the scan line 522; a pixel electrode 524; and an electrode 528 that is electrically connected to the pixel electrode 524 and the semiconductor layer 511.

As illustrated in FIG. 17B, the bonding layer 114, the insulating layer 112 including the insulating film 112b and the insulating film 112a, and the semiconductor layer 511 are stacked over a substrate 510. The substrate 510 is the separated supporting substrate 100. The semiconductor layer 511 is a layer formed by element separation of the single crystal semiconductor layer 116 by etching. In the semiconductor layer 511, a channel formation region 512 and an n-type impurity region 513 are formed. A gate electrode of the TFT 525 is included in the scan line 522, and one of a source electrode and a drain electrode is included in the signal line 523.

Over an interlayer insulating film 527, the signal line 523, the pixel electrode 524, and the electrode 528 are provided. Over the interlayer insulating film 527, a columnar spacer 529 is formed, and an orientation film 330 is formed so as to cover the signal line 523, the pixel electrode 524, the electrode 528, and the columnar spacer 529. Over a counter substrate 532, a counter electrode 533 and an orientation film 534 that covers the counter electrode 533 are formed. The columnar spacer 529 is formed to maintain a space between the substrate 510 and the counter substrate 532. In the space formed by the columnar spacer 529, a liquid crystal layer 535 is formed. At connection portions of the signal line 523 and the electrode 528 with the impurity region 513, because there are steps formed in the interlayer insulating film 527 due to formation of contact holes, orientation of liquid crystals in the liquid crystal layer 535 in these connection portions becomes disordered easily. Accordingly, the columnar spacer 529 is formed at these step portions to prevent orientation disorder of a liquid crystal.

Figure 18A:
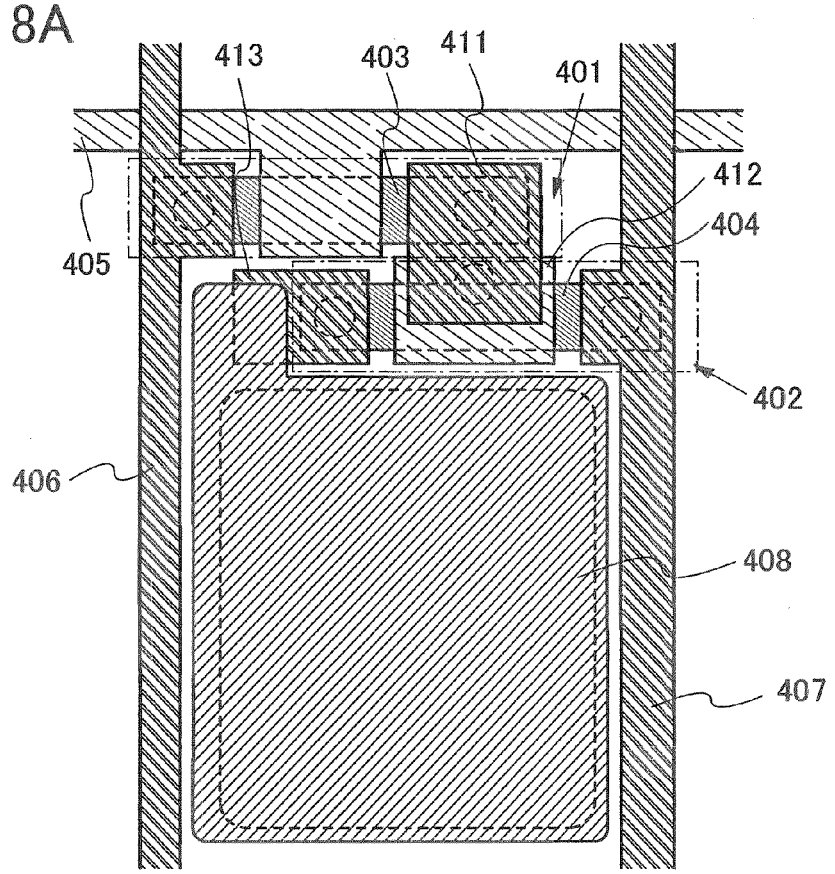
FIG. 18A is a plan view of a pixel of an electroluminescence display device.
Figure 18B:
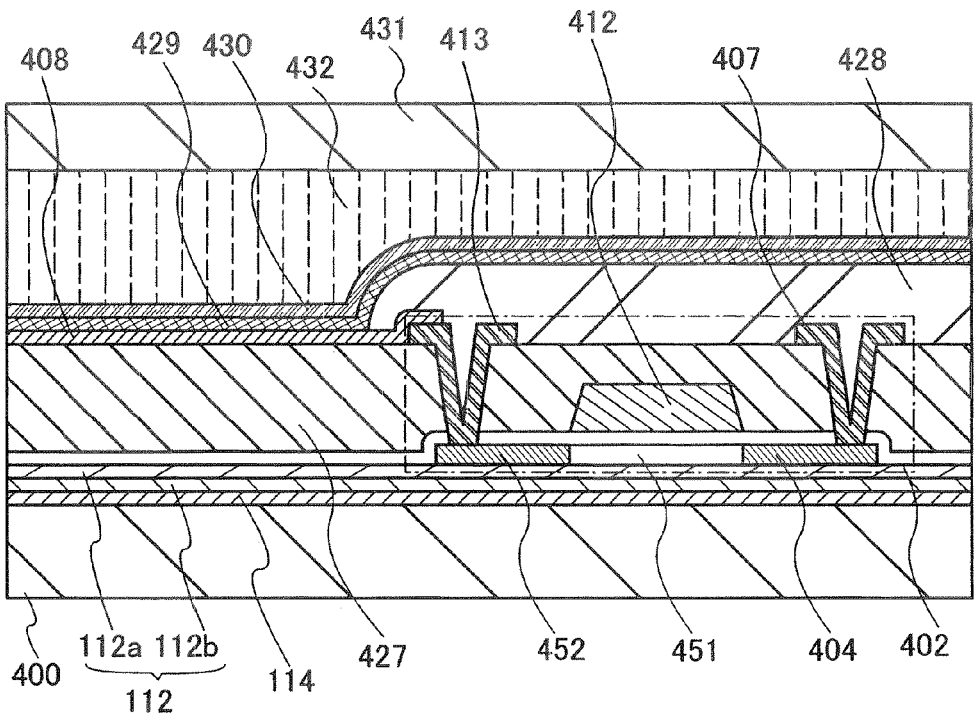
FIG. 18B is a cross-sectional view of FIG. 18A.

Next, an electroluminescent display device (hereinafter referred to as an "EL display device") will be described. FIGS. 18A and 18B are diagrams for describing an EL display device manufactured according to the method in Embodiment Mode 2. FIG. 18A is a plan view of a pixel of the EL display device, and FIG. 18B is a cross-sectional view of the pixel. As illustrated in FIG. 18A, the pixel includes a selection transistor 401 made of a TFT, a display control transistor 402, a scan line 405, a signal line 406, a current supply line 407, and a pixel electrode 408. Each pixel is provided with a light-emitting element with a structure in which a layer formed to contain an electroluminescent material (EL layer) is interposed between a pair of electrodes. One of the electrodes of the light-emitting element is the pixel electrode 408.

The selection transistor 401 includes the semiconductor layer 403 that is made of the single crystal semiconductor layer 116. In the selection transistor 401, a gate electrode is included in the scan line 405, one of source and drain electrodes is included in the signal line 406, and the other of the source and drain electrodes is formed as an electrode 411. In the display control transistor 402, a gate electrode 412 is electrically connected to the electrode 411, and one of source and drain electrodes is formed as an electrode 413 that is electrically connected to the pixel electrode 408, and the other of the source and drain electrodes is included in the current supply line 407.

The display control transistor 402 is a p-channel TFT and includes the semiconductor layer 404 that is made of the single crystal semiconductor layer 116. As illustrated in FIG. 18B, in the semiconductor layer 404, a channel formation region 451 and a p-type impurity region 452 are formed. An interlayer insulating film 427 is formed so as to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the electrode 408, and a counter electrode 430 is formed over the EL layer 429. A counter substrate 431 is provided as a reinforcing plate, and the counter substrate 431 is fixed to a substrate 400 with a resin layer 432. The substrate 400 is the separated supporting substrate 100.

Accordingly, a wide variety of electronic devices can be manufactured using the semiconductor substrate 10. The electronic devices include cameras such as a video camera and a digital camera; a navigation system; a sound reproduction system (a car audio system, an audio component, and the like); a computer; a game machine; a mobile information terminal (a mobile computer, a cellular phone, a mobile game machine, an e-book reader, and the like); a display device that displays image data such as an image reproduction device provided with a recording medium (specifically, a digital versatile disc (DVD)); and the like.

Figure 19A:
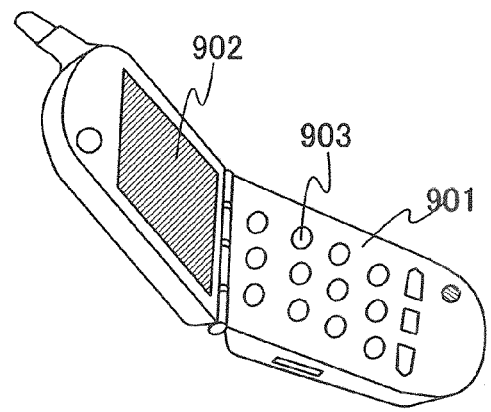
FIG. 19A is an external view of a cellular phone.
Figure 19B:
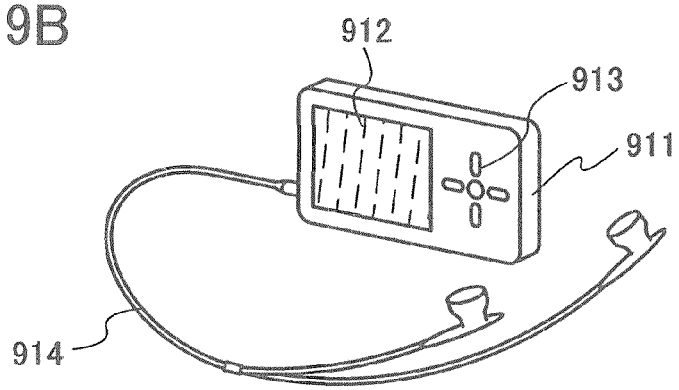
FIG. 19B is an external view of a digital player.
Figure 19C:
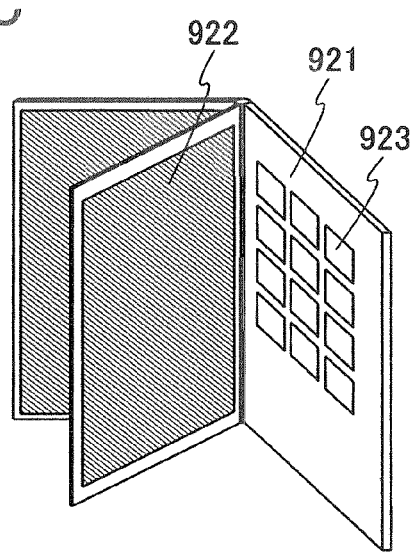
FIG. 19C is an external view of an e-book reader.

With reference to FIGS. 19A to 19C, specific modes of the electronic device are described. FIG. 19A is an external view illustrating an example of a cellular phone 901. This cellular phone 901 has a structure in which a display portion 902, an operation switch 903, and the like are included. By applying the liquid crystal display device described in FIGS. 17A and 17B or the EL display device described in FIGS. 18A and 18B to the display portion 902, the display portion 902 can have excellent image quality with little display unevenness.

FIG. 19B is an external view illustrating a structural example of a digital player 911. The digital player 911 includes a display portion 912, an operation portion 913, an earpiece 914, and the like. Alternatively, headphones or a wireless earpiece can be used instead of the earpiece 914. By applying the liquid crystal display device described in FIGS. 17A and 17B or the EL display device described in FIGS. 18A and 18B to the display portion 912, even in the case where the screen size is approximately 0.3 inches to 2 inches, an image with high precision and a large amount of text information can be displayed.

FIG. 19C is an external view of an e-book reader 921. This e-book reader 921 includes a display portion 922 and an operation switch 923. A modem may be incorporated into the e-book reader 921, or the semiconductor device in FIG. 16 may be incorporated so that the e-book reader 921 has a structure by which information can be transmitted/received wirelessly. By applying the liquid crystal display device described in FIGS. 17A and 17B or the EL display device described in FIGS. 18A and 18B to the display portion 922, a display with high image quality can be performed.

Figure 20A:
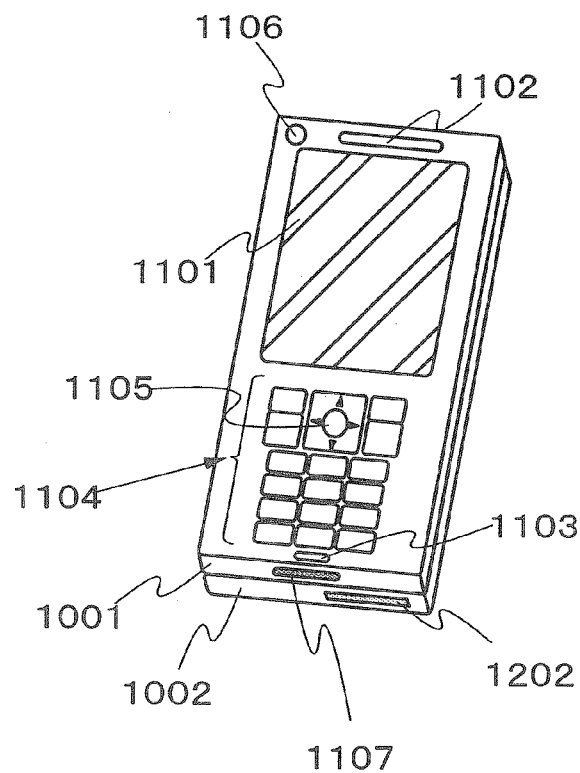
FIGS. 20A to 20C are external views of a cellular phone.
Figure 20B:
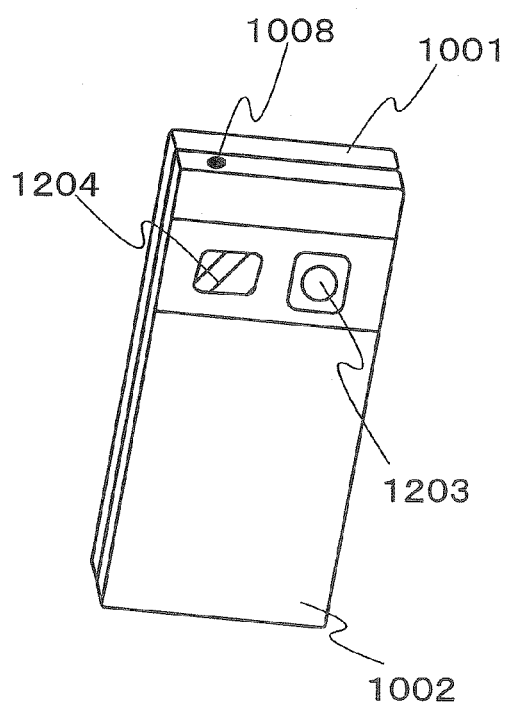
Figure 20C:
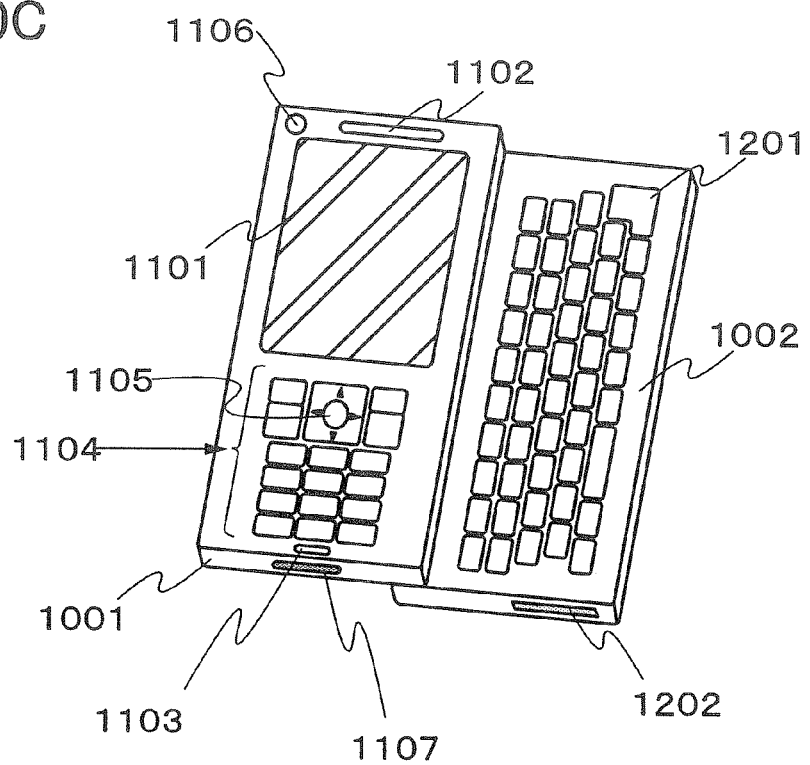
Figure 21A:
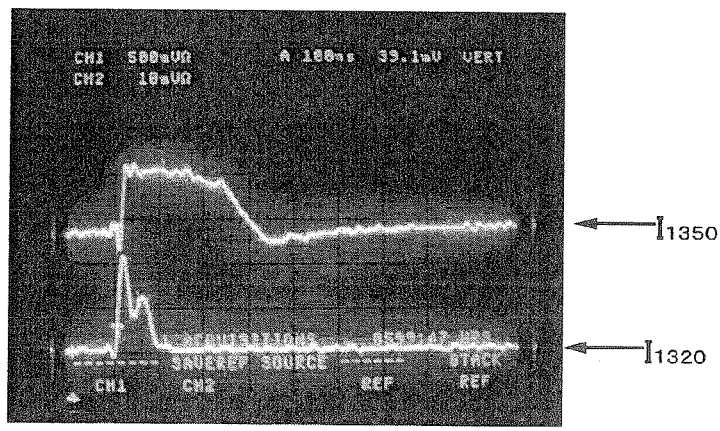
FIGS. 21A and 21B are photomaps of an oscilloscope.
Figure 21B:
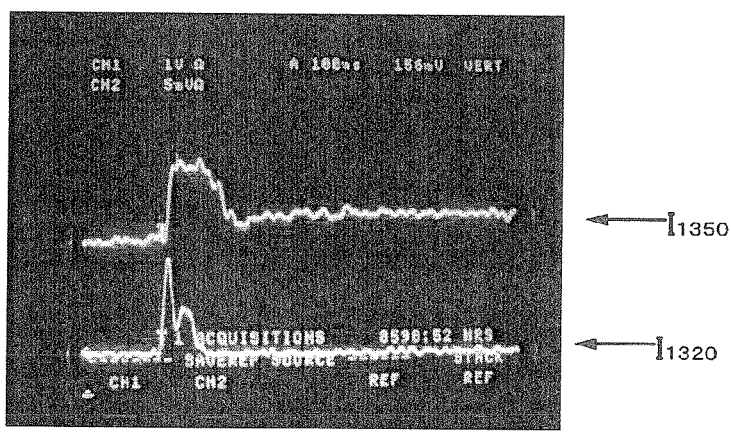
Figure 21C:
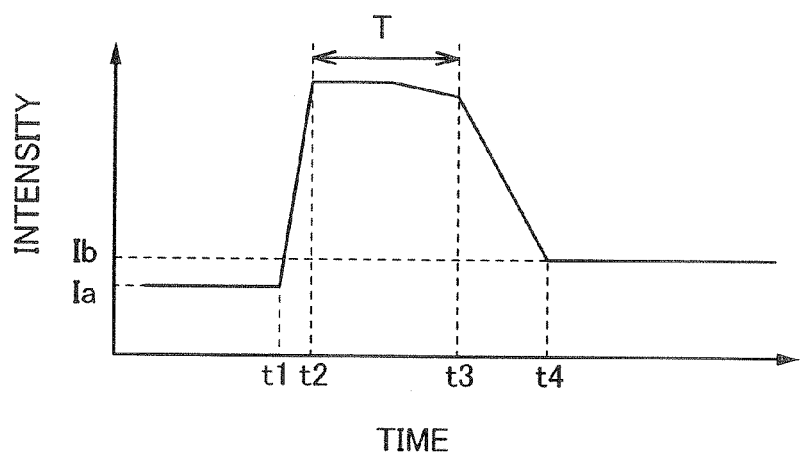
FIG. 21C is a schematic view.
Figure 22:
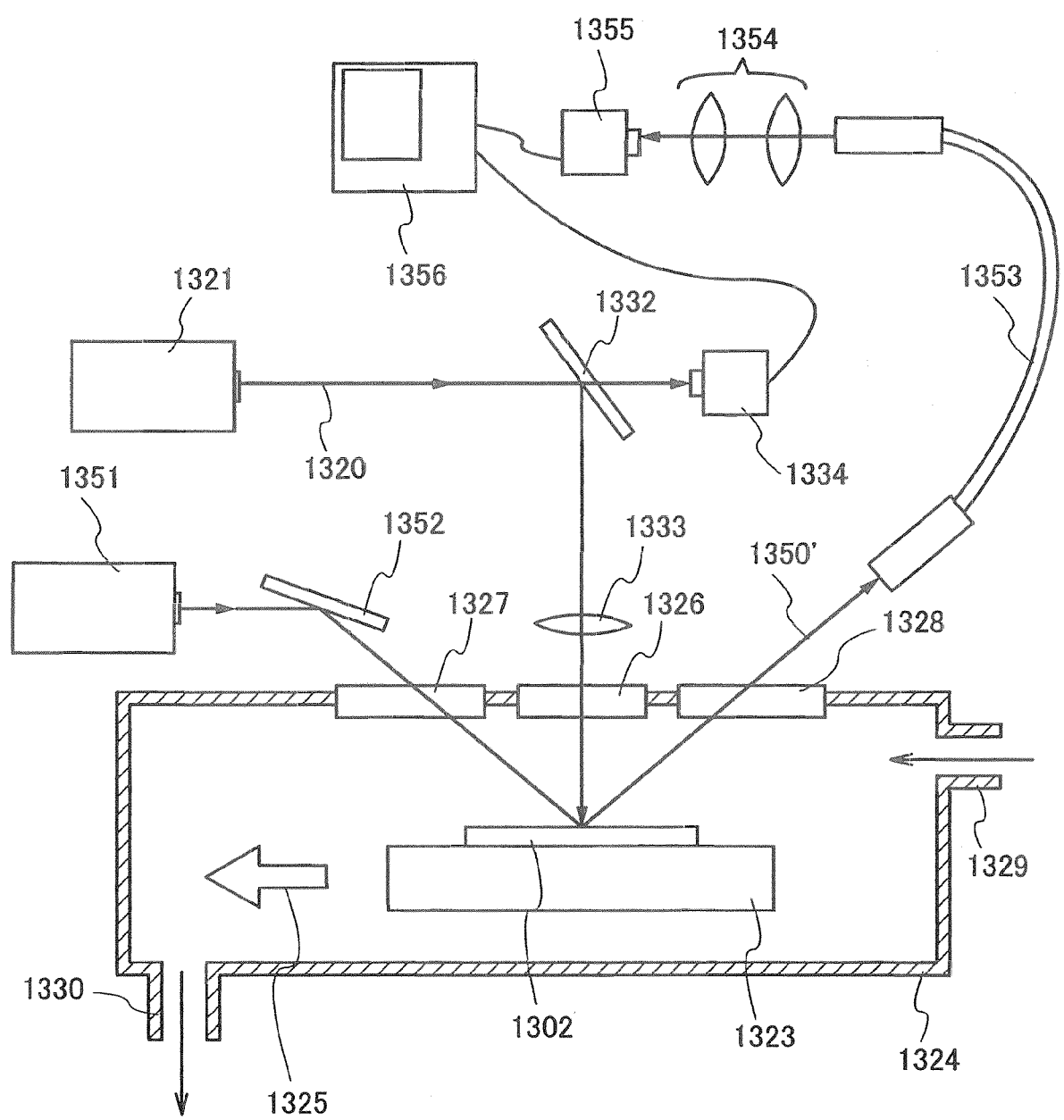
FIG. 22 is a cross-sectional view of a laser irradiation apparatus which is used for measurement.
Figure 23A:
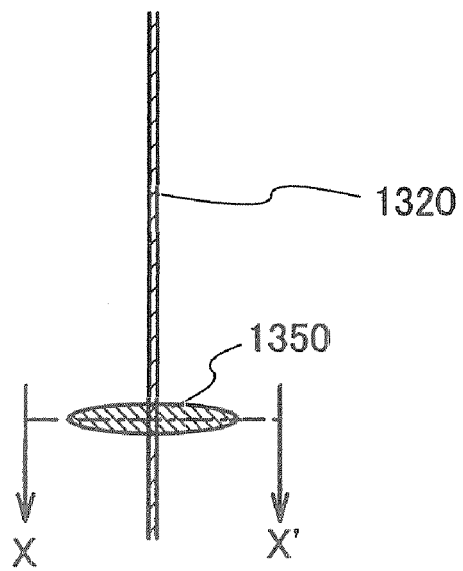
FIG. 23A is a top view of shapes of a laser beam and a probe beam.
Figure 23B:
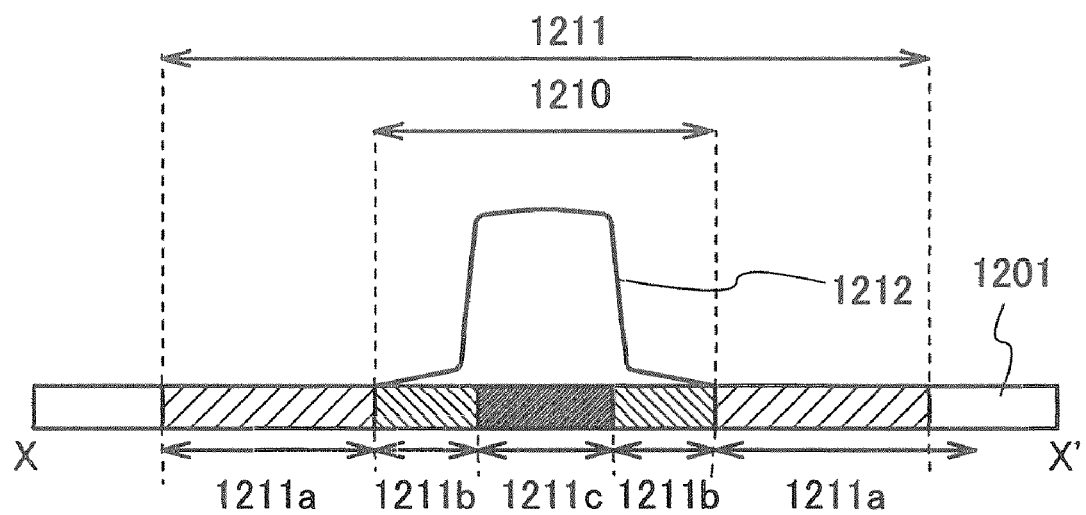
FIG. 23B is a cross-sectional view which shows a relationship between a region irradiated with the laser beam and a region irradiated with the probe beam.
Figure 24:
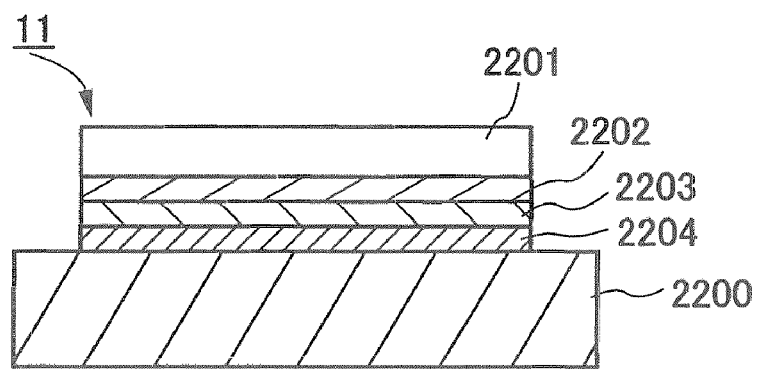
FIG. 24 is a cross-sectional view of a sample used for an experiment.
Figure 25A:
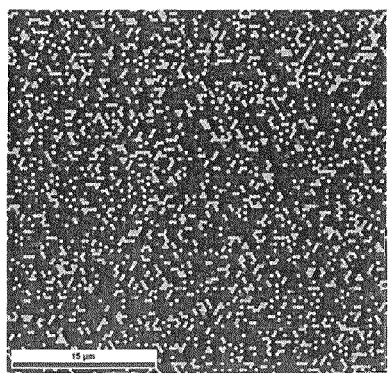
FIGS. 25A to 25D are diagrams which each show EBSP data.
Figure 25B:
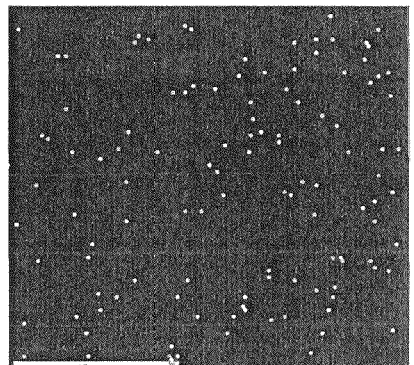
Figure 25C:
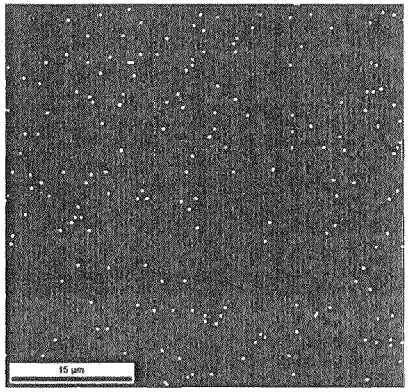
Figure 25E:
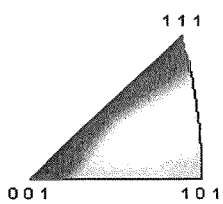
FIG. 25E is a color coded map.
Figure 25D:
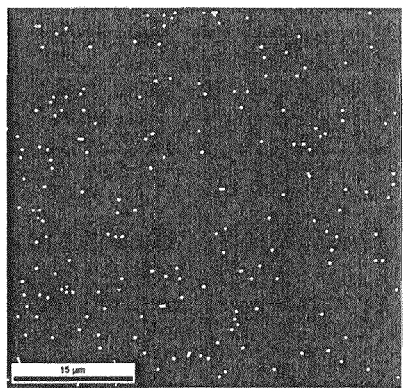
Figure 26A:
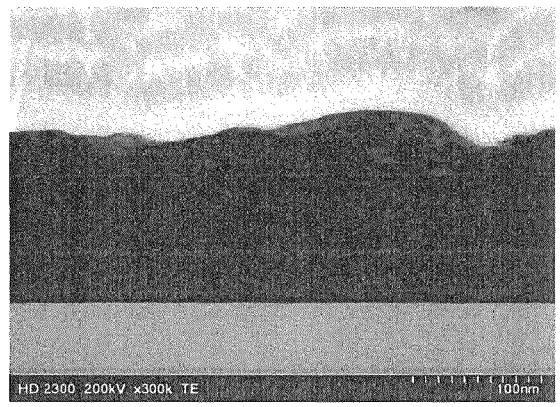
FIGS. 26A to 26C are STEM photographs.
Figure 26B:
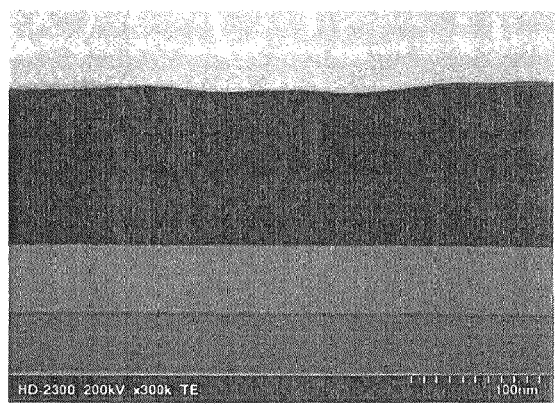
Figure 26C:
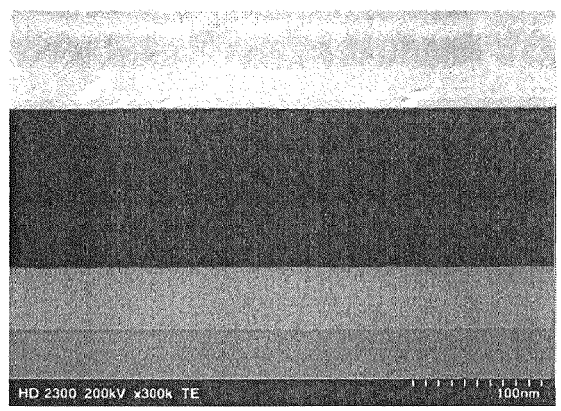
Figure 27:
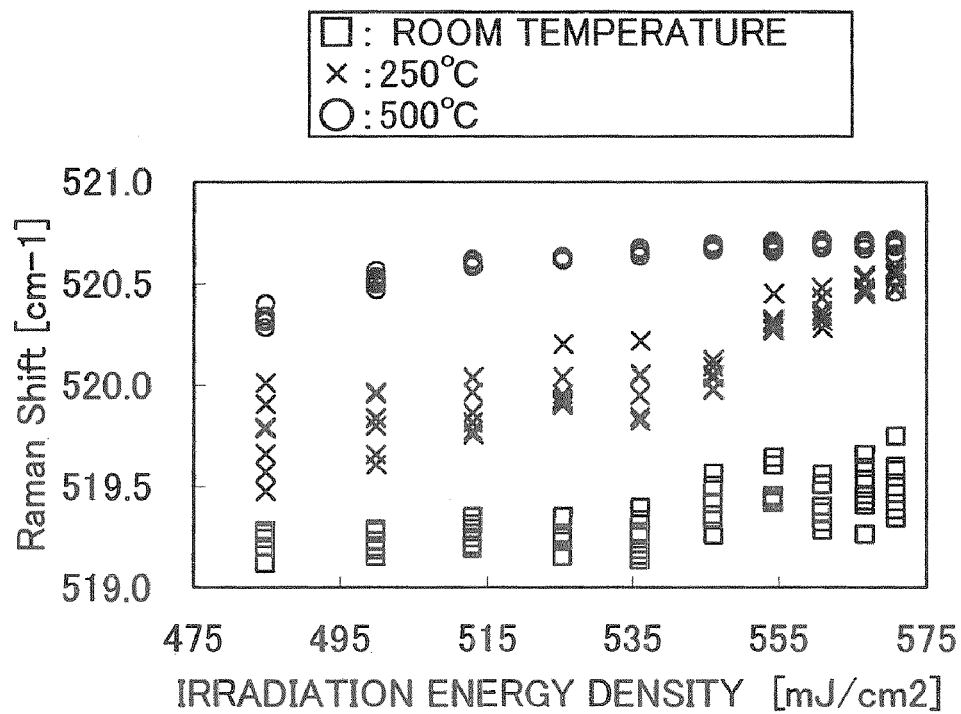
FIG. 27 is a graph which shows a variation of a Raman shift with respect to energy density of a laser beam.
Figure 28:
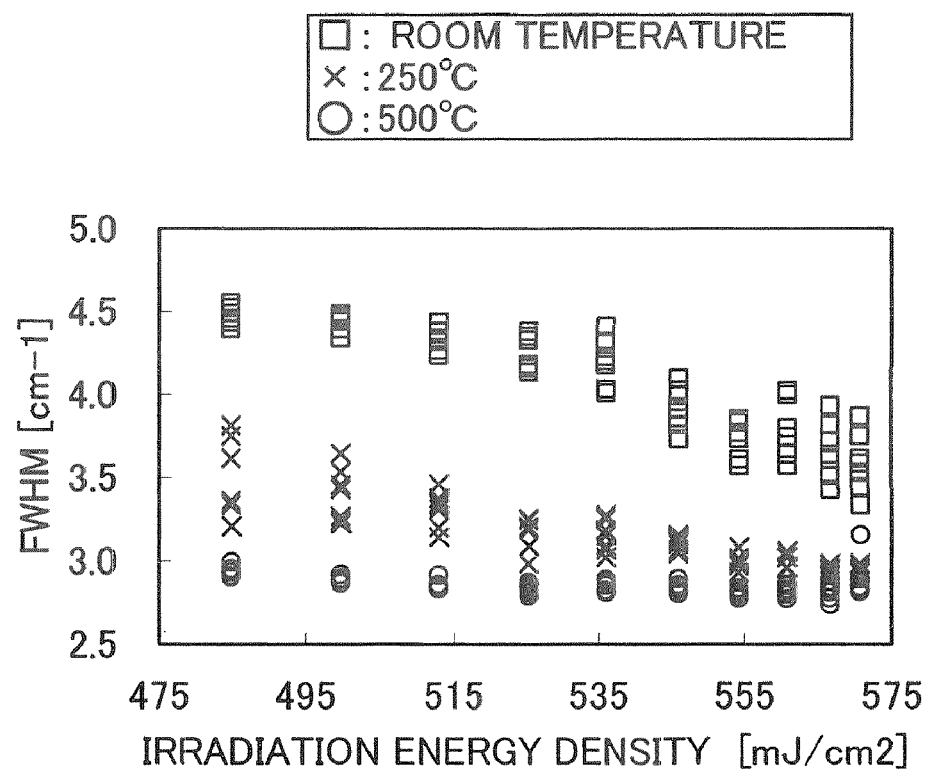
FIG. 28 is a graph which shows variation of a full width at half maximum of a Raman spectrum with respect to energy density of a laser beam.

FIGS. 20A to 20C illustrate an example of a phone which is different from the cellular phone illustrated in FIG. 19A. FIGS. 20A to 20C illustrate an example of a structure of a smartphone to which the present invention is applied. FIG. 20A is a front view, FIG. 20B is a rear view, and FIG. 20C is a development view. The smartphone has two housings 1001 and 1002. The smartphone 1000 has both a function of a cellular phone and a function of a portable information terminal, and incorporates a computer provided to conduct a variety of data processing in addition to verbal communication; therefore, it is called smartphone.

The smartphone 1000 has the two housings 1001 and 1002. The housing 1001 includes a display portion 1101, a speaker 1102, a microphone 1103, operation keys 1104, a pointing device 1105, a front camera lens 1106, an external connection port 1107, an earphone terminal 1108 and the like, while the housing 1002 includes a keyboard 1201, an external memory slot 1202, a rear camera lens 1203, a light 1204 and the like. In addition, an antenna is incorporated in the housing 1001.

Further, in addition to the above structure, the smartphone may incorporate a non-contact IC chip, a small size memory device, or the like.

The housing 1001 and housing 1002 (FIG. 20A) which are put together to be lapped with each other are developed by sliding as illustrated in FIG. 20C. In the display portion 1101, the display device described in the above embodiment mode can be incorporated, and display direction can be changed depending on a use mode. Because the front camera lens 1106 is provided in the same plane as the display portion 1101, the cellular phone can be used as a videophone. A still image and a moving image can be taken by the rear camera lens 1203 and the light 1204 by using the display portion 1101 as a view finder. The speaker 1102 and the microphone 1103 can be used for uses of videophone, recording, playback and the like without being limited to verbal communication. With use of the operation keys 1104, operation of incoming and outgoing calls, simple information input of electronic mails or the like, scrolling of a screen, cursor motion and the like are possible. If much information is needed to be treated, such as documentation, use as a portable information terminal, and the like, the use of the keyboard 1201 is convenient. Further, when the housing 1001 and housing 1002 (FIG. 20A) which are put together to be lapped with each other are developed by sliding as illustrated in FIG. 20C, and used as a portable information terminal, smooth operation can be conducted by using the keyboard 1201 or the pointing device 1105. The external connection terminal 1107 can be connected to an AC adapter and various types of cables such as a USB cable, and charging and data communication with a personal computer are possible. Moreover, a large amount of data can be stored by inserting a storage medium into the external memory slot 1202 and can be moved. In the rear surface of the housing 1002 (FIG. 20B), the rear camera lens 1203 and the light 1204 are provided, and a still image and a moving image can be taken by using the display portion 1101 as a finder.

Further, the cellular phone may include an infrared communication function, an USB port, a function of a television receiver or the like, in addition to the above-described function.

Embodiment Mode 5

Although the example in which the buffer layer has three layers is described in Embodiment Mode 1, an example in which a buffer layer has two layers is described in this embodiment mode. In this embodiment mode, an example is shown in which after a plurality of silicon substrates is fixed using a non-alkali glass substrate (product name: AN100), a plurality of single crystal silicon layers is formed in FIG. 29A.

First, a barrier layer 801 which is one layer of a buffer layer is formed over a non-alkali glass substrate 800 by a PECVD method. The non-alkali glass substrate (product name: AN100) is a non-alkali glass substrate having the following physical properties: a specific gravity of 2.51 g/cm$^3$, a Poisson's ratio of 0.22, a Young's modulus of 77 GPa, a two-axes elastic coefficient of 98.7 GPa, and a coefficient of thermal expansion of $38 \times 10^{-7}$/° C.

The barrier layer 801 is a film that prevents impurities (typically, sodium) which decrease reliability of a semiconductor device, such as an alkali metal or an alkaline-earth metal, from entering the single crystal semiconductor layer from a supporting substrate side at the time of manufacture of a semiconductor substrate and at the time of manufacture of the semiconductor device using this semiconductor substrate. The barrier layer is formed so that the semiconductor device can be prevented from being contaminated by impurities, whereby the reliability can be improved. As the barrier layer 801, a silicon nitride film, a silicon nitride oxide film, an aluminum nitride film, or an aluminum nitride oxide film each having a thickness of 5 nm or more and 200 nm or less is used.

Next, a bonding layer 802 formed of a 50-nm silicon oxide film is formed over the barrier layer 801 by a PECVD method. The bonding layer 802 is a layer that forms one layer of the buffer layer. As a process gas of the silicon oxide film, TEOS and O$_2$ are used.

A circular single crystal silicon wafer is prepared; the single crystal silicon wafer is doped with hydrogen ions by using an ion doping apparatus; a 100% hydrogen gas is used as a source gas to form a damaged region; and ionized hydrogen is accelerated by an electric field so as to be added to the single crystal silicon wafer substrate without mass separation, whereby the damaged region is formed. In addition, the depth where the damaged region is formed is adjusted so that the thickness of the single crystal silicon layer separated from the single crystal silicon wafer is 120 nm.

Next, after the surface of the single crystal silicon wafer is subjected to ultrasonic cleaning in pure water, the surface of the single crystal silicon wafer is cleaned by ozone-containing pure water. When cleaning is performed by ozone-containing pure water, a thin oxide film is formed on the surface of the single crystal silicon wafer.

Then, after the bonding layer 802 over the non-alkali glass substrate 800 and the single crystal silicon wafer are arranged in close contact with each other and bonded together, the single crystal silicon wafer is separated in the damaged region, and the non-alkali glass substrate 800 to which a single crystal silicon layer 803 is attached is formed.

In the same procedure, a second circular single crystal silicon wafer is prepared, after the bonding layer 802 over the non-alkali glass substrate 800 and the second single crystal silicon wafer are arranged in close contact with each other and bonded together, the single crystal silicon wafer is separated in the damaged region, and the non-alkali glass substrate 800 to which the single crystal silicon layer 803 is attached is formed.

Next, by using the apparatus shown in FIG. 7, a heated nitrogen gas is sprayed, a part of the single crystal silicon layer 803 fixed to the supporting substrate with the buffer layer interposed therebetween is irradiated with a laser beam, and the single crystal silicon layer 803 is melted to perform re-single-crystallization. Here, the heated nitrogen gas is sprayed and the single crystal silicon layer is heated up to approximately 600° C. that is a strain point or lower of the non-alkali glass substrate (product name: AN100). The heated nitrogen gas is sprayed and heating is performed at 400° C. or higher, preferably, 450° C. or higher, whereby the supporting substrate can be shrunk. Accordingly, in the case where a transistor is formed later using a glass substrate to which the single crystal semiconductor layer is fixed, shrinkage is made in a process of manufacturing the single crystal semiconductor substrate in advance, so that shrinkage in the process of manufacturing a transistor can be suppressed. Therefore, mask misalignment in a light-exposure step can be suppressed.

Figure 29A:
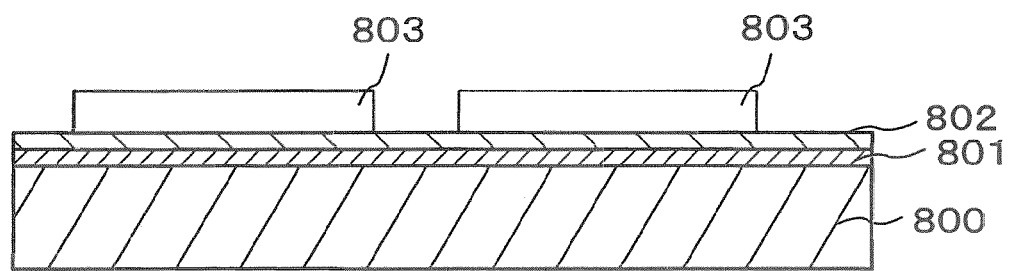
FIGS. 29A and 29B are cross-sectional views which each show an example of a single crystal semiconductor layer bonded to a glass substrate.

FIG. 29A corresponds to a cross-sectional view which shows a state that this stage is completed. In the following steps, the semiconductor device may be formed in accordance with the process of manufacturing a semiconductor device of the aforementioned embodiment mode.

As in this embodiment mode, two layers are used instead of three layers, so that the number of steps can be reduced. In addition, because re-single-crystallization is performed, the surface of the single crystal silicon layer 803 can have sufficient planarity even if two layers are used.

In this embodiment mode, the example in which two circular single crystal silicon wafers are used is described; however, it goes without saying that two or more single crystal silicon wafers which are not overlapped with each other can be used with respect to one glass substrate.

Further, this embodiment mode can be freely combined with any of Embodiment Modes 1 to 4.

Embodiment Mode 6

An example is shown in which after a plurality of silicon substrates is fixed using a non-alkali glass substrate (product name: EAGLE2000 (registered trademark)), a distance between single crystal semiconductor layers is shortened in FIG. 29B.

First, a barrier layer 811 is formed over a non-alkali glass substrate 810 by a PECVD method. Note that the non-alkali glass substrate (product name: EAGLE2000 (registered trademark)) is a non-alkali glass substrate having the following physical properties: a specific gravity of 2.37 g/cm$^3$, a Poisson's ratio of 0.23, a Young's modulus of 70.9 GPa, a two-axes elastic coefficient of 92.07 GPa, and a coefficient of thermal expansion of 31.8×10$^{-7}$/° C.

The barrier layer 811 is a film that prevents impurities (typically, sodium) which decrease reliability of a semiconductor device, such as an alkali metal or an alkaline-earth metal, from entering the single crystal semiconductor layer from a supporting substrate side at the time of manufacture of a semiconductor substrate and at the time of manufacture of the semiconductor device using this semiconductor substrate. The barrier layer is formed so that the semiconductor device can be prevented from being contaminated by impurities, whereby the reliability can be improved. As the barrier layer 811, a silicon nitride film, a silicon nitride oxide film, an aluminum nitride film, or an aluminum nitride oxide film each having a thickness of 5 nm or more and 200 nm or less is used.

Next, a bonding layer 812 formed of a 50-nm silicon oxide film is formed over the barrier layer 811 by a PECVD method. The bonding layer 812 is a layer that forms one layer of the buffer layer. As a process gas of the silicon oxide film, TEOS and O$_2$ are used.

A rectangular single crystal silicon wafer is prepared; the single crystal silicon wafer is doped with hydrogen ions by using an ion doping apparatus; a 100% hydrogen gas is used for a source gas which forms a damaged region; and ionized hydrogen is accelerated by an electric field so as to be added to the single crystal silicon wafer substrate without mass separation, whereby the damaged region is formed. In addition, the depth where the damaged region is formed is adjusted so that the thickness of the single crystal silicon layer separated from the single crystal silicon wafer is 120 nm.

Next, after the surface of the rectangular single crystal silicon wafer is subjected to ultrasonic cleaning in pure water, the surface of the rectangular single crystal silicon wafer is cleaned by ozone-containing pure water. When cleaning is performed by ozone-containing pure water, a thin oxide film is formed on the surface of the single crystal silicon wafer.

Then, after the bonding layer 812 over the non-alkali glass substrate 810 and the single crystal silicon wafer are arranged in close contact with each other and bonded together, the single crystal silicon wafer is separated in the damaged region, and the non-alkali glass substrate 810 to which a single crystal silicon layer 813 is attached is formed.

In the same procedure, a second rectangular single crystal silicon wafer is prepared, and the bonding layer 812 over the non-alkali glass substrate 810 and the second single crystal silicon wafer are arranged in close contact with each other and bonded together. In bonding, a gap between adjacent single crystal semiconductor layers is small. Then, the single crystal silicon wafer is separated in the damaged region, and the non-alkali glass substrate 810 to which the single crystal silicon layer 813 is attached is formed.

Then, a third rectangular single crystal silicon wafer is prepared, and a similar process is performed.

By use of the rectangular single crystal silicon wafers, a gap between adjacent rectangular single crystal semiconductor layers is small, whereby the rectangular single crystal semiconductor layers can be fixed to a rectangular glass substrate. The gap between the single crystal semiconductor layers is small and the single crystal semiconductor layers are fixed to the glass substrate; by use of the apparatus shown in FIG. 7, a heated nitrogen gas is sprayed, a part of the single crystal semiconductor layer 813 fixed to the supporting substrate with the buffer layer interposed therebetween is irradiated with a laser beam, and the single crystal semiconductor layer 813 is melted to perform re-single-crystallization.

Here, at the time of irradiation with a linear laser beam, a heated nitrogen gas is sprayed, and the single crystal silicon layer is heated up to approximately 500° C. that is a temperature of a strain point or lower of the non-alkali glass substrate (product name: EAGLE2000 (registered trademark)). The heated nitrogen gas is sprayed and heating is performed at 400° C. or higher, preferably, 450° C. or higher, whereby the supporting substrate can be shrunk. Accordingly, in the case where a transistor is formed later using a glass substrate to which the single crystal semiconductor layer is fixed, shrinkage is made in a process of manufacturing a single crystal semiconductor substrate in advance, so that shrinkage in the process of manufacturing a transistor can be suppressed. Therefore, mask misalignment in a light-exposure step can be suppressed.

Figure 29B:
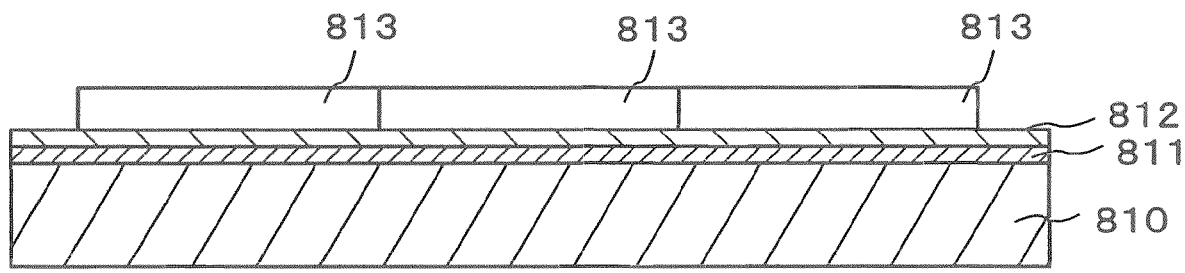

FIG. 29B corresponds to a cross-sectional view which shows a state that this stage is completed. In the following steps, the semiconductor device may be formed in accordance with the process of manufacturing a semiconductor device of the aforementioned embodiment mode.

In the case where a gap between adjacent single crystal semiconductor layers is small and irradiation with a linear laser beam is performed, if the length of the laser beam is much longer than one side of the rectangular silicon wafer as in this embodiment mode, treatment can be finished by scanning three single crystal silicon layers 813 with a laser beam twice depending on a length in a longitudinal direction of the laser beam. The direction where the substrate is moved is a direction perpendicular to a longitudinal direction of the linear laser beam. In addition, because re-single-crystallization is performed, the surface of the single crystal silicon layer 813 can have sufficient planarity even if two layers are used.

In this embodiment mode, the example in which three single crystal silicon wafers are used is described; however, it goes without saying that three or more single crystal silicon wafers which are not overlapped with each other can be used with respect to one glass substrate.

Further, this embodiment mode can be freely combined with any of Embodiment Modes 1 to 4.

Embodiment Mode 7

Figure 30:
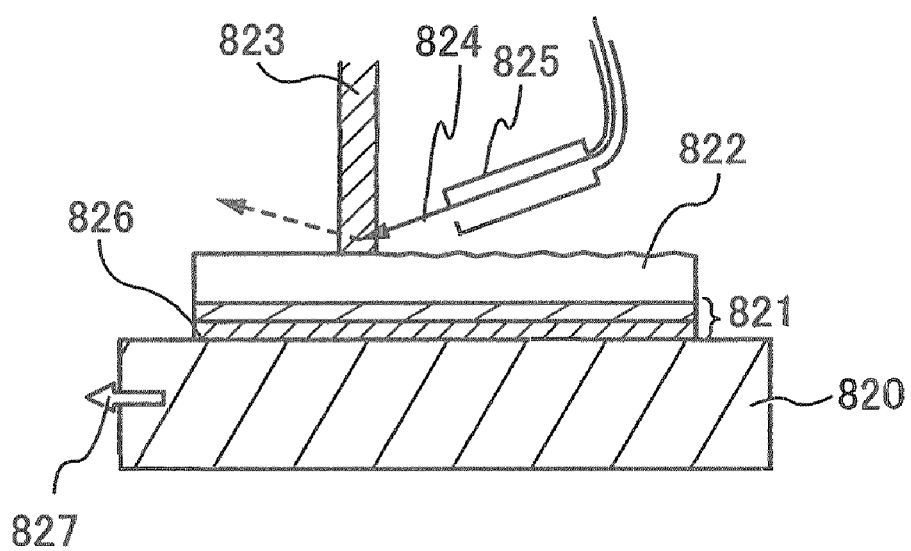
FIG. 30 is a cross-sectional view which shows an example of a method for spraying a heated gas.

FIG. 30 shows an example of a structure of a laser irradiation apparatus that is different from that shown in FIG. 7.

FIG. 30 is an expanded sectional view of a part of an apparatus that sprays a gas in one direction.

A single crystal silicon layer 822 is fixed to a large-sized light-transmitting substrate 820 with a buffer layer 821 interposed therebetween. The buffer layer 821 has a multilayer structure in which a barrier layer 826 is provided and a bonding layer is provided thereover. A method for obtaining up to this stage may refer to Embodiment Mode 1 or Embodiment Mode 6.

A heated gas is sprayed on the substrate from a blow unit 825, and a current of air is formed in an air current direction 824 shown by an arrow shown by a solid line. Although the heated gas is not shown here, there are a gas supply apparatus for supplying a nitrogen gas to the blow unit 825 and a gas heating apparatus for heating the nitrogen gas supplied from the gas supply apparatus.

The single crystal silicon layer 822 is irradiated with a laser beam 823. A stage is moved, whereby the substrate is moved in a movement direction 827 of the substrate.

At the time of irradiation with a linear laser beam, a heated nitrogen gas is sprayed, and the single crystal silicon layer is heated up to approximately 500° C. that is a temperature of a strain point or lower of the non-alkali glass substrate.

It is preferable that an opening of the blow unit 825 be wider than a region irradiated with the laser beam 823.

The blow unit 825 is provided and a gas is sprayed on the substrate, whereby a current of air is formed in the air current direction 824 shown by an arrow shown by a dotted line. It is preferable that the air current direction 824 be the same direction as the movement direction 827 of the stage. Further, the movement direction 827 of the stage is a direction perpendicular to a longitudinal direction of the region irradiated with the linear laser beam 823.

Note that, for simplification, an optical system, a laser, and the like are not shown. For the optical system and the laser, the structures shown in FIG. 11 can be used. The laser is connected to a computer and is controlled by the computer. The blow unit 825 is also connected to the computer and controlled by the computer.

In the case where a heated gas sprayed in one direction, since the blow unit 825 can take a distance from the laser beam 823, direct irradiation can be prevented. Accordingly, a material that is weak in a laser beam can also be used for the blow unit 825 as long as the material can withstand the heated gas.

By use of the apparatus shown in FIG. 30, a heated nitrogen gas is sprayed, a part of the single crystal semiconductor layer 822 fixed to the supporting substrate with the buffer layer interposed therebetween is irradiated with the laser beam 823, and the single crystal semiconductor layer 822 is melted to perform re-single-crystallization. By re-single-crystallization, a flat surface can be obtained. A region of the single crystal semiconductor layer 822 irradiated with the laser beam 823 is partially melted or completely melted by irradiation with the laser beam 823.

In the case where partial melting is performed by irradiation with the laser beam 823, crystal grows from the single crystal semiconductor that is the solid phase portion which is not melted in the lower layer, and a so-called longitudinal growth occurs in the single crystal semiconductor layer 822 when a portion which is melted is solidified. Since the solid phase portion in the lower layer is a single crystal and has uniform crystal orientation, a crystal grain boundary is not formed and the single crystal semiconductor layer 822 after laser irradiation process can be a single crystal semiconductor layer without a crystal grain boundary. Although re-single-crystallization of near the surface which is melted or the upper layer which is melted is performed by solidification, a single crystal semiconductor which has the same crystal orientation as the single crystal semiconductor in the solid phase portion in the lower layer is formed. Therefore, in the case where a single crystal silicon wafer whose main surface is oriented along the (100) plane is used as the single crystal semiconductor substrate, a plane orientation of a main surface of the single crystal semiconductor layer 822 is (100), and thus the plane orientation of the main surface of the single crystal semiconductor layer 822 which is partially melted by the laser irradiation process and of which re-single-crystallization is performed is (100).

In the case where complete melting is performed by irradiation with the laser beam 823, crystals in the melted region can grow from the single crystal semiconductor which is adjacent to the melted region, and lateral growth occurs. Since a portion which is not melted is a single crystal and has uniform crystal orientation, a crystal grain boundary is not formed and the single crystal semiconductor layer 822 after laser irradiation process can be a single crystal semiconductor layer without a crystal grain boundary. Re-single-crystallization of a region that is completely melted is performed by solidification; however, a single crystal semiconductor which has the same crystal orientation as a single crystal semiconductor in a portion which is not melted and is adjacent to the region is formed. Therefore, in the case where a single crystal silicon wafer whose main surface is oriented along the (100) plane is used as the single crystal semiconductor substrate, the plane orientation of the main surface of the single crystal semiconductor layer 822 is (100), and the plane orientation of the main surface of the single crystal semiconductor layer 822 which is completely melted by the laser irradiation process and of which re-single-crystallization is performed is (100).

Accordingly, even in the case of partial melting or complete melting, the crystal orientation in one single crystal semiconductor layer 822 is uniform. Therefore, when a display device having substantially the same size as the single crystal silicon layer 822 is manufactured later, a display device with excellent display characteristics can be obtained.

Further, this embodiment mode can be freely combined with any one of Embodiment Modes 1 to 6.

Embodiment Mode 8

Figure 31A:
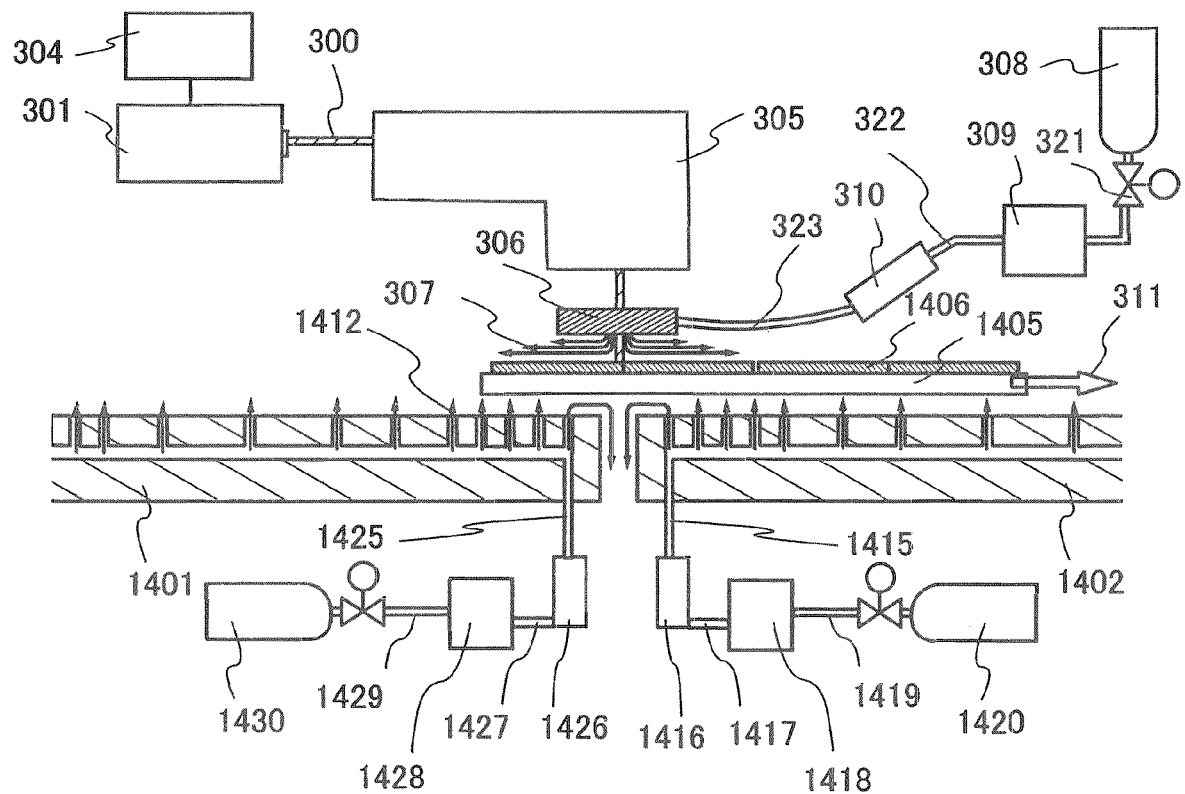
FIG. 31A is a cross-sectional view of a manufacturing apparatus.

In this embodiment mode, an example of a cross-sectional view of a manufacturing apparatus in which laser irradiation can be performed and a large-sized substrate can be processed while a heated nitrogen gas is sprayed on both a front side and a back side of a substrate is shown in FIG. 31A.

In order to shorten processing time of laser beam irradiation, the manufacturing apparatus is set such that the length L of a region that can be irradiated with a laser beam at one time is set long and laser beam irradiation is completed by moving a large-sized substrate in one direction.

Before scanning with a laser beam, a heated gas is sprayed on a region that is to be irradiated, whereby a region irradiated with a laser beam can be heated in advance. Therefore, energy of a laser beam that is needed for melting of a single crystal semiconductor layer can be reduced. By adjustment of an optical system or the like, it is also possible to irradiate a larger area with one shot. If a larger area can be irradiated with one shot, the time it takes to perform a laser irradiation process of each substrate can be shortened. Here, the maximum output energy of the laser is used so that the length L of the region irradiated with a laser beam is set long.

Figure 31B:
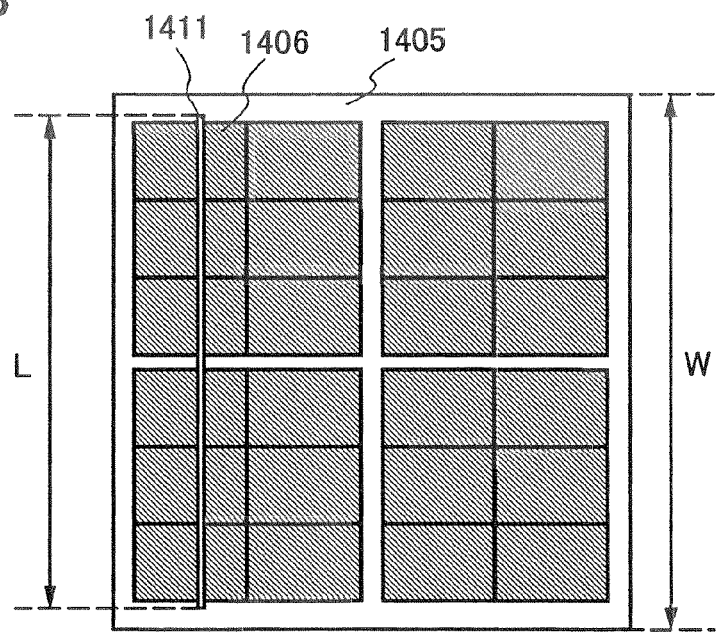
FIG. 31B is a top view of a substrate.

FIG. 31B shows a top view illustrating the positional relationship between a large-sized substrate 1405, a laser beam irradiation region 1411, and a single crystal semiconductor layer 1406 during laser irradiation. As shown in FIG. 31B, the length L of a region irradiated with the laser beam is larger than the total length of six single crystal semiconductor layers 1406 that are arranged in a row. The width of the large-sized substrate 1405 is denoted by W. The size/length of a region irradiated with a laser beam along a direction perpendicular to the width W of the large-sized substrate is referred to as the width of the laser beam. Here, an example is given in which the large-sized substrate 1405 has a size of 600 mm×720 mm and 24 single crystal semiconductor layers 1406 are arranged over one substrate. Each single crystal semiconductor layer 1406 is obtained by being separated from a silicon wafer.

FIG. 31A is a cross-sectional view showing a part of a manufacturing apparatus, and this manufacturing apparatus includes a plurality of stages in a chamber and a means that floats and transfers a substrate by spraying a heated nitrogen gas from a gas blowing hole provided in the stages. Note that the chamber is not shown in FIGS. 31A and 31B.

The concentration of oxygen and that of moisture are each 30 ppm or less, preferably, 30 ppb or less. Thus, in order to minimize residual gases such as oxygen and $H_2O$ in a chamber (reaction container), after the ultimate pressure is lowered to an ultra-high vacuum (UHV) region of $1\times10^{-7}$ Torr to $1\times10^{-10}$ Torr (about $1\times10^{-5}$ Pa to $1\times10^{-8}$ Pa), a high-purity nitrogen gas is supplied with an extremely low oxygen partial pressure $N_2$ gas generating apparatus, thereby obtaining a nitrogen atmosphere in the chamber. In addition, the laser irradiation apparatus may have a unit with which a high-purity nitrogen gas is evacuated from the chamber and then circulated again into the chamber. It is possible to reduce the concentration of oxygen and that of moisture by circulation. If circulation is possible while the heated gas temperature is being kept, energy for heating can be suppressed in the case where a gas is sprayed again. In addition, consumption of expensive high-purity gas can be suppressed because the gas is reused.

In the case where ultra-high vacuum evacuation is performed to obtain a vacuum lower than $10^{-5}$ Pa in the chamber, it is preferable to use a turbo-molecular pump and a cryopump. Evacuation is performed with the turbo-molecular pump, and vacuum evacuation is performed with the cryopump.

The inner wall of the chamber may have a mirror-like finish, and a heater for baking may be provided to reduce discharge of gas from the inner wall. It is preferable that the chamber be baked (at 200° C. to 300° C.) to remove a residual gas mainly containing moisture, which exists inside the chamber.

A nitrogen gas stored in a gas storage apparatus 1430 is supplied to an extremely low oxygen partial pressure $N_2$ gas generating apparatus 1428 through a valve provided in a tube 1429. Then, the nitrogen gas is supplied from the extremely low oxygen partial pressure $N_2$ gas generating apparatus 1428 to a plurality of gas blowing holes 1412 in the stage 1401 through a tube 1427, a gas heating apparatus 1426, and a tube 1425. The extremely low oxygen partial pressure $N_2$ gas generating apparatus 1428 controls the flow rate and pressure of the nitrogen gas and supplies the nitrogen gas so as to float the large-sized substrate 1405.

Two stages 1401 and 1402 are placed apart from each other so as not to overlap with a laser irradiation region and arranged so as not to be heated by being irradiated with a laser beam. The stage 1402 is also similarly provided with a plurality of gas blowing holes 1412. A nitrogen gas stored in a gas storage apparatus 1420 is supplied to an extremely low oxygen partial pressure $N_2$ gas generating apparatus 1418 through a valve provided in a tube 1419. Then, the nitrogen gas from the extremely low oxygen partial pressure $N_2$ gas generating apparatus 1418 is supplied to the plurality of gas blowing holes 1412 in the stage 1402 through a tube 1417, a gas heating apparatus 1416, and a tube 1415.

In order to make each of the concentration of oxygen and that of moisture in the chamber 30 ppm or less, preferably, 30 ppb or less, a high-purity gas is preferably used as the nitrogen gas to be blown from the plurality of gas blowing holes 1412. Note that although the gas heating apparatuses, the gas storage apparatus, and the like are shown under the stages in FIG. 31A, the structure is merely an example for description and there is no particular limitation on the present invention. It is needless to say that these apparatuses and the like can be placed in other places by increasing the length of each tube.

With the plurality of gas blowing holes 1412 provided in the stages 1401 and 1402, the large-sized substrate 1405 can be floated, and force is added to the transfer direction by a transfer roller (not shown) arranged in both sides, whereby the large-sized substrate 1405 can be transferred to a direction indicated by an arrow 311.

Note that other components of the laser irradiation apparatus are similar to those of FIG. 7; thus, description thereof is omitted here.

The blow unit that sprays a heated nitrogen gas on the large-sized substrate 1405 is similar to that of FIG. 7; thus, description thereof is omitted here. Needless to say, in order to make each of the concentration of oxygen and that of moisture in the chamber 30 ppm or less, preferably, 30 ppb or less, a high-purity gas is preferably used as the nitrogen gas to be blown from the blow unit.

Figure 32:
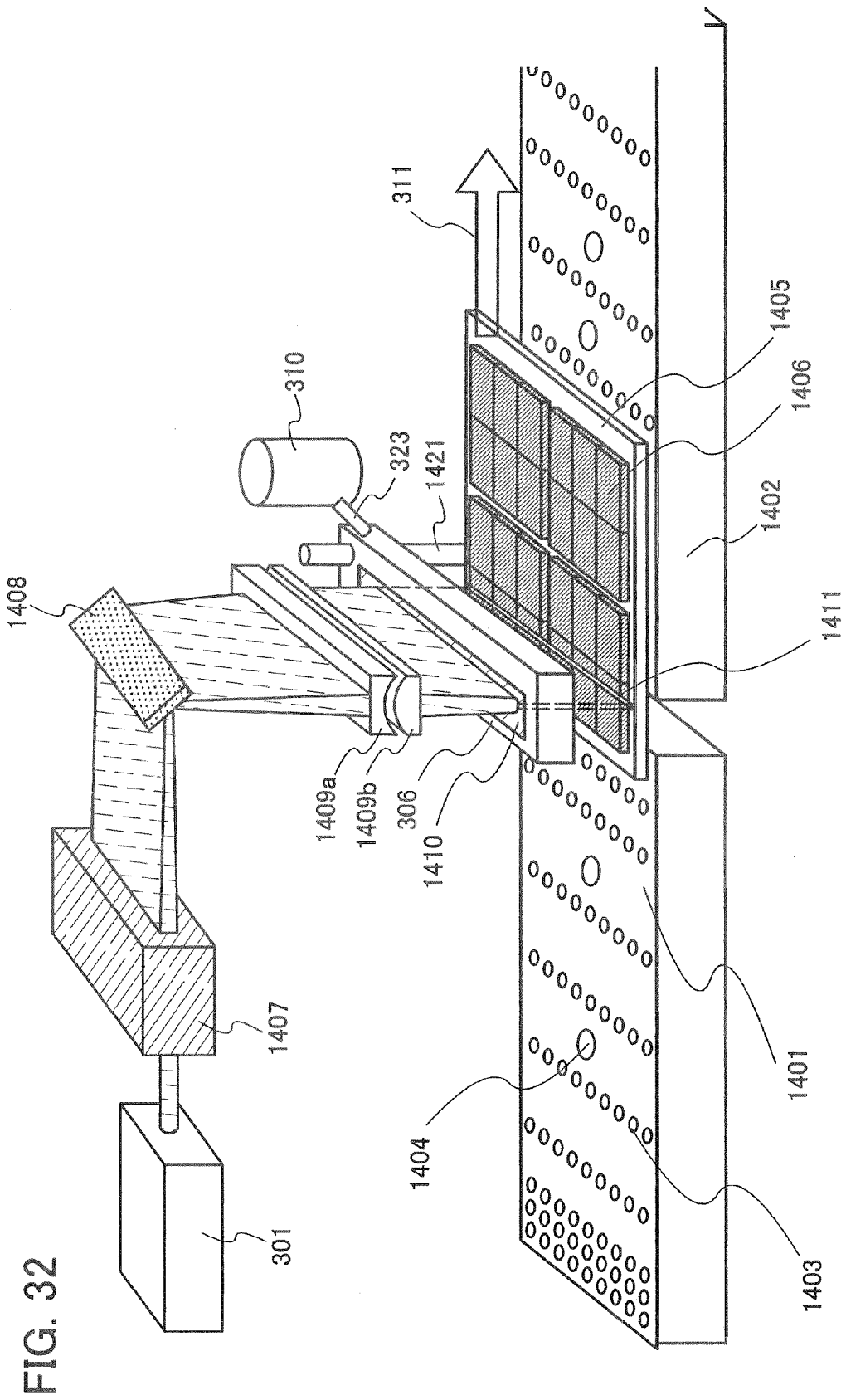
FIG. 32 is a diagram which shows an example of a perspective diagram of a manufacturing apparatus.

An example of a perspective diagram is shown in FIG. 32. As shown in FIG. 32, the stage 1402 is provided with gas evacuating holes 1404, and a flow rate controller (not shown) is provided to control the flow rate of a gas evacuated through the gas evacuating holes 1404. A lager number of gas blowing holes 1403 are provided in an end portion of the stage than in a central portion, thereby preventing the substrate from bending.

By use of a blow unit that sprays a heated nitrogen gas on the large-sized substrate 1405, fine adjustment can be further made, and a bend of the substrate can be prevented.

The blow unit having the gas ejection portion 306 fixed to a bottom portion of a chamber by a fixed axis 1421 is provided with a quartz window 1410 so as to transmit a laser beam. The gas ejection portion 306 is provided with the tube 323 and a heated nitrogen gas is supplied from the gas heating apparatus 310.

A laser irradiation unit shown in FIG. 32 has the laser 301, an optical device 1407 incorporating a homogenizer, a reflecting mirror 1408, a doublet lens 1409a, and a doublet lens 1409b. Note that to make the energy distribution of a laser beam even is generally referred to as "to homogenize", and a homogenizing optical system is referred to as a homogenizer. A laser beam emitted from the laser 301 is expanded by a spherical lens. Note that the spherical lens is not required when the beam spot of a beam emitted from the laser 301 is sufficiently large. Then, the laser beam is split in a long-side (long-axis) direction of a linear spot by a cylindrical lens array. After that, the laser beams are synthesized on the large-sized substrate 145 by a cylindrical lens which is located posterior to the cylindrical lens array. Thus, the large-sized substrate 1405 is irradiated with a linear laser beam that is synthesized. In addition, the energy distribution along the long-side direction of the spot of the linear beam is homogenized (long-axis homogenization) on the surface of the large-sized substrate 1405, and the length along the long-side direction is determined.

In addition, the blow unit may be used as a mask provided with a slit.

A semiconductor layer is irradiated with a laser beam while a heated nitrogen gas is being sprayed from both a front side and a back side of the substrate, whereby temperature of the single crystal semiconductor layer can be increased in a short time. In addition, by use of the manufacturing apparatus shown in FIGS. 31A and 31B and FIG. 32, laser irradiation process can be performed in a short time.

This embodiment mode can be freely combined with any one of Embodiment Modes 1 to 7.

Embodiment Mode 9

As an example of a manufacturing method of a semiconductor device using the semiconductor substrate 10, a manufacturing method of transistors will be described in this embodiment mode, with reference to FIGS. 33A to 33E. By combining a plurality of thin film transistors, a variety of types of semiconductor devices are manufactured. In this embodiment mode, an n-channel thin film transistor and a p-channel transistor can be manufactured at the same time.

Figure 33A:
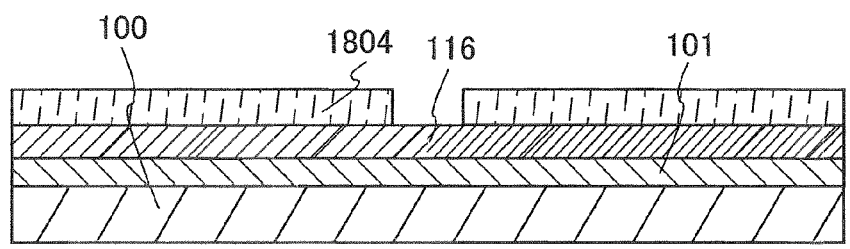
FIGS. 33A to 33E are cross-sectional views which show a manufacturing process of a semiconductor device.

As illustrated in FIG. 33A, a semiconductor substrate in which the buffer layer 101 and the single crystal semiconductor layer 116 are formed over the supporting substrate 100 is prepared. The buffer layer 101 has a three-layer structure and includes the insulating film 112b serving as a barrier layer. In addition, although an example in which the semiconductor substrate 10 having the structure shown in FIG. 1 is used is described in this embodiment mode, a semiconductor substrate having another structure shown in this specification can also be used in the present invention.

The single crystal semiconductor layer 116 has an impurity region (a channel-doped region) to which a p-type impurity element such as boron, aluminum, or gallium or an n-type impurity element such as phosphorus or arsenic is preferably added in accordance with a formation region of an n-channel field-effect transistor or a p-channel field-effect transistor.

Figure 33B:
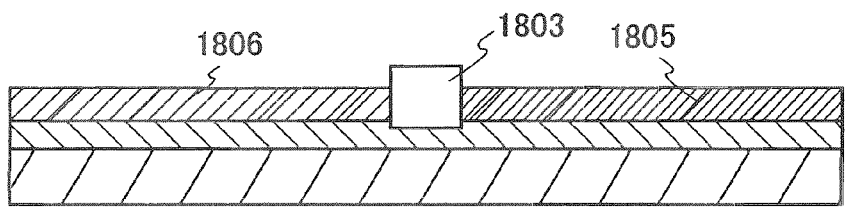

Etching is conducted using a protective layer 1804 as a mask, and the exposed single crystal semiconductor layer 116 and the buffer layer 101 thereunder are partially removed. Then, a silicon oxide film is deposited using organosilane by a PECVD method. The silicon oxide film is formed thick enough to embed the single crystal semiconductor layer 116 thereunder. Next, after removing the silicon oxide film formed over the single crystal semiconductor layer 116 by polishing, the protective layer 1804 is removed such that an insulating layer 1803 for element separation is left. By the insulating layer 1803 for element separation, the single crystal semiconductor layer 116 is divided into an element region 1805 and an element region 1806 (FIG. 33B).

Then, a first insulating film is formed, gate electrode layers 1808a and 1808b are formed over the first insulating film, the first insulating film is etched using the gate electrode layers 1808a and 1808b as masks to form gate insulating layers 1807a and 1807b.

The gate insulating layers 1807a and 1807b may be formed with a silicon oxide film or a stacked structure of a silicon oxide film and a silicon nitride film. A silicon oxynitride film, a silicon nitride oxide film or the like can be used as the gate insulating layers. The gate insulating layers 1807a and 1807b may be formed by depositing an insulating film by a plasma CVD method or a low pressure CVD method or may be formed by solid phase oxidation or solid phase nitridation by plasma treatment. This is because a gate insulating layer which is formed using a semiconductor layer that is oxidized or nitrided by plasma treatment is dense and has high withstand voltage and is excellent in reliability. For example, dinitrogen monoxide ($N_2O$) is diluted with Ar at a flow rate of 1 to 3, and 3 kW to 5 kW of microwave (2.45 GHz) power is applied at a pressure of 10 Pa to 30 Pa to oxidize or nitride the surface of the single crystal semiconductor layer 116 (element regions 1805 and 1806). By this treatment, an insulating film having a thickness of 1 nm to 10 nm (preferably 2 nm to 6 nm) is formed. Further, dinitrogen monoxide ($N_2O$) and silane ($SiH_4$) are introduced and 3 kW to 5 kW of microwave (2.45 GHz) power is applied at a pressure of 10 Pa to 30 Pa to form a silicon oxynitride film as a gate insulating film by a PECVD method. By combination of solid-phase reaction and vapor deposition, a gate insulating layer having low interface state density and excellent withstand voltage can be formed.

As the gate insulating layers 1807a and 1807b, a high permittivity material such as zirconium dioxide, hafnium oxide, titanium dioxide, tantalum pentoxide, or the like may be used. By using a high permittivity material for the gate insulating layers 1807a and 1807b, gate leakage current can be reduced.

The gate electrode layers 1808a and 1808b can be formed by a sputtering method, an evaporation method, a CVD method, or the like. The gate electrode layers 1808a and 1808b may be formed using an element such as tantalum (Ta), tungsten (W), titanium (Ti), molybdenum (Mo), aluminum (Al), copper (Cu), chromium (Cr), or neodymium (Nd); or an alloy material or a compound material containing these elements as its main component. Moreover, a semiconductor film typified by a polycrystalline silicon film which is doped with an impurity element such as phosphorus or an AgPdCu alloy may be used as the gate electrode layers 1808a and 1808b.

Figure 33C:
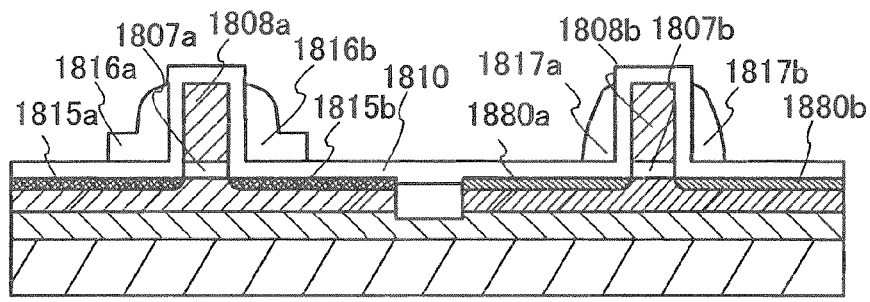

Next, a second insulating film 1810 is formed to cover the gate electrode layers 1808a and 1808b, and sidewall insulating layers 1816a, 1816b, 1817a and 1817b having a sidewall structure are formed. The width of the sidewall insulating layers 1816a and 1816b in a region to serve as a p-channel field effect transistor (pFET) is larger than that of the sidewall insulating layers 1817a and 1817b in a region to serve as an n-channel field effect transistor (nFET). Arsenic (As) or the like is added to the region to serve as the n-channel field effect transistor to form first impurity regions 1820a and 1820b having a shallow junction depth, while boron (B) or the like is added to the region to serve as the p-channel field effect transistor to form second impurity regions 1815a and 1815b having a shallow junction depth (FIG. 33C).

Figure 33D:
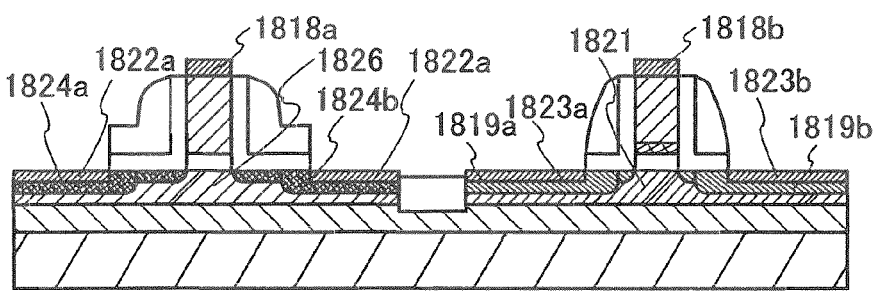

Then, the second insulating film 1810 is partially etched to expose the top surface of the gate electrode layers 1808a and 1808b, the first impurity regions 1820a and 1820b and the second impurity regions 1815a and 1815b. Then, As or the like is added to the region to serve as the n-channel field effect transistor to form third impurity regions 1819a and 1819b having a deep junction depth, while B or the like is added to the region to serve as the p-channel field effect transistor to form fourth impurity regions 1824a and 1824b having a deep junction depth. Then, heat treatment for activation is conducted. A cobalt film is formed as a metal film to form a silicide. Then, heat treatment such as RTA is conducted (at 500° C. for 1 minute), and silicon in contact with the cobalt film is silicided; as a result, silicide portions 1818a and 1818b on the gate electrode, and silicide portions 1822a, 1822b, 1823a, and 1823b are formed. After that, the cobalt film is selectively removed. Then, heat treatment is conducted at a temperature higher than the heat treatment for siliciding to reduce resistance of the silicide portions 1818a, 1818b, 1822a, 1822b, 1823a, and 1823b (FIG. 33D). A channel formation region 1826 is formed in the element region 1806 and a channel formation region 1821 is formed in the element region 1805.

Next, an interlayer insulating layer 1827 is formed, and contact holes (openings) are formed using a resist mask in the interlayer insulating layer 1827, which are formed to be electrically connected to the third impurity regions 1819a and 1819b having a deep junction depth and the fourth impurity regions 1824a and 1824b having a deep junction depth with the silicide portions 1822a, 1822b, 1823a, and 1823b. Etching may be performed once or a plurality of times depending on a selection ratio of a material to be used.

A method and a condition of the etching may be set as appropriate depending on the materials of the interlayer insulating layer 1827 to be provided with contact holes. Wet etching, dry etching, or both of them can be used as appropriate. In this embodiment mode, dry etching is used. Note that an etching gas can be selected as appropriate from among a chlorine-based gas typified by $Cl_2$, $BCl_3$, $SiCl_4$, or $CCl_4$; a fluorine-based gas typified by $CF_4$, $SF_6$, or $NF_3$; and $O_2$. Further, a noble gas may be added to an etching gas to be used. As a noble gas to be added, one or a plurality of elements selected from He, Ne, Ar, Kr, and Xe can be used. A hydrofluoric acid-based solution such as a mixed solution of ammonium hydrogen fluoride and ammonium fluoride may be used as an etchant of wet etching.

Next, a conductive film is formed so as to cover the contact holes, and the conductive film is etched to form the wiring layers 1842a, 1842b, and 1842c each functioning as a source electrode layer or a drain electrode layer that is electrically connected to a portion of the source region or the drain region. The wiring layers can be formed by forming a conductive film by a PVD method, a CVD method, an evaporation method, or the like and then etching the conductive film into a desired shape. In addition, a conductive film can be selectively formed in a predetermined position by a droplet discharge method, a printing method, an electrolytic plating method, or the like. A reflow method or a damascene method may also be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. Further, a stacked structure thereof may also be used.

In this embodiment mode, the wiring layers 1840a, 1840b, 1840c, and 1840d are formed as embedded wiring layers to fill contact holes formed in the interlayer insulating layer 1827. The wiring layers 1840a, 1840b, 1840c, and 1840d, which are the embedded wiring layers, are formed by forming a conductive film having an enough thickness to fill the contact holes and leaving the conductive film only in contact hole portions and removing an unnecessary part of the conductive film.

An insulating layer 1828, and wiring layers 1841a, 1841b, and 1841c as lead wiring layers are formed over the wiring layers 1840a, 1840b, 1840c, and 1840d which are embedded.

Figure 33E:
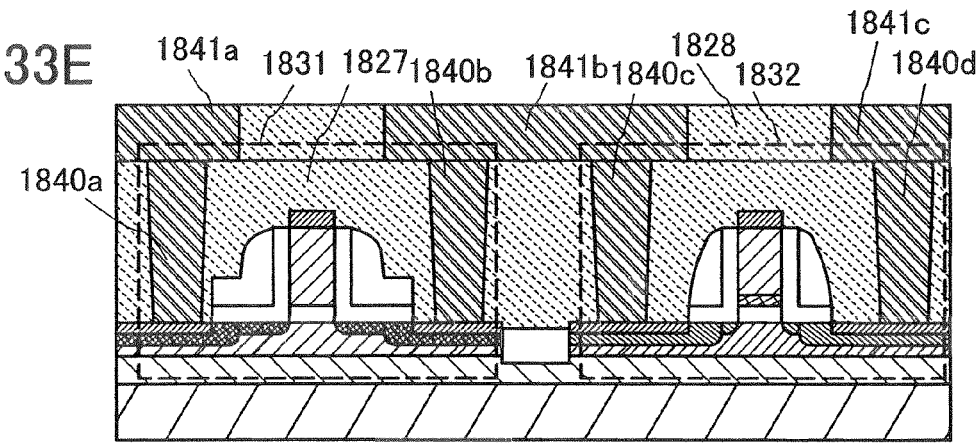

Through the above-described steps, an n-channel field-effect transistor 1832 can be formed using the element region 1806 of the single crystal semiconductor layer 116 bonded to the supporting substrate 100 and a p-channel field-effect transistor 1831 can be formed using the element region 1805 of the single crystal semiconductor layer 116 bonded to the supporting substrate 100 (see FIG. 33E). Note that the n-channel field-effect transistor 1832 and the p-channel field-effect transistor 1831 are electrically connected by a wiring layer 1842b.

In this manner, a CMOS structure is formed by a complementary combination of the n-channel field-effect transistor 1832 and the p-channel field-effect transistor 1831.

A semiconductor device such as a microprocessor can be manufactured by stacking a wiring, an element, and the like over the CMOS structure. A microprocessor includes an arithmetic logic unit (also referred to as ALU), an ALU controller, an instruction decoder, an interrupt controller, a timing controller, a register, a register controller, a bus interface (Bus I/F), a read only memory (ROM), and a memory interface (ROM I/F).

A microprocessor has an integrated circuit having a CMOS structure, and thus low power consumption can be achieved as well as processing speed can be increased.

The structure of the thin film transistor is not limited to that described in this embodiment mode, and may have a single gate structure in which one channel formation region is formed, a double gate structure in which two channel formation region are formed, or a triple gate structure in which three channel formation regions are formed.

This embodiment mode can be freely combined with any one of Embodiment Modes 1 to 8.

Embodiment Mode 10

In this embodiment mode, a semiconductor device using the semiconductor substrate according to the present invention and a manufacturing method thereof will be described. As an example of a semiconductor device using the semiconductor substrate according to the present invention, a transistor will be described in this embodiment mode. By combining a plurality of transistors, various semiconductor devices are formed. A method for manufacturing a transistor will be described with reference to cross-sectional views of FIGS. 34A to 34E, FIGS. 35A to 35C, and FIGS. 36A and 36B. Note that in this embodiment mode, an n-channel transistor and a p-channel transistor can be manufactured at the same time.

Figure 34A:
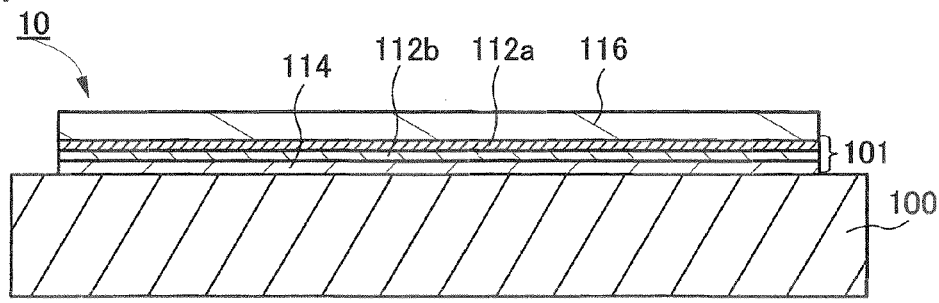
FIGS. 34A to 34E are cross-sectional views which show a manufacturing process of a semiconductor device.

First, as shown in FIG. 34A, a semiconductor substrate is prepared. In this embodiment mode, the semiconductor substrate 10 in FIG. 1 is used. That is, a semiconductor substrate in which the single crystal semiconductor layer 116 is fixed to the supporting substrate 100 having an insulating surface with the baffer layer 101 interposed therebetween is used. Note that, as a semiconductor substrate that forms a transistor, not only the structure in FIG. 34A but also a semiconductor substrate according to the present invention can be used.

Note that, a p-type impurity element such as boron, aluminum, or gallium or an n-type impurity element such as phosphorus or arsenic is preferably added to the single crystal semiconductor layer 116 in accordance with a formation region of an n-channel field-effect transistor or a p-channel field-effect transistor. In other words, a p-type impurity element is added to a formation region of an n-channel field-effect transistor and an n-type impurity element is added to a formation region of a p-channel field-effect transistor, whereby so-called well regions are formed. The dose of impurity ions may be approximately $1\times10^{12}$ ions/cm$^2$ to $1\times10^{14}$ ions/cm$^2$. Furthermore, when threshold voltage of the field effect transistor is controlled, a p-type impurity element or an n-type impurity element may be added to these well regions.

Figure 34B:
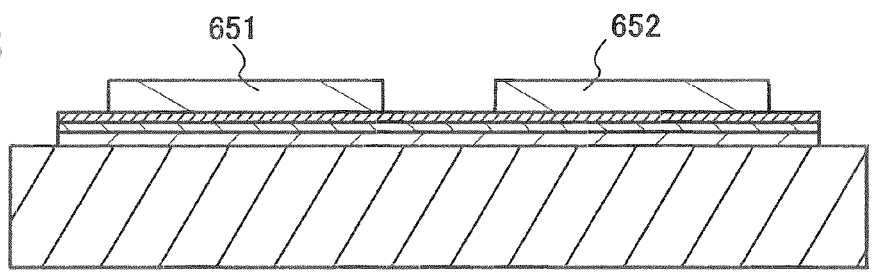

Then, as shown in FIG. 34B, the single crystal semiconductor layer 116 is etched to form single crystal semiconductor layers 651 and 652 which are separated from each other in island shapes to correspond to the arrangement of semiconductor elements. In this embodiment mode, an n-channel transistor is formed from the single crystal semiconductor layer 651, and a p-channel transistor is formed from the single crystal semiconductor layer 652.

Figure 34C:
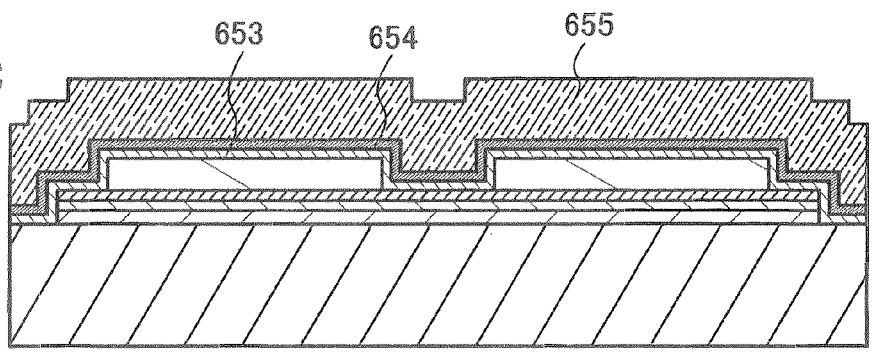

Next, as illustrated in FIG. 34C, a gate insulating layer 653, and a conductive layer 654 and a conductive layer 655 which form a gate electrode are sequentially formed over a single crystal semiconductor layer 651 and a single crystal semiconductor layer 652.

The gate insulating layer 653 is formed as a single-layer structure or a stacked structure using an insulating layer such as a silicon oxide layer, a silicon oxynitride layer, a silicon nitride layer, or a silicon nitride oxide layer by a CVD method, a sputtering method, an atomic layer epitaxy (ALE) method, or the like.

Alternatively, the gate insulating layer 653 may be formed in such a manner that plasma treatment is performed on the single crystal semiconductor layer 651 and the single crystal semiconductor layer 652 to oxidize or nitride surfaces thereof. Plasma treatment in this case also includes that with plasma excited using microwaves (a typical frequency is 2.45 GHz). For example, treatment with plasma that is excited by microwaves and has an electron density of $1\times10^{11}$ $cm^3$ or more and $1\times10^{13}/cm^3$ or less and an electron temperature of 0.5 eV or more and 1.5 eV or less is also included. Oxidation treatment or nitridation treatment of the surface of the semiconductor layer with such plasma treatment makes it possible to form a thin and dense film. In addition, since the surface of the semiconductor layer is directly oxidized, a film which has good interface characteristics can be obtained. In addition, the gate insulating layer 653 may be formed by conducting plasma treatment using a microwave to a film formed by a CVD method, a sputtering method or an ALE method.

Since the gate insulating layer 653 forms the interface with the semiconductor layers, the gate insulating layer 653 is preferably formed so that a silicon oxide layer or a silicon oxynitride layer is located at the interface. This is because, if a film in which the amount of nitrogen is higher than that of oxygen such as a silicon nitride layer or a silicon nitride oxide layer is formed, problems of interface characteristics such as generation of trap levels might be caused.

The conductive layer which forms the gate electrode is formed as a single-layer film or a stacked-layer film using an element selected from tantalum, tantalum nitride, tungsten, titanium, molybdenum, aluminum, copper, chromium, or niobium; an alloy material or a compound material containing the element as its main component; or a semiconductor material typified by polycrystalline silicon doped with an impurity element such as phosphorus, by a CVD method or a sputtering method. When the conductive layer is formed as a stacked-layer film, it can be formed using different conductive materials or can be formed using the same conductive material. In this embodiment mode, an example is described in which the conductive layer of the gate electrode is formed with a two-layer structure including the conductive layer 654 and the conductive layer 655.

If the conductive layer for forming the gate electrode has a two-layer structure of the conductive layer 654 and the conductive layer 655, a stacked-layer film of a tantalum nitride layer and a tungsten layer, a tungsten nitride layer and a tungsten layer, or a molybdenum nitride layer and a molybdenum layer can be formed, for example. Note that a stacked-layer film of a tantalum nitride layer and a tungsten layer is preferable because etching rates of both layers are easily differentiated from each other and high selectivity can be obtained. Note that, in for the two-layer films which are exemplified, the first mentioned film is preferably formed over the gate insulating layer 653. In this embodiment mode, the first conductive layer 654 is formed with a thickness of from 20 nm or more and 100 nm or less. The conductive layer 655 is formed with a thickness of 100 nm or more and 400 nm or less. The gate electrode can also have a stacked structure of three or more layers; in that case, it is preferable to employ a stacked structure of a molybdenum layer, an aluminum layer, and a molybdenum layer.

Next, a resist mask 656 and a resist mask 657 are selectively formed over the conductive layer 655. Then, first etching treatment and second etching treatment are performed using the resist mask 656 and the resist mask 657.

Figure 34D:
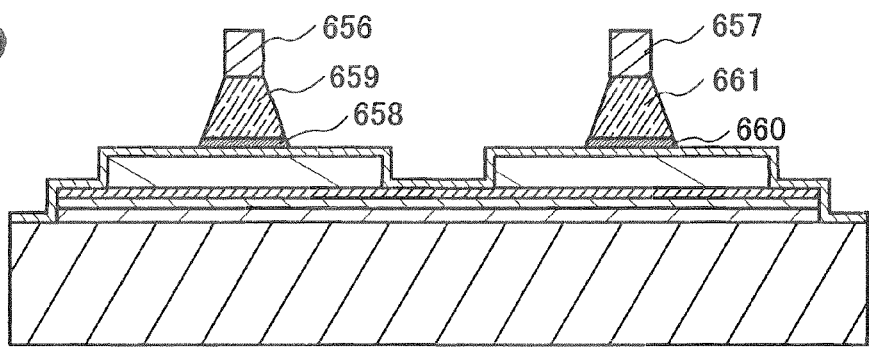

First, by the first etching treatment using the resist mask 656 and the resist mask 657, the conductive layer 654 and the conductive layer 655 are selectively etched, and thus a conductive layer 658 and a conductive layer 659 are formed over the single crystal semiconductor layer 651 and a conductive layer 660 and a conductive layer 661 are formed over the single crystal semiconductor layer 652 (FIG. 34D).

Figure 34E:
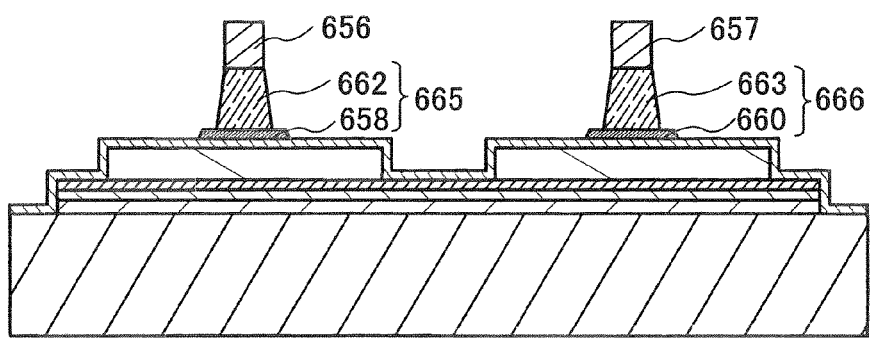

Next, by the second etching using the resist mask 656 and the resist mask 657, end portions of the conductive layer 659 and the conductive layer 661 are etched, and thus a conductive layer 662 and a conductive layer 663 are formed (FIG. 34E). The second conductive layers 662 and 663 are formed so as to have smaller widths (lengths parallel to a direction in which carriers flow through channel formation regions (a direction in which a source region and a drain region are connected)) than those of the first conductive layers 658 and 660. In this manner, a two-layer of gate electrode 665 including the conductive layer 658 and the conductive layer 662 and a two-layer of gate electrode 666 including the conductive layer 660 and the conductive layer 663 are formed.

Although an etching method employed for the first etching treatment and the second etching treatment may be selected as appropriate, a dry etching apparatus using a high-density plasma source such as electron cyclotron resonance (ECR) or inductive coupled plasma (ICP) may be used in order to increase the etching rate. With appropriate control of the etching condition of the first etching treatment and the second etching treatment, side surfaces of the first conductive layers 658 and 660 and the conductive layers 662 and 663 can each have a desired tapered shape. After formed desired gate electrodes 665 and 666, the resist masks 656 and 657 may be removed.

Figure 35A:
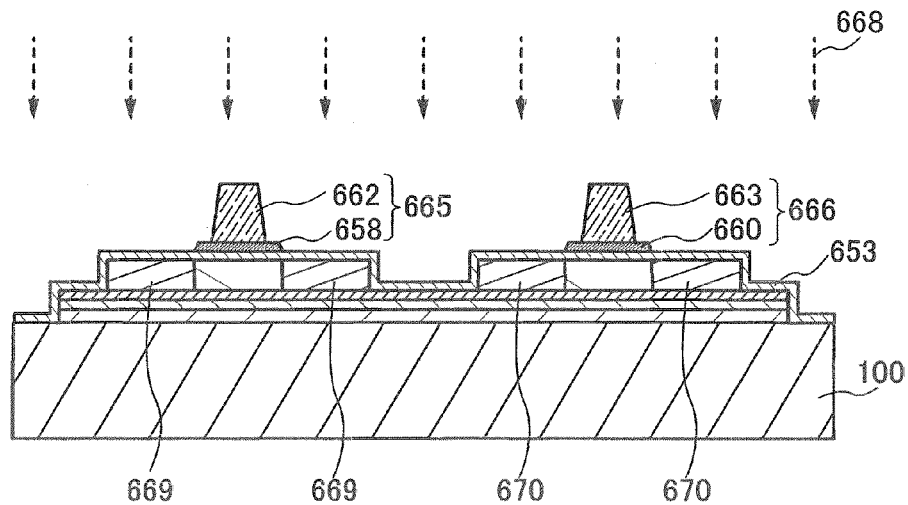
FIGS. 35A to 35C are cross-sectional views which show a manufacturing process of a semiconductor device.

Next, an impurity element 668 is added to the single crystal semiconductor layer 651 and the single crystal semiconductor layer 652 using the gate electrode 665 and the gate electrode 666 as masks. In the single crystal semiconductor layer 651, a pair of impurity regions 669 is formed in a self-alignment manner using the conductive layer 658 and the conductive layer 662 as masks. As well, in the single crystal semiconductor layer 652, a pair of impurity regions 670 is formed in a self-alignment manner using the conductive layer 660 and the conductive layer 663 as masks (FIG. 35A).

As the impurity element 668, a p-type impurity element such as boron, aluminum, or gallium, or an n-type impurity element such as phosphorus or arsenic is added. At this time, in order to form a high-resistant region of the n-channel transistor, phosphorus of an n-type impurity element is added as an impurity element 668. In addition, phosphorus is added such that it is included in the impurity region 669 at a concentration of approximately $1\times10^{17}$ atoms/cm$^3$ to $5\times10^{18}$ atoms/cm$^3$.

Figure 35B:
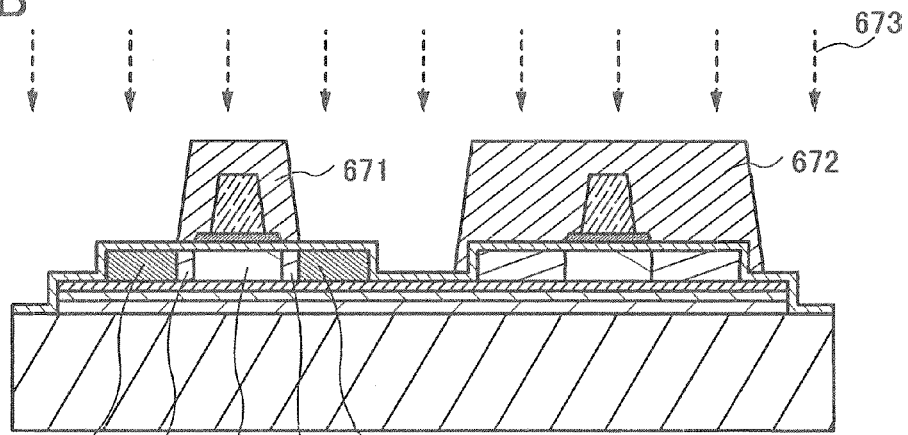

Then, in order to form impurity regions serving as source and drain regions of the n-channel transistor, a resist mask 671 is formed to partially cover the single crystal semiconductor layer 651 and a resist mask 672 is selectively formed to cover the single crystal semiconductor layer 652. Then, a pair of impurity region 675 is formed in the single crystal semiconductor layer 651 by addition of an impurity element 673 to the single crystal semiconductor layer 651 using the resist mask 671 as a mask (FIG. 35B).

As the impurity element 673, phosphorus of an n-type impurity element is added to the single crystal semiconductor layer 651, and the concentration of added phosphorus is $5\times10^{19}$ atoms/cm$^3$ to $5\times10^{20}$ atoms/cm$^3$. The impurity regions 675 each serve as a source region or a drain region. The impurity regions 675 are formed in regions not overlapping with the conductive layer 658 and the conductive layer 662.

In addition, in the single crystal semiconductor layer 651, the impurity regions 676 are regions of the impurity regions 669 which are not doped with the impurity element 673. The concentration of the impurity element included in the impurity region 676 is higher than that in the impurity region 675 and serves as a high-resistant region or an LDD region. In the single crystal semiconductor layer 651, a channel formation region 677 overlapping the conductive layer 658 and the conductive layer 662 is formed.

An LDD region means a region to which an impurity element is added at a low concentration and which is formed between a channel formation region and a source or drain region that is formed by adding the impurity element at a high concentration. When an LDD region is provided, there is an advantageous effect in that an electric field in the vicinity of a drain region is reduced to prevent deterioration due to hot carrier injection. Further, a structure in which an LDD region overlaps with a gate electrode with a gate insulating layer interposed therebetween (also called a "gate-drain overlapped LDD (GOLD) structure") may also be employed in order to prevent deterioration of an on-current value due to hot carrier.

Figure 35C:
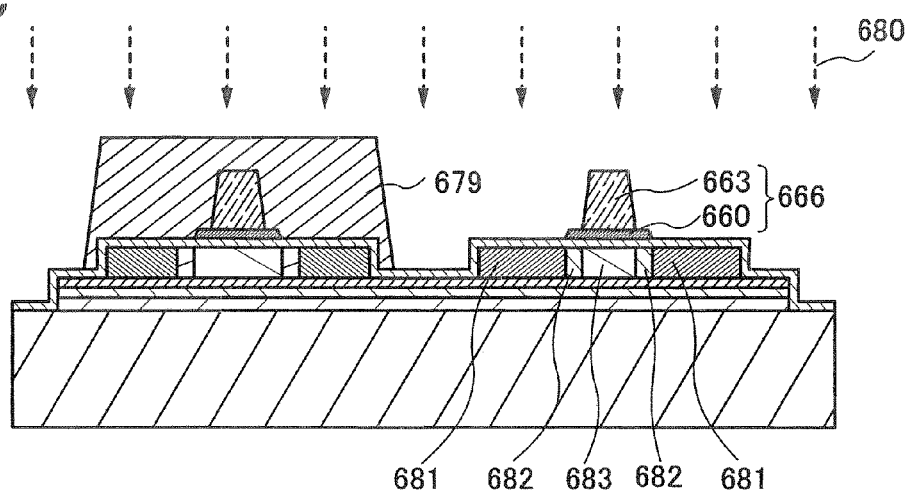

Next, after removing the resist mask 671 and the resist mask 672, a resist mask 679 is formed to cover the single crystal semiconductor layer 651 so that a source region and a drain region of a p-channel transistor can be formed. Then, an impurity element 680 is added using the resist mask 679, the conductive layer 660, and the conductive layer 663 as masks, so that a pair of impurity regions 681, a pair of impurity regions 682, and a channel formation region 683 are formed in the single crystal semiconductor layer 652 (FIG. 35C).

As the impurity element 680, a p-type impurity element such as boron, aluminum or gallium can be used. Here, boron that is a p-type impurity element is added so as to be contained at a concentration of approximately $1\times10^{20}$ atoms/cm$^3$ to $5\times10^{21}$ atoms/cm$^3$.

In the single crystal semiconductor layer 652, the impurity region 681 is formed in a region not overlapping with the conductive layer 660 and the conductive layer 663, and serves as a source region or a drain region. Here, boron that is a p-type impurity element is added so as to be contained in the impurity regions 681 at a concentration of approximately $1\times10^{20}$ atoms/cm$^3$ to $5\times10^{21}$ atoms/cm$^3$.

The impurity region 682 is formed in a region overlapping with the conductive layer 660 but not overlapping with the conductive layer 663, and the impurity region 682 is formed by the impurity element 680 which have passed through the conductive layer 660 and has been introduced to the impurity region 670. The impurity region 670 has n-type conductivity, and thus an impurity element 673 is added such that the impurity region 682 can have p-type conductivity. By adjusting the concentration of the impurity element 673 included in the impurity region 682, the impurity region 682 can serve as a source region or a drain region, or can serve as an LDD region.

In the single crystal semiconductor layer 652, the channel formation region 683 is formed in a region overlapping with the conductive layer 660 and the conductive layer 663.

An interlayer insulating layer is formed. The interlayer insulating layer can be formed as a single-layer film or a stacked-layer film; here, the interlayer insulating layer has a two-layer structure of an insulating layer 684 and an insulating layer 685 (see FIG. 36A).

As the interlayer insulating layer, a silicon oxide layer, a silicon oxynitride layer, a silicon nitride layer, a silicon nitride oxide layer, or the like can be formed by a CVD method or a sputtering method. Further, the interlayer insulating layer can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material is a material including a Si—O—Si bond. Siloxane is composed of a skeleton structure formed by the bond of silicon (Si) and oxygen (O). As the substituent, an organic group including at least hydrogen (such as an alkyl group or aromatic hydrocarbon) is used. In addition, a fluoro group may be used as the substituent. Further, an organic group containing at least hydrogen and a fluoro group may also be used as substituents.

For example, a silicon nitride oxide layer is formed to a thickness of 100 nm as the insulating layer 684, and a silicon oxynitride layer is formed to a thickness of 900 nm as the insulating layer 685. In addition, the insulating layer 684 and the insulating layer 685 are successively formed by a plasma CVD method. The interlayer insulating layer may also have a stacked structure including three or more layers. Alternatively, a stacked structure of a silicon oxide layer, a silicon oxynitride layer, or a silicon nitride layer, and an insulating layer formed using an organic material such as polyimide, polyamide, polyvinyl phenol, benzocyclobutene, acrylic, or epoxy; a siloxane material such as a siloxane resin; or an oxazole resin can be employed.

Figure 36A:
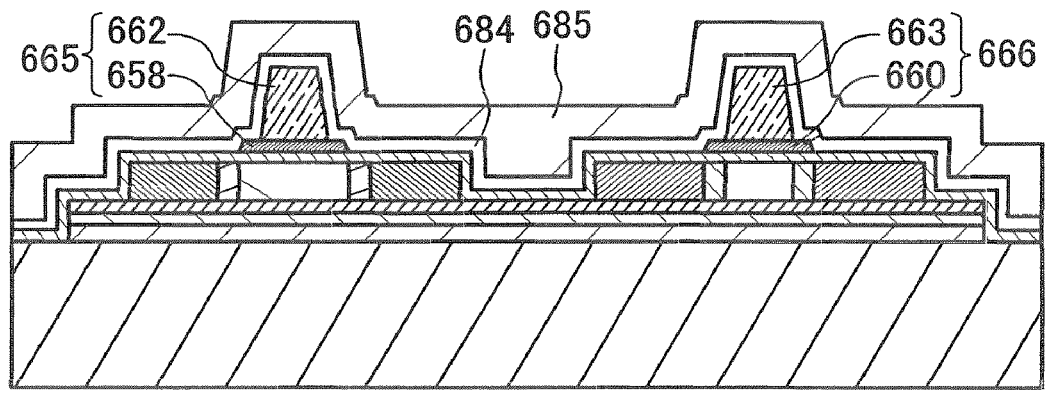
FIGS. 36A and 36B are cross-sectional views which show a manufacturing process of a semiconductor device.
Figure 36B:
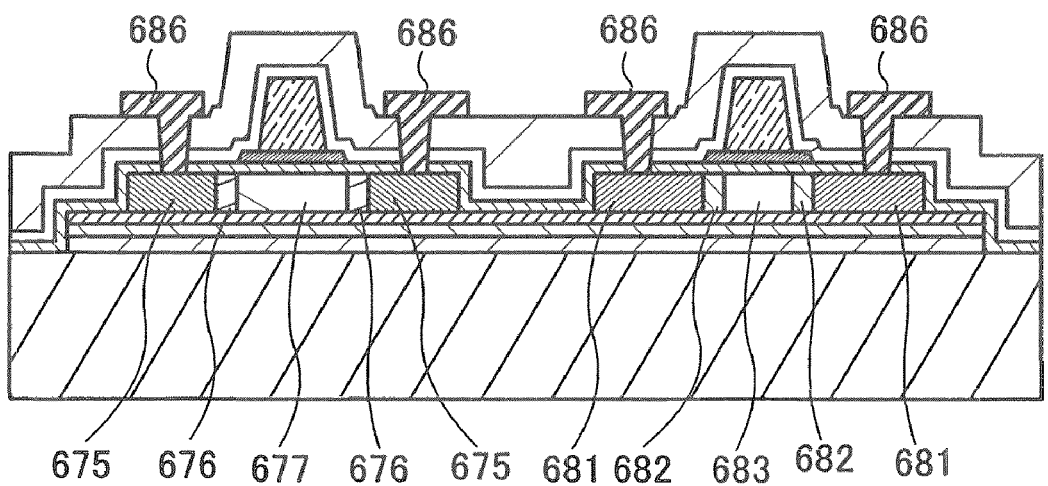

Next, contact holes are formed in the interlayer insulating layer (in this embodiment mode, the insulating layers 684 and 685), and conductive layers 686 that function as source electrodes and drain electrodes are formed in the contact holes (see FIG. 36B).

The contact holes are selectively formed in the insulating layer 684 and the insulating layer 685 so as to reach the impurity region 675 formed in the single crystal semiconductor layer 651, and the impurity region 681 formed in the single crystal semiconductor layer 652.

As the conductive layers 686, a single-layer film formed of one element selected from aluminum, tungsten, titanium, tantalum, molybdenum, nickel, or neodymium, or an alloy containing a plurality of above elements; or a stacked-layer film including such layers can be used. For example, a conductive layer that is formed using an alloy that contains a plurality of the elements given above can be formed using an aluminum alloy that contains titanium, an aluminum alloy that contains neodymium, or the like. If the conductive layers 836 are each a stacked-layer film, a structure can be employed in which an aluminum layer or an aluminum alloy layer as described above is sandwiched between titanium layers, for example.

As illustrated in FIG. 36B, the n-channel transistor and the p-channel transistor can be manufactured using the semiconductor substrate 10.

This embodiment mode can be freely combined with any one of Embodiment Modes 1 to 8.

This application is based on Japanese Patent Application serial No. 2007-264900 filed with Japan Patent Office on Oct. 10, 2007, Japanese Patent Application serial No. 2007-267273 filed with Japan Patent Office on Oct. 12, 2007, and Japanese Patent Application serial No. 2007-275831 filed with Japan Patent Office on Oct. 23, 2007, the entire contents of which are hereby incorporated by reference.

What is claimed is:

1. A method for manufacturing a semiconductor device, comprising:
    adding an accelerated ion to a single crystal semiconductor substrate by an ion doping method to form a damaged region added with the ion and located in a portion of the single crystal semiconductor substrate deeper than a surface of the single crystal semiconductor substrate;
    arranging a supporting substrate and the single crystal semiconductor substrate in close contact with each other with a buffer layer interposed therebetween to bond the supporting substrate and the single crystal semiconductor substrate together;
    causing a crack in the damaged region by heating of the single crystal semiconductor substrate to separate a part of the single crystal semiconductor substrate from the single crystal semiconductor substrate, and to fix the part of the single crystal semiconductor substrate to the supporting substrate with the part of the single crystal semiconductor substrate as a single crystal semiconductor layer; and
    irradiating a laser beam through a gas ejection portion to a part of the single crystal semiconductor layer fixed to the supporting substrate with the buffer layer interposed therebetween to melt the single crystal semiconductor layer and perform re-single-crystallization; and
    blowing a heated nitrogen gas ejected from the gas ejection portion on the part of the single crystal semiconductor layer irradiated with the laser beam.

2. A method for manufacturing a semiconductor device according to claim 1 wherein a surface of the part of the single crystal semiconductor layer irradiated with the laser beam and near the surface are melted.

3. A method for manufacturing a semiconductor device according to claim 1 wherein an entire layer in a depth direction of the part of the single crystal semiconductor layer irradiated with the laser beam is melted.

4. A method for manufacturing a semiconductor device according to claim 1 wherein the irradiation of the laser beam is conducted while heating the single crystal semiconductor layer at temperature of 400° C. or higher and a strain point or lower of the supporting substrate.

5. A method for manufacturing a semiconductor device according to claim 1 wherein the irradiation of the laser beam is conducted while heating the single crystal semiconductor layer at temperature of 450° C. or higher and 650° C. or lower.

6. A method for manufacturing a semiconductor device according to claim 1 wherein length of time when the single crystal semiconductor layer is being melted by the irradiation of the laser beam is 200 nanoseconds or more and 1000 nanoseconds or less.

7. A method for manufacturing a semiconductor device according to claim 1 wherein the irradiation of the laser beam is conducted while blowing the heated nitrogen gas and heating the single crystal semiconductor layer at temperature of 400° C. or higher and a strain point or lower of the supporting substrate.

8. A method for manufacturing a semiconductor device according to claim 1 wherein the single crystal semiconductor layer is irradiated with the laser beam in a nitrogen gas atmosphere.

9. A method for manufacturing a semiconductor device according to claim 8, wherein concentration of an oxygen gas in the nitrogen gas atmosphere is 30 ppm or less.

10. A method for manufacturing a semiconductor device according to claim 8, wherein concentration of an oxygen gas in the nitrogen gas atmosphere is 30 ppb or less.

11. A method for manufacturing a semiconductor device according to claim 1,
    wherein a hydrogen gas is used as a source gas for formation of the damaged region, and
    wherein the hydrogen gas is excited, plasma containing $H_3^+$ is generated, and an ion species contained in the plasma is accelerated and added to the single crystal semiconductor substrate to form the damaged region.

12. A method for manufacturing a semiconductor device according to claim 1, wherein the supporting substrate has a strain point of 650° C. or higher and 690° C. or lower.

13. A method for manufacturing a semiconductor device according to claim 1, wherein the supporting substrate is a non-alkali glass substrate.

14. A method for manufacturing a semiconductor device according to claim 1, wherein the supporting substrate is one of a non-alkali glass substrate (product name: AN100), a non-alkali glass substrate (product name: EAGLE2000 (registered trademark)), and a non-alkali glass substrate (product name: EAGLE XG (registered trademark)).

15. A method for manufacturing a semiconductor device according to claim 1, wherein a cross-sectional shape of the laser beam is one of linear, square, and rectangular.

16. A method for manufacturing a semiconductor device, comprising:
    adding an accelerated ion including $H_2$ ions to a single crystal semiconductor substrate by an ion doping method to form a damaged region added with the ion and located in a portion of the single crystal semiconductor substrate deeper than a surface of the single crystal semiconductor substrate;
    arranging a supporting substrate and the single crystal semiconductor substrate in close contact with each other with a buffer layer interposed therebetween to bond the supporting substrate and the single crystal semiconductor substrate together;
    causing a crack in the damaged region by heating of the single crystal semiconductor substrate to separate a part of the single crystal semiconductor substrate from the single crystal semiconductor substrate, and to fix the part of the single crystal semiconductor substrate to the supporting substrate with the part of the single crystal semiconductor substrate as a single crystal semiconductor layer;
    irradiating the single crystal semiconductor layer with a laser beam through a gas ejection portion to melt the single crystal semiconductor layer at least partly; and blowing a nitrogen containing gas ejected from the gas ejection portion on the part of the single crystal semiconductor layer irradiated with the laser beam.

17. A method for manufacturing a semiconductor device according to claim 16, wherein the buffer layer has a stacked structure and includes a barrier layer for preventing sodium from entering the single crystal semiconductor layer.

18. A method for manufacturing a semiconductor device according to claim 16, wherein the buffer layer has a stacked structure and includes one of a silicon nitride film and a silicon nitride oxide film and an oxide film obtained by oxidizing the single crystal semiconductor substrate.

19. A method for manufacturing a semiconductor device according to claim 16, wherein the nitrogen containing gas comprises a heated nitrogen gas.

20. A method for manufacturing a semiconductor device according to claim 16, wherein a cross-sectional shape of the laser beam is one of linear, square, and rectangular.

* * * * *